US012330948B2

(12) United States Patent
Dukes et al.

(10) Patent No.: US 12,330,948 B2
(45) Date of Patent: Jun. 17, 2025

(54) SIC VOLUMETRIC SHAPES AND METHODS OF FORMING BOULES

(71) Applicant: Pallidus, Inc., Houston, TX (US)

(72) Inventors: Douglas M Dukes, Troy, NY (US); Glenn Sandgren, Ambler, PA (US); Andrew R Hopkins, Houston, TX (US); Isabel Burlingham, Troy, NY (US); Mark S Land, Houston, TX (US)

(73) Assignee: Pallidus, Inc., Albany, NY (US)

( * ) Notice: Subject to any disclaimer, the term of this patent is extended or adjusted under 35 U.S.C. 154(b) by 0 days.

(21) Appl. No.: 15/939,423

(22) Filed: Mar. 29, 2018

(65) Prior Publication Data

US 2018/0290893 A1    Oct. 11, 2018

Related U.S. Application Data

(63) Continuation of application No. PCT/US2018/024978, filed on Mar. 28, 2018.
(Continued)

(51) Int. Cl.
| | |
|---|---|
| *C30B 23/02* | (2006.01) |
| *C01B 32/963* | (2017.01) |
| *C30B 23/00* | (2006.01) |
| *C30B 25/16* | (2006.01) |
| *C30B 29/36* | (2006.01) |
| *C30B 29/66* | (2006.01) |

(52) U.S. Cl.
CPC .......... *C01B 32/963* (2017.08); *C30B 23/005* (2013.01); *C30B 23/02* (2013.01); *C30B 25/165* (2013.01); *C30B 29/36* (2013.01); *C30B 29/66* (2013.01); *C01P 2004/30* (2013.01); *C01P 2004/61* (2013.01); *C01P 2004/62* (2013.01); *C01P 2006/10* (2013.01); *C01P 2006/40* (2013.01); *C01P 2006/80* (2013.01)

(58) Field of Classification Search
CPC ......... C30B 21/00; C30B 21/02; C30B 21/04; C30B 29/54
See application file for complete search history.

(56) References Cited

U.S. PATENT DOCUMENTS

| 3,520,656 A | 7/1970 | Meadows et al. |
|---|---|---|
| 5,686,738 A | 11/1997 | Moustakas |
| (Continued) | | |

FOREIGN PATENT DOCUMENTS

| EP | 0 143 122 | 6/1985 |
|---|---|---|
| EP | 0867 958 | 9/1996 |
| (Continued) | | |

OTHER PUBLICATIONS

1968, Kosolapova T.Ya., "Carbidji", Moscow, Metalurgia, 1968, pp. 49, 197, 201, 258.
(Continued)

*Primary Examiner* — Robert M Kunemund
(74) *Attorney, Agent, or Firm* — Glen P. Belvis; Belvis Law, LLC.

(57) ABSTRACT

Volumetric shapes of SiC starting materials for boule growth. Methods of controlling vapor deposition growth of SiC boules, and providing directional flux. Methods of increase the number of wafers, the number of electronic components and the number of operable devices from a single boule growth cycle.

57 Claims, 46 Drawing Sheets

Related U.S. Application Data

(60) Provisional application No. 62/545,367, filed on Aug. 14, 2017, provisional application No. 62/478,383, filed on Mar. 29, 2017.

(56) References Cited

U.S. PATENT DOCUMENTS

| | | | |
|---|---|---|---|
| 5,764,850 A | 6/1998 | Olstad | |
| 5,840,242 A | 11/1998 | Atwell et al. | |
| 5,856,231 A | 1/1999 | Niemann et al. | |
| 5,863,325 A | 1/1999 | Kanemoto et al. | |
| 5,872,070 A | 2/1999 | Dismukes et al. | |
| 5,895,583 A | 4/1999 | Augustine et al. | |
| 5,958,132 A | 9/1999 | Takahashi | |
| 6,063,185 A | 5/2000 | Hunter | |
| 6,063,186 A | 5/2000 | Irvine et al. | |
| 6,093,253 A | 7/2000 | Lofgren et al. | |
| 6,156,581 A | 12/2000 | Vaudo et al. | |
| 6,218,680 B1 | 4/2001 | Carter, Jr. et al. | |
| 6,296,956 B1 | 10/2001 | Hunter | |
| 6,297,522 B1 | 10/2001 | Kordina et al. | |
| 6,396,080 B2 | 5/2002 | Carter, Jr. et al. | |
| 6,403,982 B2 | 6/2002 | Carter, Jr. et al. | |
| 6,497,764 B2 | 12/2002 | Kuhn et al. | |
| 6,507,046 B2 | 1/2003 | Mueller | |
| 6,639,247 B2 | 10/2003 | Carter, Jr. et al. | |
| 6,734,461 B1 | 5/2004 | Shiomi et al. | |
| 6,780,243 B1 * | 8/2004 | Wang | C30B 23/00 117/105 |
| 6,814,801 B2 | 11/2004 | Jenny et al. | |
| 6,943,095 B2 | 9/2005 | Vaudo et al. | |
| 7,033,912 B2 | 4/2006 | Saxler | |
| 7,118,781 B1 | 10/2006 | Sumakeris et al. | |
| 7,147,715 B2 | 12/2006 | Malta et al. | |
| 7,192,482 B2 | 3/2007 | Mueller et al. | |
| 7,220,313 B2 | 5/2007 | Fechko, Jr. et al. | |
| 7,230,274 B2 | 6/2007 | O'Loughlin et al. | |
| 7,294,324 B2 | 11/2007 | Powell et al. | |
| 7,314,520 B2 | 1/2008 | Powell et al. | |
| 7,314,521 B2 | 1/2008 | Powell et al. | |
| 7,316,747 B2 | 1/2008 | Jenny et al. | |
| 7,323,051 B2 | 1/2008 | Hobgood et al. | |
| 7,351,286 B2 | 4/2008 | Leonard et al. | |
| 7,422,634 B2 | 9/2008 | Powell et al. | |
| 7,563,321 B2 | 7/2009 | Powell et al. | |
| 7,601,441 B2 | 10/2009 | Jenny et al. | |
| 8,147,991 B2 | 4/2012 | Jenny et al. | |
| 8,384,090 B2 | 2/2013 | Powell et al. | |
| 8,410,488 B2 | 4/2013 | Basceri et al. | |
| 8,436,366 B2 | 5/2013 | Harada et al. | |
| 8,512,471 B2 | 8/2013 | Zwieback et al. | |
| 8,586,998 B2 | 11/2013 | Inoue et al. | |
| 8,618,552 B2 | 12/2013 | Powell et al. | |
| 8,785,946 B2 | 7/2014 | Powell et al. | |
| 8,866,159 B1 | 10/2014 | Powell et al. | |
| 8,940,614 B2 | 1/2015 | Loboda et al. | |
| 8,951,638 B2 | 2/2015 | Katou et al. | |
| 8,980,445 B2 | 3/2015 | Leonard et al. | |
| 9,018,639 B2 | 4/2015 | Loboda et al. | |
| 9,059,118 B2 | 6/2015 | Jenny et al. | |
| 9,099,377 B2 | 8/2015 | Basceri et al. | |
| 9,165,779 B2 | 10/2015 | Loboda et al. | |
| 9,200,381 B2 | 12/2015 | Leonard et al. | |
| 9,255,344 B2 | 2/2016 | Harada | |
| 9,279,277 B2 | 3/2016 | Spurr et al. | |
| 9,337,277 B2 | 5/2016 | Loboda et al. | |
| 9,580,837 B2 | 2/2017 | Zwieback et al. | |
| 9,657,409 B2 | 5/2017 | Sandgren et al. | |
| 9,738,991 B2 | 8/2017 | Loboda | |
| 9,790,619 B2 | 10/2017 | Leonard et al. | |
| 9,797,064 B2 | 10/2017 | Loboda et al. | |
| 9,815,943 B2 | 11/2017 | Sherwood et al. | |
| 9,815,952 B2 | 11/2017 | Sherwood | |
| 9,919,972 B2 | 3/2018 | Land et al. | |
| 10,294,584 B2 | 5/2019 | Gupta et al. | |
| 10,322,936 B2 | 6/2019 | Dukes | |
| 10,611,052 B1 | 4/2020 | Bubel et al. | |
| 10,753,010 B2 | 8/2020 | Land | |
| 2003/0138368 A1 | 7/2003 | Yadav | |
| 2005/0126471 A1 | 6/2005 | Jenny | |
| 2006/0046920 A1 | 3/2006 | Odaka | |
| 2006/0213427 A1 | 9/2006 | Sugawara et al. | |
| 2007/0034145 A1 | 2/2007 | Maruyama et al. | |
| 2007/0110657 A1 | 5/2007 | Hunter | |
| 2009/0220788 A1 | 9/2009 | Barrett | |
| 2011/0008236 A1 | 1/2011 | Hinman et al. | |
| 2011/0175024 A1 | 7/2011 | Lang | |
| 2012/0103249 A1 | 5/2012 | Gupta | |
| 2012/0114545 A1 | 5/2012 | Loboda | |
| 2013/0071643 A1 | 3/2013 | Harada et al. | |
| 2013/0236387 A1 | 9/2013 | Fallavollita | |
| 2013/0243682 A1 | 9/2013 | Park | |
| 2013/0309496 A1 | 11/2013 | Zwieback | |
| 2013/0323152 A1 | 12/2013 | Aoki et al. | |
| 2014/0274658 A1 | 9/2014 | Sherwood et al. | |
| 2015/0027306 A1 | 1/2015 | Tan | |
| 2015/0175750 A1 | 6/2015 | Hopkins et al. | |
| 2016/0207780 A1 | 7/2016 | Dukes et al. | |
| 2016/0207782 A1 * | 7/2016 | Diwanji | C01B 32/956 |
| 2016/0207783 A1 * | 7/2016 | Hopkins | C01B 31/36 |
| 2018/0066379 A1 | 3/2018 | Land et al. | |
| 2018/0201546 A1 | 7/2018 | Land et al. | |
| 2018/0290893 A1 | 10/2018 | Dukes et al. | |

FOREIGN PATENT DOCUMENTS

| | | |
|---|---|---|
| EP | 1 828 446 | 8/2004 |
| JP | 05-26599 | 4/1992 |
| JP | 10-275617 | 9/1996 |
| JP | 2010-95420 | 4/2010 |
| KR | 2012 0136217 | 12/2012 |
| RU | 2094547 | 10/1997 |
| RU | 83643 | 6/2009 |
| RU | 2389109 | 5/2010 |
| RU | 2524509 | 7/2014 |
| WO | WO 2013/055016 | 4/2013 |

OTHER PUBLICATIONS

2000, Ishlinskij A.Yu, "Bol'shoj Enciclopedicheskij Slovar' Polytechnitscheskij", Moscow, Nauchnoe izdatel'stvo "Bol'shaya Rossijskaya Enciclopedia", 2000, 88, 510.

Feb. 26, 2018, Russian Patent Office, Russian Search Report 2017114129/05(024699).

Feb. 26, 2018, Russian Patent Office, Translation of Russina Search Report 2017114129/05(024699).

Feb. 26, 2018, Russian Patent Office, Russian Office Action 2017114129/05(024699).

Feb. 26, 2018, Russian Patent Office, Translation of Russian Office Action 2017114129/05(024699).

May 13, 2007, Lifu Chen, et al., "Effects of Oxidation Curing and Sintering Additives on the Formation of Polymer-Derived Near-Stoichiometric Silicon Carbide Fibers" J. Am. Ceram. Soc. 91[2] 428-436 (2007).

Jul. 25, 2018, EPO, Extended Search Report SN 15843769.9.

2005, Yuxi Yu, et al., "Synthesis and characterization of polyaluminocarbosilane" J. Mat. Sci. 40 (2005) 2093-2095.

1989, K Kijima, et al., "Sintering of ultrafine SiC poweders prepared by plasma CVD" 6053 J. Mat. Sci. 24 (1989).

Aug. 10, 2018, EPO, Extended Search Report SN 15844428.1.

Sep. 25, 2016, ISASC, 4th International Symposium on New Frontier of Advanced Si-Based Ceramics and Compoosites (2016).

2016, Heo, Influence of Impurities in SiC powder on high quality SiC crystal growth (Materials Science Forum, 1662.9752 vol. 858, pp. 85-88 May 24, 2016).

2012, Vasiliauskas, Sublimation Growth and Performance of Cubic Silicon Carbide (Linkopin University, 2012).

1999, Kamiya, "Preparation of Silicon Oxycarbide Glass Fibers by Sol-Gel Method-Effec of Starting Sol Composition on Tensile Strength of Fibers" Journal of Sol-Gel Science and 14, 95-102 (1999).

(56) References Cited

OTHER PUBLICATIONS

1994, Takahshi, Journal of Growth 135, p. 61-71 (1994).
1997, Hofmann, Journal of Crystal Growth 174, p. 669-674 (1997).
1998, Schulze, Applied Physics Letters vol. 72 No. 13, p. 1632 (1998).
2000, Mueller, Journal of Crystal Growth 211, p. 325-332 (2000).
2000, Hobgood, Materials Science Forum vol. 338,342 p. 3-8 (2000).
2003, Mueller, Materials Science and Engineering, B80, p. 327-331 (2003).
2004, Mueller, Materials Science Forum vol. 457-460 (2004) p. 41-46.
2004, Mueller, Eur. Phys. J. Appl. Phys 27, 29-35 (2004).
Oct. 8, 2019, JP, Office Action in JP 2017-536220 (translation).
Aug. 23, 2018, PCT, PCT/US2018/024978 Search Report and Opinion.

* cited by examiner

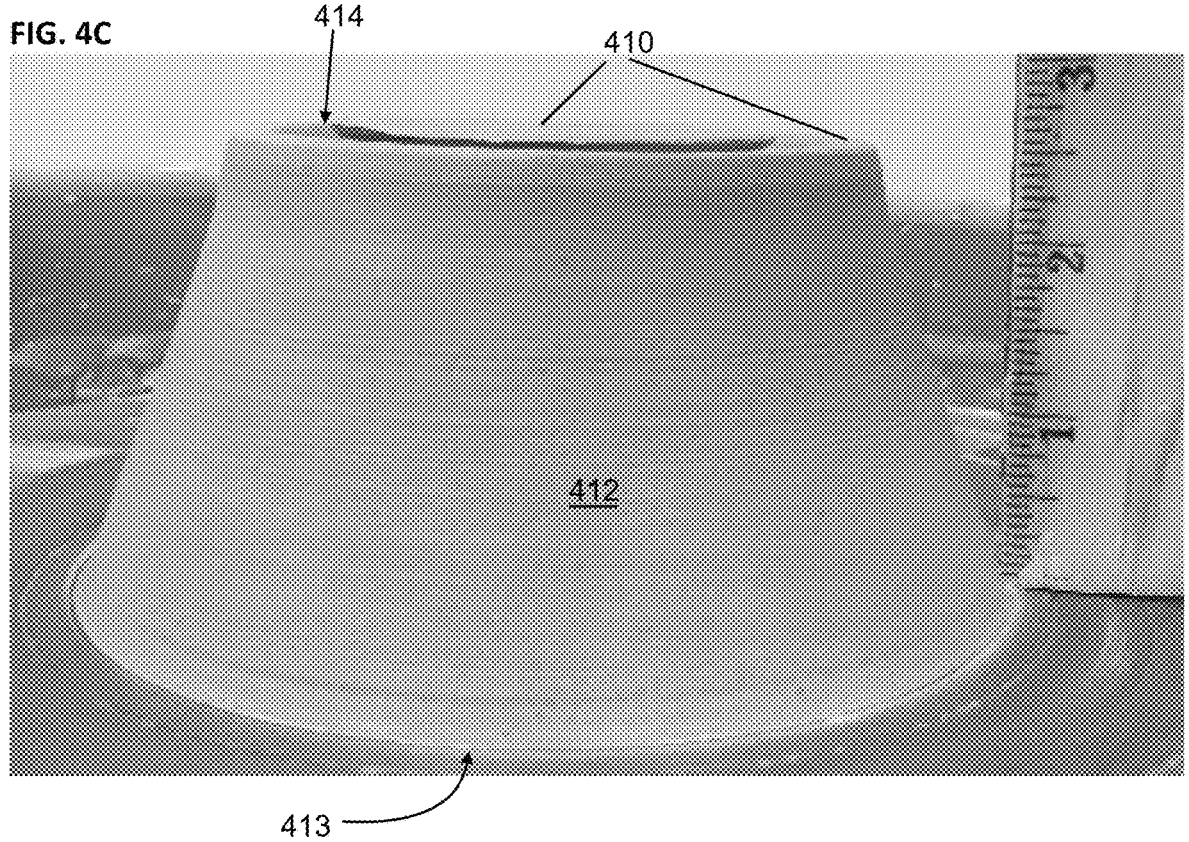

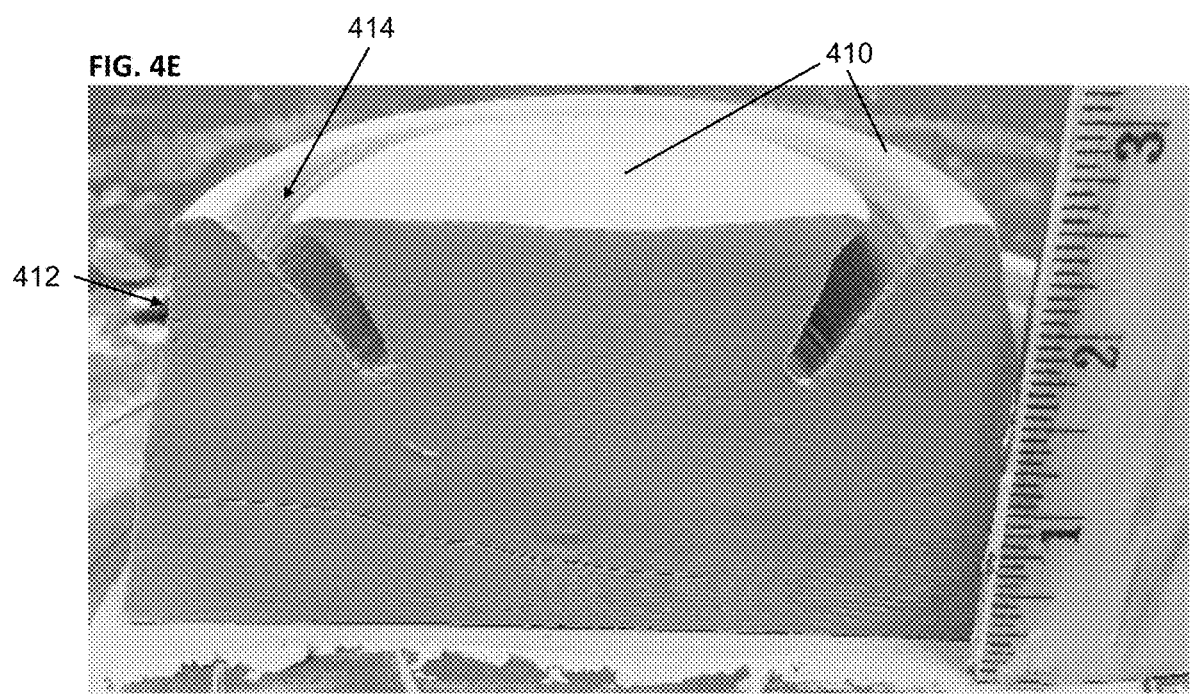

501

SIC VOLUMETRIC SHAPES AND METHODS OF FORMING BOULES

This application: (i) claims under 35 U.S.C. § 119(e)(1) the benefit of U.S. provisional application Ser. No. 62/478,383 filed Mar. 29, 2017; (ii) claims under 35 U.S.C. § 119(e)(1) the benefit of U.S. provisional application Ser. No. 62/545,367 filed Aug. 14, 2017; and, (iii) is a continuation of PCT/US2018/024978 filed Mar. 28, 2018, the entire disclosures of each of which are incorporated herein by reference.

BACKGROUND OF THE INVENTION

Field of the Invention

The present inventions relate to methods for making Silicon Carbide (SiC) and SiC compositions, structures, components, materials and apparatus for making these items; methods for making Silicon Carbide (SiC) and SiOC compositions, structures, components, materials and apparatus for making these items; and in particular, to SiC volumetric shapes, the use of these volumetric shapes to form boules in vapor deposition processes, and related methods.

Polysilocarb materials and methods of making those materials are disclosed and taught in U.S. Pat. Nos. 9,815,952 and 9,815,943 and US Patent Publication No. 2015/0175750, the entire disclosures of each of which are incorporated herein by reference.

As used herein, unless specified otherwise, "Vapor Deposition" (VD), "vapor deposition technology", vapor deposition process and similar such terms are to be given their broadest meaning, and would include for example processes where a solid or liquid starting material is transformed into a gas or vapor state, and then the gas or vapor is deposited to form, e.g., grow, a solid material. As used herein vapor deposition technology would include growth by epitaxy, where the layer is provided from a vapor or gaseous phase. Further types of vapor deposition technology include: Chemical Vapor Deposition (CVD); Physical Vapor Deposition (PVD), plasma enhanced CVD, Physical Vapor Transport (PVT) and others. Examples of vapor deposition devices would include a hot wall reactor, a multiwafer reactor, a chimney reactor, an RF furnace, and a boule growth furnace.

As used herein, unless specified otherwise the term "vaporization temperature" is to be given its broadest possible meaning and includes that temperature at which the material transitions from a liquid to a gas state, transitions from a solid to a gas state, or both (e.g., the solid to liquid to gas transition occurs over a very small temperature range, e.g., a range of less than about 20° C., less than about 10° C., and less than about 5° C.). Unless specifically stated otherwise, the vaporization temperature would be the temperatures corresponding to any particular pressures, e.g., one atmosphere, 0.5 atmosphere, where such transition occurs. When discussing the vaporization temperature of a material in a particular application, method, or being used in a particular device, such as a PVT device, the vaporization temperature would be at the pressure used, or typically used, in that application, method or device, unless expressly stated otherwise.

Silicon carbide does not generally have a liquid phase, instead it sublimes, under vacuum, at temperatures above about 1,700° C. Turning to FIG. 17 there is provided a chart of a partial pressure curve for SiC. Typically, in industrial and commercial applications conditions are established so that the sublimation takes place at temperatures of about 2,500° C. and above. When silicon carbide sublimes it typically forms a vapor consisting of various species of silicon and carbon, e.g., Si, C, SiC, $Si_2C$ and $SiC_2$. Generally, it was believed that temperature determines the ratio of these different components in the silicon carbide vapor. The present inventions, however, among other things, provide the capability to preselect and control the ratio of these components, in addition to, or in conjunction with temperature.

As used herein, unless specified otherwise, the terms specific gravity, which is also called apparent density, should be given their broadest possible meanings, and generally mean weight per until volume of a structure, e.g., volumetric shape of material. This property would include internal porosity of a particle as part of its volume. It can be measured with a low viscosity fluid that wets the particle surface, among other techniques.

As used herein, unless specified otherwise, the terms actual density, which may also be called true density, should be given their broadest possible meanings, and general mean weight per unit volume of a material, when there are no voids present in that material. This measurement and property essentially eliminates any internal porosity from the material, e.g., it does not include any voids in the material.

Thus, a collection of porous foam balls (e.g., Nerf® balls) can be used to illustrate the relationship between the three density properties. The weight of the balls filling a container would be the bulk density for the balls:

$$\text{Bulk Density} = \frac{\text{weight of balls}}{\text{volume of container filled}}$$

The weight of a single ball per the ball's spherical volume would be its apparent density:

$$\text{Apparent Density} = \frac{\text{weight of one ball}}{\text{volume of that ball}}$$

The weight of the material making up the skeleton of the ball, i.e., the ball with all void volume removed, per the remaining volume of that material would be the actual density:

$$\text{Actual Density} = \frac{\text{weight of material}}{\text{volume of void free material}}$$

As used herein, unless stated otherwise, room temperature is 25° C. And, standard ambient temperature and pressure is 25° C. and 1 atmosphere. Unless expressly stated otherwise all tests, test results, physical properties, and values that are temperature dependent, pressure dependent, or both, are provided at standard ambient temperature and pressure, this would include viscosities.

Generally, the term "about" and the symbol "~" as used herein unless stated otherwise is meant to encompass a variance or range of ±10%, the experimental or instrument error associated with obtaining the stated value, and preferably the larger of these.

As used herein, unless specified otherwise the terms %, weight % and mass % are used interchangeably and refer to the weight of a first component as a percentage of the weight of the total, e.g., formulation, mixture, preform, material, structure or product. The usage X/Y or XY indicates weight % of X and the weight % of Y in the formulation, unless expressly provided otherwise. The usage X/Y/Z or XYZ indicates the weight % of X, weight % of Y and weight % of Z in the formulation, unless expressly provided otherwise.

As used herein, unless specified otherwise "volume %" and "% volume" and similar such terms refer to the volume of a first component as a percentage of the volume of the total, e.g., formulation, mixture, preform, material, structure or product.

As used herein, unless expressly stated otherwise, the terms "source material", and "starting material" are synonymous, and as used in the context of boule growth, vapor deposition apparatus, epitaxy, and crystal growth and deposition process, should be given their broadest definition possible, and refer to the material, volumetric shape, and both, that is placed in the growth chamber, or otherwise in an apparatus for crystal growth, boule growth, epitaxy, or SiC deposition, and that forms the flux.

As used herein, unless expressly stated otherwise, the terms "existing material", "prior material", "current material", "currently available material", "existing vapor deposition apparatus", "current vapor deposition apparatus", and similar such terms, refer to source material and apparatus that are, or were, in existence prior to the present inventions. The use of this term is not to be taken as, and is not, an admission of prior art. It is merely to describe the current state of the art as a based line, or reference point, by which the significant and ground breaking improvements of the embodiments of the present inventions can be evaluated, contrasted and measured.

This Background of the Invention section is intended to introduce various aspects of the art, which may be associated with embodiments of the present inventions. Thus, the forgoing discussion in this section provides a framework for better understanding the present inventions, and is not to be viewed as an admission of prior art.

SUMMARY

There has been a long-standing and unfulfilled need for methods of making SiC boules in a cost effective manner to provide among other things high quality single crystal SiC boules for use in making SiC electronic components for devices, apparatus and equipment. The present inventions, among other things, solve these needs by providing the compositions, materials, articles of manufacture, devices and processes taught, disclosed and claimed herein.

There is provided methods of making volumetric shapes of SiC, including polymer derived SiC, using a binder, wherein polymer derived SiC particles are mixed with a binder material, the binder and SiC particles are shaped into a volumetric structure, preferably having a predetermined shape and size (and thus volume) and then cured. The volumetric shape and binder can then be used, for example, in a vapor deposition process to form materials, layers and structures, such as boules, examples of such apparatus and processes in which the present inventions can used are disclosed and taught in US Patent Publication No. 2017/0204532.

Thus, there is provided a volumetric shape of SiC, the volumetric shape having: about 100 g to about 12,000 g of SiC granules, having a particle size of from about 0.1 µm to about 100 µm; the SiC granules defining a volumetric shape having a structural integrity; a binder, wherein the binder binds the SiC granules, whereby the volumetric shape is capable of maintaining the structural integrity when placed in a vapor deposition apparatus during a growth cycle of a boule; the volumetric shape defining a void; and, the volumetric shape having a porosity, wherein the volumetric shape has a apparent density of less than 3.0 g/cc.

Moreover, there is provided these methods, volumetric shapes, wafers and boules, having one or more of the following features: wherein the weight of SiC granules is form about 1000 g to about 9000 g; wherein the weight of SiC granules is form about 2500 g to about 8000 g; wherein the weight of SiC granules is form about 5000 g to about 11000 g; wherein the granules have a primary particle $D_{50}$ size of from about 0.1 µm to about 20.0 µm; wherein the granules have a primary particle $D_{50}$ size of from about 0.5 µm to about 10.0 µm, about 0.5 µm to about 2.0 µm; wherein the granules have a primary particle $D_{50}$ size of from about 1 µm to about 5 µm; wherein the granules have a primary particle $D_{50}$ size of from about 0.5 µm to about 3 µm; wherein the void defines a channel in a top of the volumetric shape; where in the channel is an angled annular channel; wherein the void is located in a top of the volumetric shape; wherein the void is located in a bottom of the volumetric shape; wherein the void has a void located in a top and a bottom of the volumetric shape; wherein the void defines a cylindrical channel extending through the volumetric shape; wherein the shape is a puck; wherein shape has a flat top, a flat bottom and a tapered side; wherein the apparent density is less than 2.5 g/cc; wherein the apparent density is less than 2.5 g/cc; wherein the apparent density is less than 2.5 g/cc; wherein the apparent density is less than 2.5 g/cc; wherein the apparent density is from about 1.5 g/cc to 2.8 g/cc; wherein the apparent density is from about 1.5 g/cc to 2.8 g/cc; wherein the SiC granules are polymer derived SiC and have a purity of at least 99.999%; wherein the SiC granules are polymer derived SiC and have a purity of at least 99.9999%; having a molar ratio of Si:C of 0.5:2; having a molar ratio of Si:C of 2:0.5; having a molar ratio for Si:C in the range of from about 1:1 to about 0.5:2; having a molar ratio for Si:C in the range of from about 1:1 to about 2:0.5; and having a molar ratio for Si:C in the range of from about 0.5:2 to about 2:0.5.

Still further, there is provided a volumetric shape of SiC, the volumetric shape having: about 100 g to about 12,000 g of SiC granules, having a particle size of from about 0.1 µm to about 100 µm; the SiC granules defining a volumetric shape having a structural integrity, wherein the volumetric shape is capable of maintaining the structural integrity when placed in a vapor deposition apparatus during a growth cycle of a boule; the volumetric shape defining a void; and, the volumetric shape having a porosity, wherein the volumetric shape has an apparent density of less than 3.0 g/cc.

Yet further there is provided a volumetric shape of SiC, the volumetric shape having: about 100 g to about 12,000 g of SiC granules, having a particle size of from about 0.1 µm to about 100 µm; the SiC granules defining a volumetric shape having a structural integrity; a binder, wherein the binder binds the SiC granules, whereby the volumetric shape is capable of maintaining the structural integrity when placed in a vapor deposition apparatus during a growth cycle of a boule; and, the volumetric shape defining a void.

Additionally there is provided a volumetric shape of SiC, the volumetric shape having: SiC granules, having a particle size of from about about 0.1 µm to about 100 µm; the SiC granules defining a volumetric shape having a structural integrity; a binder, wherein the binder binds the SiC granules, whereby the volumetric shape is capable of maintaining the structural integrity when placed in a vapor deposition apparatus during a growth cycle of a boule; the volumetric shape defining a void; and, the volumetric shape having a porosity, wherein the volumetric shape has a apparent density of less than 3.1 g/cc; wherein the volumetric shape is capable of providing a predetermined flux during the growth cycle of the boule.

Moreover, there is provided these methods, volumetric shapes, wafers and boules, having one or more of the following features: wherein the predetermined flux is a uniform and consistent flux; wherein the predetermined flux has increased flux density near an outer area of a growth face of a boule during the last 20% of the growth cycle; wherein the predetermined flux has increased flux density near an outer area of a growth face of a boule during the last 30% of the growth cycle; and wherein the predetermined flux has increased flux density near an outer area of a growth face of a boule during the last 40% of the growth cycle.

Furthermore there is provided a volumetric shape of SiC, the volumetric shape having: SiC granules, having a particle size of from about 0.1 µm to about 100 µm; the SiC granules defining a volumetric shape having a structural integrity; the volumetric shape defining a void; and, the volumetric shape having a porosity, wherein the volumetric shape has a apparent density of less than 3.1 g/cc; wherein the volumetric shape is capable of providing predetermined flux during the growth cycle.

Still further there is provided a volumetric shape of SiC, the volumetric shape having: SiC granules, having a particle size of from about 0.1 µm to about 100 µm; the SiC granules defining a volumetric shape having a structural integrity; a binder, wherein the binder binds the SiC granules, whereby the volumetric shape is capable of maintaining the structural integrity when placed in a vapor deposition apparatus during a growth cycle of a boule; and, the volumetric shape defining a void; wherein the volumetric shape is capable of providing a predetermined flux.

Moreover there is provided a volumetric shape of SiC, the volumetric shape having: About 100 g to about 12,000 g of SiC granules, having a particle size of from about 0.1 µm to about 100 µm; the SiC granules defining a volumetric shape; the volumetric shape having a porosity, wherein the volumetric shape has a apparent density of less than 2.9 g/cc; wherein the volumetric shape is capable when placed in a vapor deposition apparatus during a growth cycle of a boule of providing a consistent rate of flux formation during the growth cycle.

Yet further there is provided a volumetric shape of SiC, the volumetric shape having: about 100 g to about 12,000 g of SiC granules, having a particle size of from about 0.1 µm to about 100 µm; the SiC granules defining a volumetric; and, the volumetric shape defining a void; wherein the volumetric shape is capable when placed in a vapor deposition apparatus during a growth cycle of a boule of providing a consistent rate of flux formation during the growth cycle.

Moreover, there is provided a volumetric shape of SiC, the volumetric shape having: about 100 g to about 12,000 g of SiC granules, having a particle size of from about 0.1 µm to about 100 µm; the SiC granules defining a volumetric shape; a binder, wherein the binder binds the SiC granules; and, wherein the volumetric shape is capable when placed in a vapor deposition apparatus during a growth cycle of a boule of providing a predetermined rate of flux formation during the growth cycle.

Yet further there is provided a volumetric shape of SiC, the volumetric shape having: about 100 g to about 12,000 g of SiC granules, having a particle size of from about 0.1 µm to about 100 µm; the SiC granules defining a volumetric shape; a binder, wherein the binder binds the SiC granules, thereby defining the volumetric shape; the volumetric shape having a porosity, wherein the volumetric shape has a apparent density of less than 2.9 g/cc; wherein the volumetric shape is capable when placed in a vapor deposition apparatus during a growth cycle of a boule of providing a uniform flux formation during the growth cycle.

Additionally there is provided a volumetric shape of SiC, the volumetric shape having: about 100 g to about 12,000 g of SiC granules, having a particle size of from about 0.1 µm to about 100 µm; the SiC granules defining a volumetric; and, the volumetric shape defining a void; wherein the volumetric shape is capable when placed in a vapor deposition apparatus during a growth cycle of a boule of providing a uniform flux formation during the growth cycle.

Moreover there is provided a volumetric shape of SiC, the volumetric shape having: about 100 g to about 5,000 g of SiC granules, having a particle size of from about 0.1 µm to about 100 µm; the SiC granules defining a volumetric shape; a binder, wherein the binder binds the SiC granules; and, wherein the volumetric shape is capable when placed in a vapor deposition apparatus during a growth cycle of a boule of providing a uniform flux formation during the growth cycle.

There is further provided a method of growing a SiC boule, the method including: placing a starting material having SiC in a vapor deposition apparatus; heating the starting material to a temperature whereby the SiC sublimates forming a flux having species of Si and C; the flux flowing across an area directly adjacent to the growth face of a boule; wherein the area is the same as and coincident with the growth face of the boule; wherein the flux is predetermined across the entirety of the area; and, depositing the flux on the growth face of the boule to grow the boule in length.

Moreover, there is provided these methods, volumetric shapes, wafers and boules, having one or more of the following features: wherein the flux is uniform across the entirety of the area during boule growth; wherein the flux is greater near an outer area of the boule face during at a time during the growth of the boule when at least half of the length of the boule has been grown; wherein the growth face of the boule is a seed crystal; wherein the growth face of the boule is a face of the boule; wherein the boule as grown is single crystalline; wherein the boule as grown is a single polytype; whereby the boule as grown is characterized by a diameter of about 3 inches to about 6 inches, a length of about 2 inches to about 8 inches, and a radius of curvature for the growth face of the boule is at least 2× the length; whereby the boule as grown is characterized by a diameter of about 3 inches to about 6 inches, a length of about 2 inches to about 8 inches, and a radius of curvature for the growth face of the boule is at least 5× the length; whereby the boule as grown is characterized by a diameter of about 3 inches to about 6 inches, a length of about 2 inches to about 8 inches, and a radius of curvature for the growth face of the boule is at least 10× the length; whereby the boule as grown is characterized by a diameter of about 3 inches to about 6 inches, a length of about 2 inches to about 8 inches, and a radius of curvature for the growth face that is infinite; whereby the boule as grown is characterized by a diameter of about 3 inches to about 6 inches, a length of about 2 inches to about 8 inches, and a radius of curvature for the growth face that at least about 50 inches; whereby the boule as grown is characterized by a diameter of about 6 inches to about 8 inches, a length of about 2 inches to about 8 inches, and a radius of curvature for the growth face of the boule is at least 2× the length; whereby the boule as grown is characterized by a diameter of about 6 inches to about 8 inches, a length of about 2 inches to about 8 inches, and a radius of curvature for the growth face of the boule is at least 5× the length; whereby the boule as grown is characterized by a diameter of about 6 inches to about 8 inches, a length of about 2 inches to about 8 inches, and a radius of curvature for the growth face of the boule is at least 10× the length; whereby the boule as grown is characterized by a diameter of about 6 inches to about 8 inches, a length of about 2 inches to about 8 inches, and a radius of curvature for the growth face that is infinite; whereby the boule as grown is characterized by a diameter of about 6 inches to about 8 inches, a length of about 2 inches to about 8 inches, and a radius of curvature for the growth face that at least about 50 inches; whereby the boule as grown is characterized by a length of about 2 inches to about 8 inches, and a radius of curvature for the growth face of the boule is at least 2× the length; whereby the boule as grown is characterized by a length of about 2 inches to about 8 inches, and a radius of curvature for the growth face of the boule is at least 5× the length; whereby the boule as grown is characterized by a length of about 2 inches to about 8 inches, and a radius of curvature for the growth face of the boule is at least 10× the length; whereby the boule as grown is characterized by a length of about 2 inches to about 8 inches, and a radius of curvature for the growth face that is infinite; and whereby the boule as grown is characterized by a length of about 2 inches to about 8 inches, and a radius of curvature for the growth face that at least about 50 inches; and, wherein the flux is maintained at a constant rate.

Yet further there is provided a method of growing a SiC boule, the method having: placing a starting material having SiC in a vapor deposition apparatus; heating the starting material to create a flux and begin a growth cycle; during the growth cycle flowing the flux across an area directly adjacent to a growth face of a boule; wherein the flux flow is maintained at a predetermined rate during the growth cycle; and, depositing the flux on the growth face of the boule to grow the boule in length.

Additionally, there is provided a method of growing a SiC boule, the method including: placing a volumetric shape of starting material having SiC in a vapor deposition apparatus; heating the volumetric shape to provide a directional flux during a growth cycle of a boule; and, depositing the directional flux on a growth face of the boule to grow the boule in length.

Moreover, there is provided these methods, volumetric shapes, wafers and boules, having one or more of the following features: wherein in the directional flux provide increased flux density to the outer areas of the growth face, whereby the boule has a planar face during; and wherein the boule is free from defects;

Still additionally, there is provided these methods, volumetric shapes, wafers and boules, having one or more of the following features: whereby the boule is grown by a method disclosed in this specification; the method of making an electronics components, includes obtaining a wafer made by a method disclosed in this specification; providing a printed circuit on a wafer made by a method disclosed in this specification; and making a system having electronic components obtained by a method of this specification; assembling electronic components into a system wherein a component is based upon or contains a wafer made by the methods disclosed in this specification.

There is further provided a method of providing a large number of devices from a single growth cycle of a boule, the method including: placing a volumetric shape of starting material having SiC in a vapor deposition apparatus; heating the volumetric shape to provide a directional flux during a growth cycle of a boule; and, depositing the directional flux on a growth face of the boule to grow the boule in length; wherein a boule is formed capable of providing a significantly large number of wafers, electronic circuits and systems.

Moreover, there is provided these methods, volumetric shapes, wafers and boules, having one or more of the following features: wherein about 80% of the length of the boule is capable of being cut to provide defect free wafers; wherein about 90% of the length of the boule is capable of being cut to provide defect free wafers; wherein about 95% of the length of the boule is capable of being cut to provide defect free wafers; wherein about 99% of the length of the boule is capable of being cut to provide defect free wafer; wherein wafers have MPD (≤0.1 cm−2), TSD (≤300 cm−2) and BPD (≤500 cm−2); have resistivities greater than about 10,000 ohm-cm at 20° C.; and have resistivities not less than about 10,000 ohm-cm at 20° C.

Still further there is provided a volumetric shape of a composite material of ultra pure silicon carbide particles and a binder for use in vapor deposition growth of silicon carbide boules, the volumetric shape having: silicon carbide particles, wherein the particles are at least 99.999% pure; a binder joining the silicon carbide particles together and thereby defining a volumetric shape; the binder having a cross linked polymeric material consisting of carbon and silicon; and, wherein the binder has a volitization temperature that is between about 300° C. and 700° C.; whereby the binder is incapable of interfering with SiC boule growth and incapable of adversely affecting SiC boule quality.

Moreover, there is provided these methods, volumetric shapes, wafers and boules, having one or more of the following features: having a density from about 1 g/cc to about 3 g/cc; wherein the binder is less than 5% of the weight of the volumetric shape; wherein the binder is less than 10% of the weight of the volumetric shape; wherein the binder is less than 20% of the weight of the volumetric shape; wherein the binder is less than 35% of the weight of the volumetric shape; wherein the binder is less than 5% of the weight of the volumetric shape; wherein the binder is less than 10% of the weight of the volumetric shape; wherein the binder is less than 20% of the weight of the volumetric shape; wherein the binder is less than 35% of the weight of the volumetric shape; having a density of less than about 3.1 g/cc; having a density of less than about 3 g/cc; having a density of less than about 2.5 g/cc; having a density of less than about 2 g/cc.

In addition there is provided a volumetric shape of a composite material of ultra pure silicon carbide particles and a binder for use in vapor deposition growth of silicon carbide boules, the volumetric shape having: polymer derived silicon carbide particles, having a non-oxide forming surface; wherein the particles are at least 99.9999% pure; a binder joining the silicon carbide particles together and thereby defining a volumetric shape; and, wherein the binder has a volitization temperature lower than the volitization temperature of the polymer derived silicon carbide particles; whereby the binder is incapable of interfering with SiC boule growth and incapable of adversely affecting SiC boule quality.

Moreover, there is provided these methods, volumetric shapes, wafers and boules, having one or more of the following features: having a porosity of from about 10% to about 30% void volume; having a porosity of from about 5% to about 40% void volume; having a porosity of from about 10% to about 30% void volume; having a porosity of from about 5% to about 40% void volume; having a density from about 1 g/cc to about 3 g/cc; wherein the binder is less than 5% of the weight of the volumetric shape; wherein the binder is less than 10% of the weight of the volumetric shape; wherein the binder is less than 20% of the weight of the volumetric shape; and, wherein the binder is less than 35% of the weight of the volumetric shape.

Moreover, there is provided these methods, volumetric shapes, wafers and boules, having one or more of the following features: wherein the volitization temperature of the binder is at least 500° C. below the volitization temperature of the silicon carbide particles; wherein the volitization temperature of the binder is at least 550° C. below the volitization temperature of the silicon carbide particles; wherein the volitization temperature of the binder is at least 600° C. below the volitization temperature of the silicon carbide particles; wherein the volitization temperature of the binder is at least 650° C. below the volitization temperature of the silicon carbide particles; and wherein the volitization temperature of the binder is at least 700° C. below the volitization temperature of the silicon carbide particles; wherein the volitization temperature of the binder is at least 800° C. below the volitization temperature of the silicon carbide particles; wherein the volitization temperature of the binder is at least 900° C. below the volitization temperature of the silicon carbide particles; wherein the volitization temperature of the binder is at least 1,000° C. below the volitization temperature of the silicon carbide particles.

Still further there is provided a volumetric shape of a composite material of ultra pure silicon carbide particles and a binder for use in vapor deposition growth of silicon carbide boules, the volumetric shape having: silicon carbide particles, wherein the particles are at least 99.999% pure, wherein the particles have a $D_{50}$ particle size from about 0.1 μm to about 20.0 μm; a binder joining the silicon carbide particles together and thereby defining a volumetric shape; the binder having a cross linked polymeric material having carbon and silicon; and, wherein the binder has a volitization temperature that is between about 300° C. and 900° C.; whereby the binder is incapable of interfering with boule growth and incapable of adversely affecting boule quality.

Moreover, there is provided these methods, volumetric shapes, wafers and boules, having one or more of the following features: having an elastic modules of from about 10 GPa to about 300 GPa; having a hardness of from about 300 Kg/mm² to about 2,000 Kg/mm²; having a compressive strength of about 50 MPa to about 3,000 MPa; having a hardness of from about 300 Kg/mm² to about 2,000 Kg/mm² and, having a compressive strength of about 50 MPa to about 3,000 MPa; and; wherein the particles have a $D_{50}$ particle size of from about 0.5 μm to about 10 μm; wherein the particles have a $D_{50}$ particle size of from about 1 μm to about 15 μm; wherein the particles have a $D_{50}$ particle size of about 1 μm; and wherein the particles have a $D_{50}$ particle size of about 3 μm.

Further there is provided a volumetric shape of a composite material of ultra pure silicon carbide particles and a binder for use in vapor deposition growth of silicon carbide boules, the volumetric shape having: silicon carbide particles, wherein the particles are at least 99.999% pure, wherein the particles have an average particle size equal to or less than 5 μm and no more than 10% of the particles are larger than 10 μm; a binder joining the silicon carbide particles together and thereby defining a volumetric shape; the binder having a cross linked polymeric material having carbon and silicon; and, wherein the binder has a volitization temperature that is between about 300° C. and 900° C.; whereby the binder is incapable of interfering with boule growth and incapable of adversely affecting boule quality.

Still further there is provided a method of growing a boule in a vapor deposition apparatus the method including: placing a volumetric shape of the present inventions into a vapor deposition apparatus; vaporizing the binder first and the silicon carbide particles second in time; and forming a boule from the vaporized silicon carbide particles, free of the vaporized binder.

Yet additionally there is provided a method of growing a boule in a vapor deposition apparatus the method including: placing a volumetric shape of a composite material of ultra pure silicon carbide particles and a binder into a vapor deposition apparatus; the volumetric shape having: polymer derived silicon carbide particles, having a non-oxide forming surface; wherein the particles are at least 99.9999% pure; a binder joining the silicon carbide particles together and thereby defining a volumetric shape; the binder having silicon, carbon and an additive for providing functionality to a boule; wherein the binder has a volitization temperature at or below the volitization temperature of the polymer derived silicon carbide particles and the additive has a volitization temperature at about the volitization temperature of the polymer derived ceramic particle; vaporizing the volumetric shape; to form vapors; depositing the vapors on a substrate to form a boule; whereby the binder is incapable of providing the boule with a predetermined functionality, and the additive is capable of providing functionality based in part, upon the additive.

Yet additionally, there is provided a volumetric shape of a composite material of ultra pure silicon carbide particles and a binder for use in vapor deposition growth of silicon carbide boules, the volumetric shape having: silicon carbide particles, wherein the particles are at least 99.999% pure; a binder joining the silicon carbide particles together and thereby defining a volumetric shape; the binder having a cross linked polymeric material having no oxygen and having carbon and silicon; and, wherein the binder has a volitization temperature that is between about 300° C. and 800° C.; whereby the binder is incapable of interfering with SiC boule growth and incapable of adversely affecting SiC boule quality.

Still moreover there is provided a volumetric shape of a composite material of ultra pure silicon carbide particles and a binder for use in vapor deposition growth of silicon carbide boules, the volumetric shape having: silicon carbide particles, wherein the particles are at least 99.999% pure; a binder joining the silicon carbide particles together and thereby defining a volumetric shape; the binder having a cross linked polymeric material having no oxygen, no silicon, and having carbon; and, wherein the binder has a volitization temperature that is between about 300° C. and 800° C.; whereby the binder is incapable of interfering with SiC boule growth and incapable of adversely affecting SiC boule quality.

BRIEF DESCRIPTION OF THE DRAWINGS

FIG. 4C is a side perspective view of the embodiment of FIG. 4A.

FIG. 4E is a side perspective view of a cross section of the embodiment of FIG. 4A.

Figure 1A:
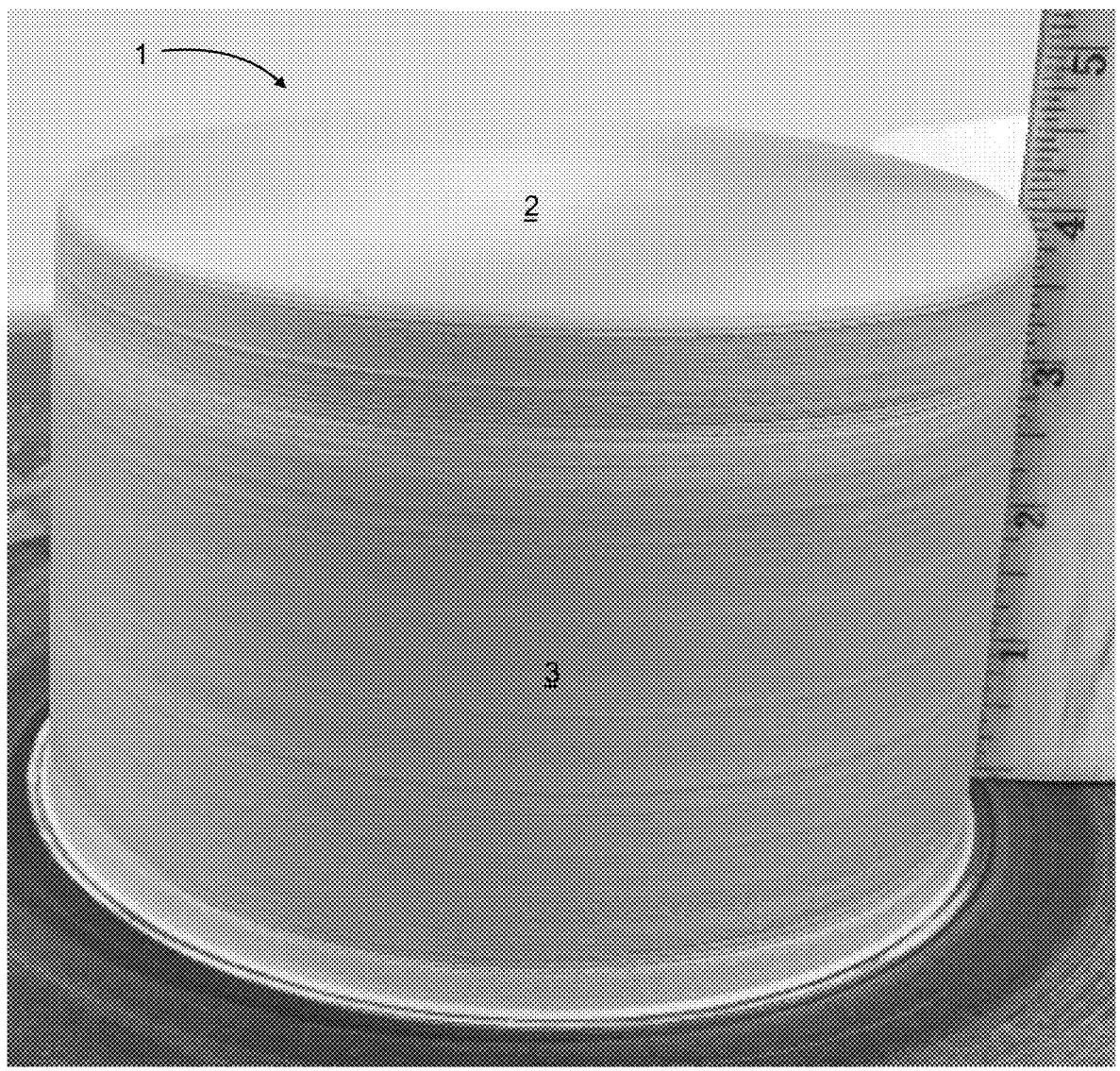
FIG. 1A is a perspective view of an embodiment of a volumetric shape in accordance with the present inventions (6 inch diameter, flat top and bottom).
Figure 1B:
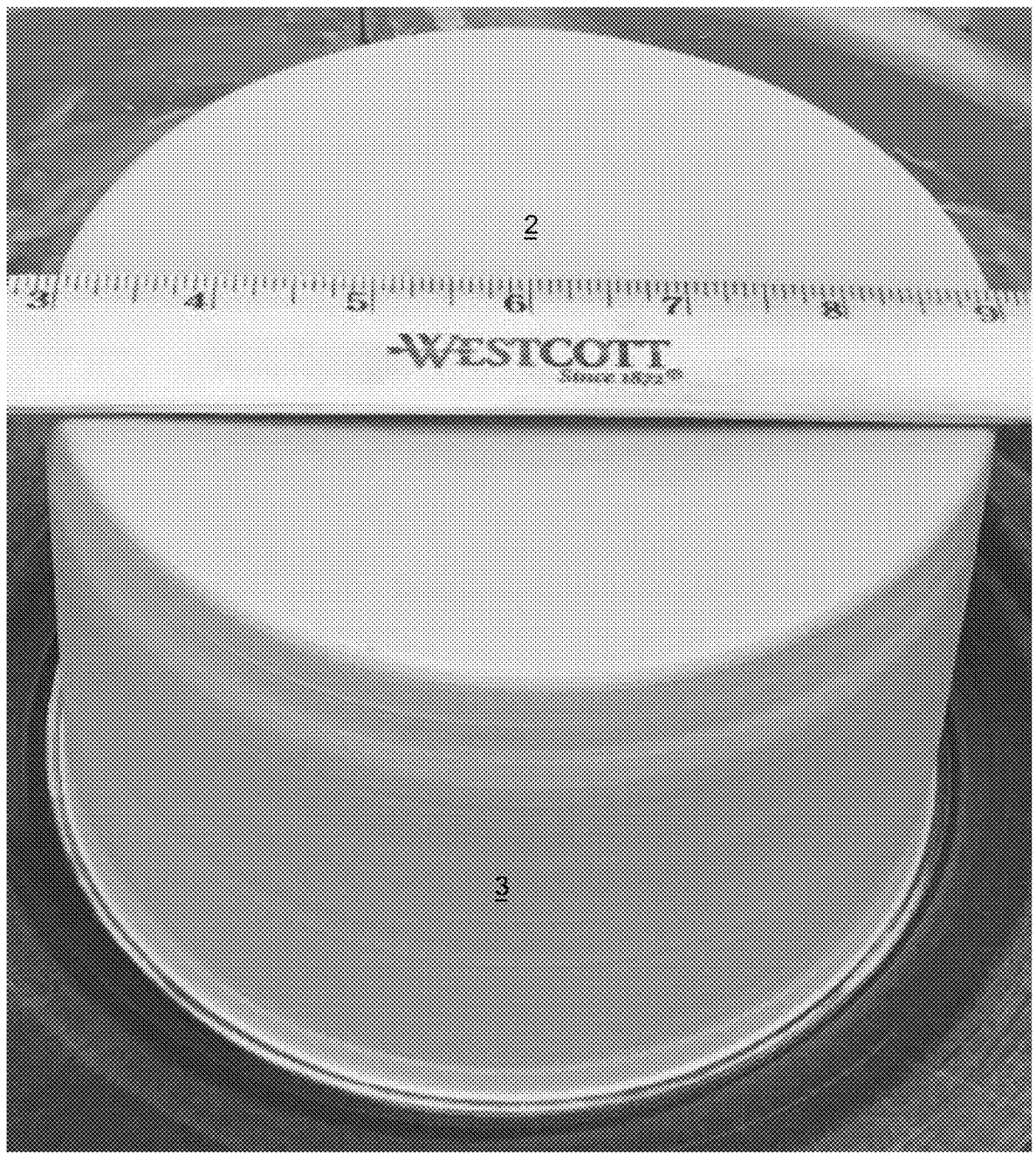
FIG. 1B is a top perspective view of the embodiment of FIG. 1A.
Figure 1C:
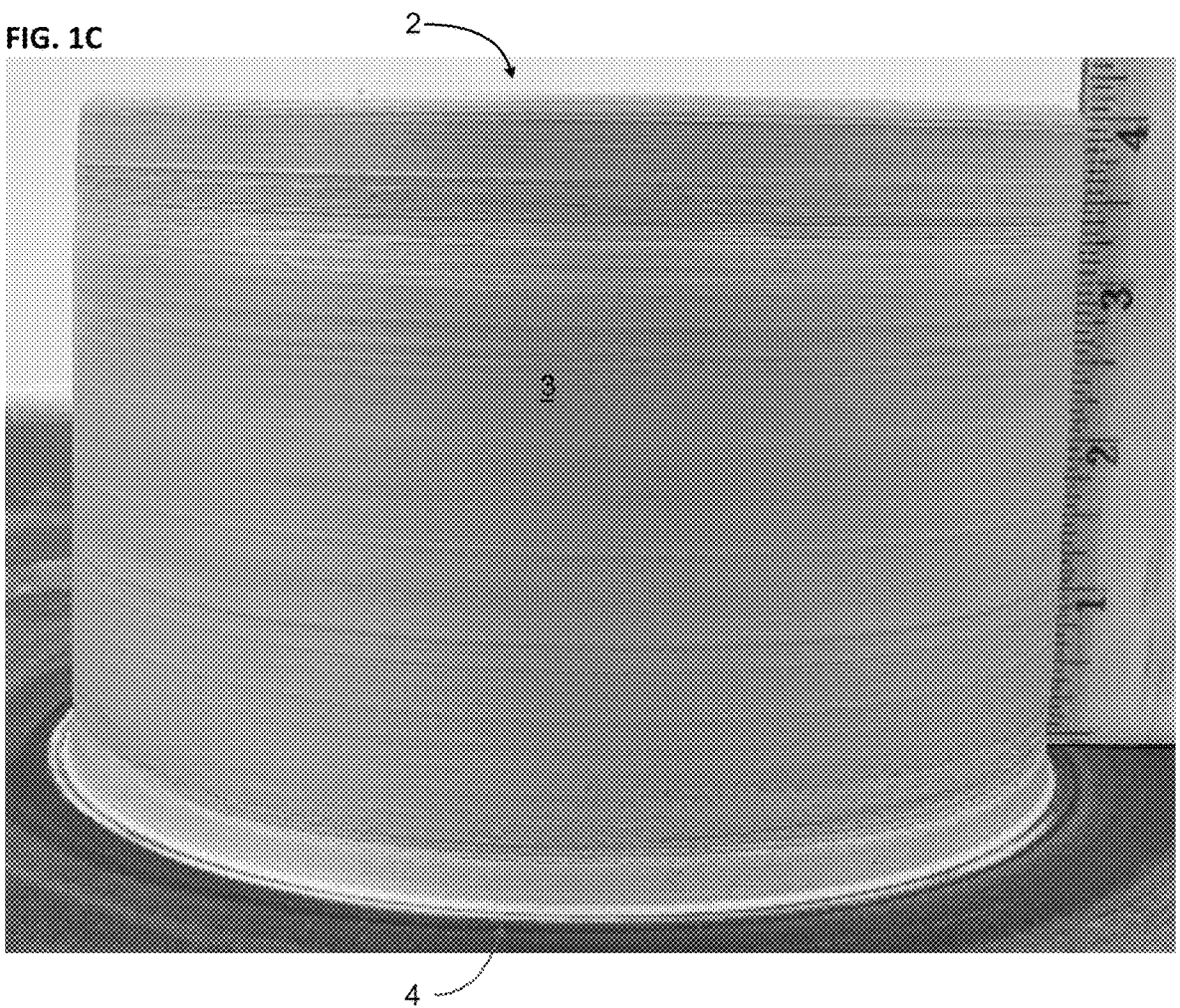
FIG. 1C is a side view of the embodiment of FIG. 1A.
Figure 1D:
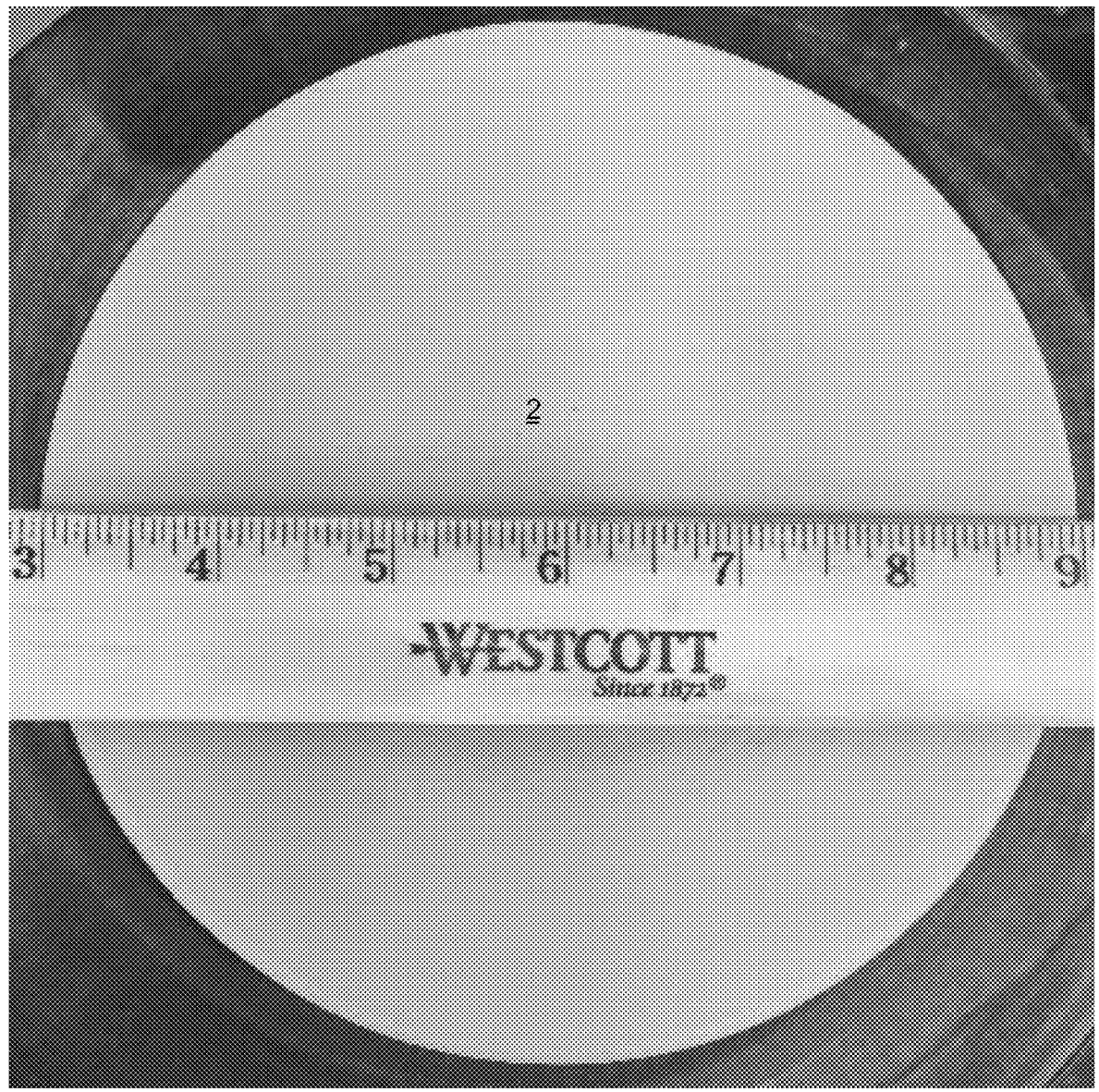
FIG. 1D is a top view of the embodiment of FIG. 1A.

To the extent that a ruler it shown in a figure it is to provide scale for the embodiment of that figure and the features of that embodiment. The scale is used for illustrate purposes and does not limit or restrict embodiments to other sizes, shapes and proportions.

DESCRIPTION OF THE PREFERRED EMBODIMENTS

In general, the present inventions relate to volumetric shapes of Silicon Carbide (SiC) particles; and growing structures from these volumetric shapes. In embodiments, the particles, as well as, the volumetric shapes have good, high, and ultra high purity. The present inventions further relate to apparatus and methods for using these volumetric shapes of SiC particles in vapor deposition technologies to form SiC boules, which boules, for example, are used to make wafers and devices for electronics applications.

Although this specification focuses on SiC vapor deposition technologies, it should be understood that the present inventions are not so limited, and can find applicability in other SiC crystalline growth processes, joining processes, as well as other applications.

Embodiments may include polymer derived ceramic ("PDC") materials, products and applications that are using, based on, or constituting PDCs generally.

Embodiments of the present inventions preferably use, are based upon or constitute PDCs that are "polysilocarb" materials, e.g., materials containing silicon (Si), oxygen (O) and carbon (C), and embodiments of such materials that have been cured, and embodiments of such materials that have been pyrolized and embodiment of such materials that have been converted to SiC. The polysilocarb materials may be of high and exceptionally high purity. The polysilocarb materials may also contain other elements. Polysilocarb materials are made from one or more polysilocarb precursor formulation or precursor formulation. The polysilocarb precursor formulation contains one or more functionalized silicon polymers, or monomers, non-silicon based cross linkers, as well as, potentially other ingredients, such as for example, inhibitors, catalysts, fillers, dopants, modifiers, initiators, reinforcers, fibers, particles, colorants, pigments, dies, the same or other PDCs, ceramics, metals, metal complexes, and combinations and variations of these and other materials and additives. Silicon oxycarbide materials, SiOC compositions, and similar such terms, unless specifically stated otherwise, refer to polysilocarb materials, and would include liquid materials, solid uncured materials, cured materials, ceramic materials, and combinations and variations of these.

Examples of PDCs, PDC formulations, potential precursors, starting materials, and apparatus and methods for making these materials, that can be used, or adapted and improved upon employing the teachings of this specification to be used, in embodiments of the present inventions are found, for example, in US Patent Publication Nos. 2014/0274658, 2014/0323364, 2015/0175750, 2016/0207782, 2016/0280607, 2017/0050337, 2008/0095942, 2008/0093185, 2007/0292690, 2006/0069176, 2006/0004169, and 2005/0276961, and U.S. Pat. Nos. 9,499,677, 9,481,781, 8,742,008, 8,119,057, 7,714,092, 7,087,656, 5,153,295, and 4,657,991, and the entire disclosures of each of which are incorporated herein by reference.

Formulations, processes, methods of making, and compositions for various polysilocarbs are taught and disclosed in U.S. Pat. Nos. 9,499,677, 9,481,781 and US Patent Publication Nos. 2014/0274658, 2014/0323364, 2015/0175750, 2016/0207782, 2016/0280607, 2017/0050337, the entire disclosure of each of which are incorporated herein by reference.

Typically, and preferably, the polysilocarb precursor formulation is initially a liquid. The liquid precursors are cured to a solid or semi-solid SiOC. The solid or semi-solid SiOC is then pyrolyzed to a ceramic SiOC, which is then converted into SiC.

Figure 17:
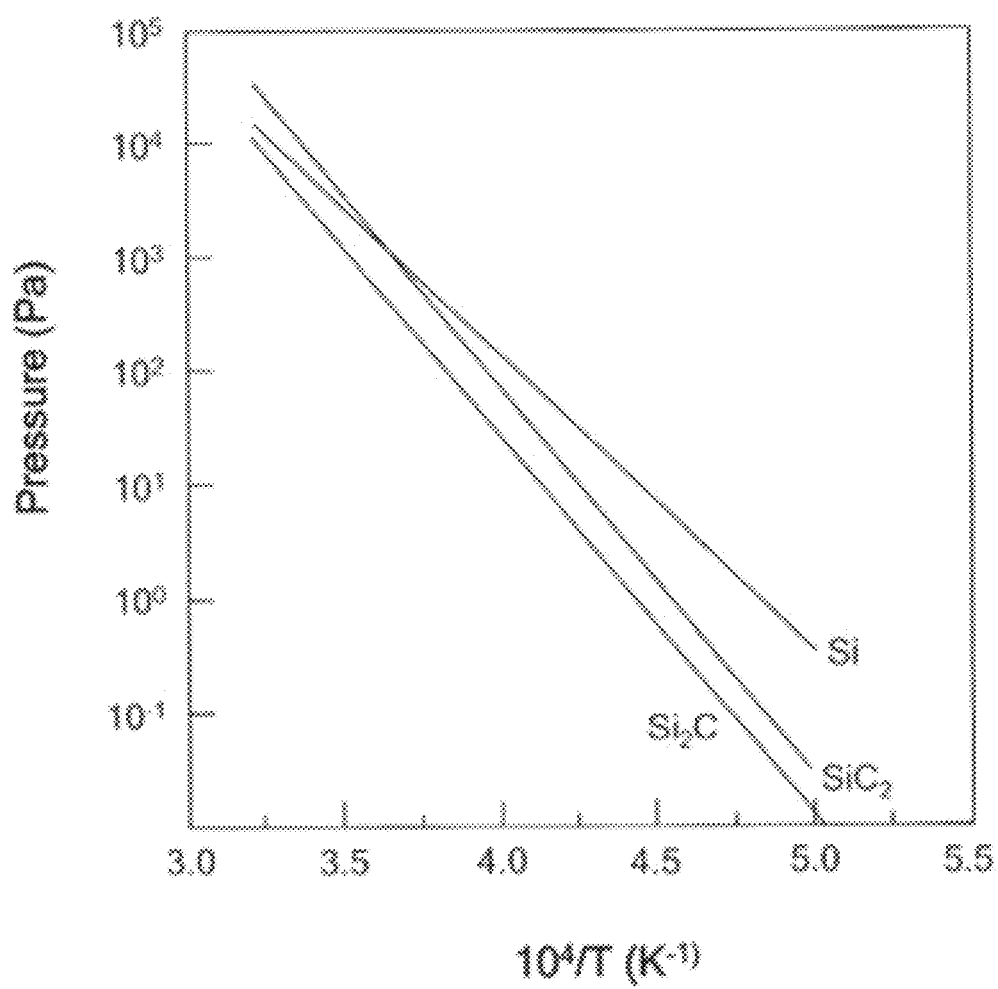
FIG. 17 a partial pressure curve for SiC, $Si_2C$, and $SiC_2$.

Silicon carbide does not generally have a liquid phase, instead it sublimes, under vacuum, at temperatures above about 1,700 to 1,800° C. Turning to FIG. 17 there is provided a chart of a partial pressure curve for SiC. Typically, in industrial and commercial applications conditions are established so that the sublimation takes place at temperatures of about 2,500° C. and above. When silicon carbide sublimes it typically forms a vapor consisting of several different species of silicon and carbon. Generally, it was believed that temperature determines the ratio of these different components in the silicon carbon vapor.

The present inventions, however, among other things, provide the capability to preselect and control the ratio of the different species, e.g., Si, C, SiC $Si_2C$ and $SiC_2$, present in the silicon carbon vapor. Thus, in addition to temperature, the present inventions permit the control of the silicon carbon species in the vapor in, and between, the starting material (e.g., a puck of SiC), and the surface where the silicon carbon vapor is deposited as a solid, e.g., a crystal, to grow for example a boule. This silicon carbon vapor in the vapor deposition process can be referred to as the "flux."

The preferred embodiments of boules are single crystal and have only a single polytype. It being understood, that embodiments of boules with multiple polytypes, with multiple crystals, and both, are also envisioned by the present specifications.

It is theorized that, for example, by controlling the amount of carbon present relative to the amount of silicon present, in the polysilocarb derived SiC, or in the volumetric shape used as the starting material, the amount and species of Si and C present in the flux can be predetermined and controlled. Further, and for example, by varying in a controlled manner the porosity of the polysilocarb derived SiC, the porosity of the volumetric shape and both, the amount of flux, rate of flux formation, and species of silicon and carbon present in the flux can be predetermined and controlled.

The amount of carbon present, e.g., excess (more carbon than stoichiometric, i.e., one-to-one, silicon to carbon), starved (less carbon than stoichiometric) and stoichiometric in the starting material or starting puck, can be predetermined. In this manner, the amount of carbon in the starting material or volumetric shape, e.g., the puck, can be set or established. This amount can be established, for example, (i) by using different binders to form the volumetric shape; (ii) by having layers of SiC material having different predetermined amounts of carbon present; (iii) by having zones in the volumetric shape of SiC having different predetermined amounts of carbon present; and (iv) combinations and variations of these, as well as, by controlling in a predetermined manner the amount of carbon present in the starting material. Further, by controlling and predetermining the ratio of carbon to silicon in the starting material, these ratios can be controlled and predetermined in the flux.

The present inventions provide embodiments of methods and processes for the growth of boules, e.g., vapor deposition of SiC to form a single crystal boule of SiC, that provides for very flat, e.g., having a limited amount of curvature or arc at the face of the boule. The very flat profile of the boule is achieved primarily by the use of preselected shapes of the SiC puck that is placed in the vapor deposition apparatus. The preselected shape is configured so that during the vapor deposition process the area of the flux, and the flow within that area, remains constant over the entirety of the boule growing process. In this manner the rate and amount of SiC that is deposited on the face of the boule as it is grow remains consistent and uniform during the boule growing process. Thus, for example in growing a 6 inch diameter boule the area of flux flow would be 28.27 inchs$^2$ and the flow rate and amount of SiC flowing across that area would uniform across that entire area during the growth of the boule, e.g., a 3 inch length boule, a 4 inch length boule, etc. Even as the amount and location of the SiC that is available for sublimation changes, within the puck, during the process, the shape of the puck directs the flux, e.g., "directional flux," in a manner to keep the flow of flux uniform across the area directly adjacent to the face of the boule. Examples of shapes to provide directional flux would be the embodiments of FIGS. 4A-4F, and 5A-5F.

In an embodiment the flux is not maintained constant throughout the growth process. Thus, in this embodiment the rate, distribution of the flux across the growth face is managed, e.g., controlled in a predetermined manner, to provide predetermined growth of regions of the boule or growth face. Thus, for example, in the latter stages of growth the flux can be directed in a predetermined manner to compensate for the nonuniformity that has occurred in the boule's growth. In this example, areas where flux was greater in the earlier stages of growth have lesser flux in latter stages of growth; similarly, areas where flux was lesser in the earlier stages of growth have greater flux in latter stages of growth. In this way, the final boule growth face minimizes curvature, or maximizes the radius of curvature, of the boule face.

Figure 21:
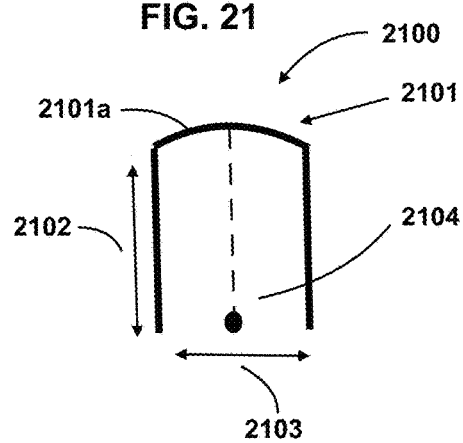
FIG. 21 is a schematic of an embodiment of a boule illustrating the determination of the boule face's radius of curvature.

In an embodiment the use of controlled flux, and more preferably direction flux, can provide a 4 inch boule having a radius of curvature (i.e., the reciprocal of the curvature) that would be at least about 6 inches, at least about 8 inches, at least about 20 inches, at least about 60 inches, and approaching infinite (i.e., planar), as well as all values within the range of these values. In an embodiment, of a 6 inch boule the radius of curvature (i.e., the reciprocal of the curvature) would be at least about 10 inches, at least about 15 inches, at least about 25 inches, at least about 60 inches, and approaching infinite (i.e., planar), as well as all values within the range of these values. In an embodiment the radius of curvature of the boule face is at least 2× the length of the boule, at least 5× the length of the boule, at least 10× the length of the boule, and at least 25× the length of the boule, up to and including where the boule face is planar, as well as all values in this range. Turning to FIG. 21 there is a schematic of a boule 2100. The boule 2100 has a length shown by arrow 2102 and a width or diameter shown by arrow 2103. The boule has a face (e.g. growth face) 2101 that has a curved surface 2101a. The radius of curvature of that surface 2101a is shown by dashed line 2104. Thus, the radius of curvature of surface 2101a, which will be the radius of curvature for the boule 2100, equals the radius 2104 of the circular arc which best approximates the curve of the face 2101.

In an embodiment the flux can be manipulated with pressure, as well as, temperature. For a given growth temperature, the growth can be slowed down by increasing the chamber pressure. The fastest rate is typically under "full" vacuum (e.g., vacuum pump is on and keeping the chamber pressure as low as possible). Thus, by way of example, to grow a boule at 400 µm/hr, the growth can be at a temp T1 under P1 of full vacuum, or could be at temp T2>T1 with a partial pressure of argon (P2>P1) of a few mBar to a few 10 s of mBar. In this manner the flux and growth rate can be "tuned".

In embodiments the polymer derived SiC imparts better polytype stability in the boule due to a more consistent flux composition over time. This embodiment, i.e., controlled polytype stability, is valuable and important for boule manufacturers, as a polytype shift mid-growth means only a portion of the boule is the original polytype, which typically adversely impacts electronic properties which affect the device performance of the chips built therefrom.

The present inventions provide the ability to "tune" the flux, and thus provide the ability through the use of the present polymer derived SiC and predetermined puck shapes, to enable less efficient vapor deposition apparatus to produce boules at a substantially improved quality, quantity, production rates and combinations and variations of these. In this manner the performance of lower quality vapor deposition apparatus can be significantly improved, and improved to a point where they meet or exceed higher quality vapor deposition apparatus. Thus, for example, the present shapes and their ability to tune the flux, provide the ability for an existing vapor deposition apparatus, without any mechanical modifications, to produce boules having: 10% fewer defects, having 20% fewer defects, having 50% fewer defects, having 100% fewer defects, and even fewer defects; produce boules at 2× the rate, at 3× the rate, and at 4× the rate and greater rates; and produce boules having flatter faces, i.e., more planar, at least 2× flatter, at least 3× flatter, at least 4× flatter and flatter, as well as all within in the range of these values; and combination and variations of these improvements, including all three of these general improvements, i.e., less defects, increased rate, and increased flatness. Tuning the flux provides the ability for a vapor deposition apparatus, without any mechanical modification to produce 1.5×, 2×, 3× or more boules for a given period of time, and more preferably with one or more of the improved quality features, set forth herein, including substantially less defects and of generally higher quality.

Figure 18:
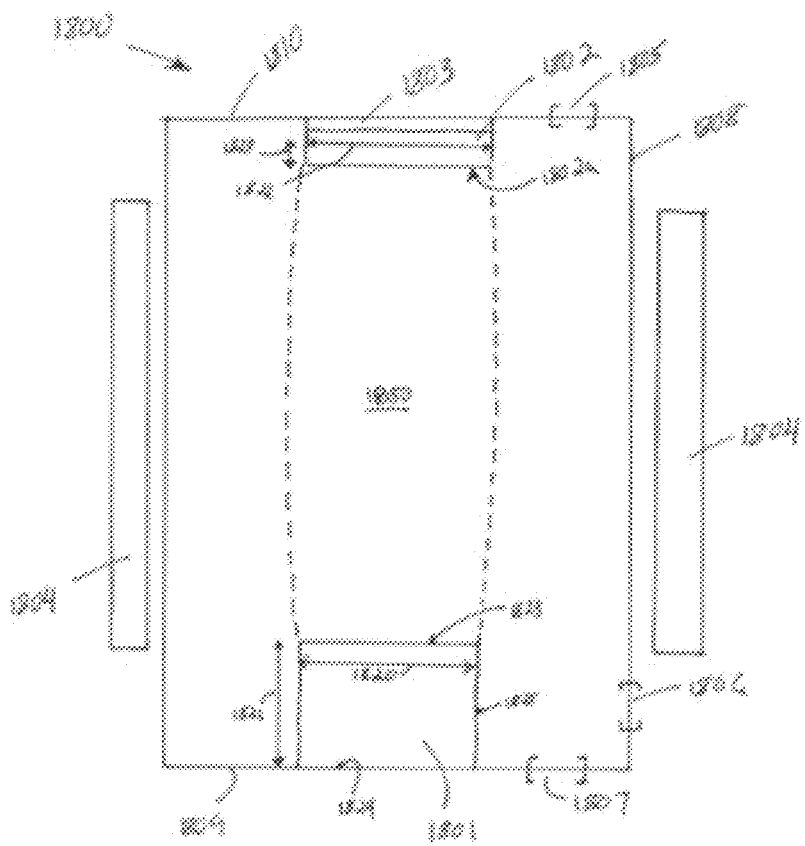
FIG. 18 is a schematic cross section of a vapor deposition apparatus and process in accordance with the present inventions.

Turning to FIG. 18 there is shown a schematic cross sectional representation of an apparatus for growing SiC crystals, crystalline structures and boules. The vapor deposition device 1800 is a vessel having a side wall 1808, a bottom or bottom wall 1809, and a top or top wall 1810. The walls 1808, 1809, 1810 can have ports 1806, 1807, 1805, which can be openings, nozzles, values, that can control or permit the flow of gases into and out of the device 1800. The device 1800 has associated with it heating elements 1804. The heating elements can be configured and operated to provide a single temperature zone, or multiple temperature zones inside the device 1800. Inside of the device 1800 there is a puck 1801 that is made out of SiC particles that have been formed together into a volumetric shape.

The puck 1801 can have a predetermined porosity and density. The SiC particles can have a predetermined porosity and density. The SiC particles are held together, preferably by a binder. The puck 1801 can be carbon rich, carbon starved, or stoichiometric. The puck 1801 can have zones or layers that are carbon rich, carbon starved, or stoichiometric. Preferably, the SiC particles are SiOC polymer derived SiC. Non-polymer derived SiC may also be used as part or all of the puck. The puck 1801 has a height, shown by arrow 1821 and a cross section or diameter 1820. The puck 1801 has an upper or top surface 1823 and a bottom surface 1824. In this embodiment the puck 1801 is shown as a flat top and bottom cylinder; it being understood that any of the volumetric shapes contemplated by the present specification could be used in the device 1800.

At the top 1810 of the device 1800 there is a seed crystal 1802, having a surface 1802a. The seed crystal 1802 has a cross section or diameter 1822 and a height 1823. In some embodiments the seed crystal can be mounted on a movable platform 1803 to adjust the distance between surface 1802a and surface 1823.

The diameter 1820 of the puck 1801 can be larger than, smaller than, or the same as the diameter 1822 of the seed crystal 1802.

In operation, the heating element 1804 raises the temperature of the puck 1801 to the point where the SiC sublimates. This sublimation causes the formation of a gas having the various species of silicon and carbon. This gas, i.e., the flux, is present in the area 1850 between surfaces 1802a and 1823. Depending upon the porosity, or other factors, the flux may also be present within the puck 1801. The flux rises in the device 1800 through area 1850, where it deposits SiC on surface 1802a. Surface 1802a must be kept at a temperature that is cool enough to cause the gaseous silicon carbon species to deposit out on its surface forming SiC crystals. In this manner the seed crystal 1802 is grown into a boule by continuously adding grown SiC in polytype-matched orientation onto its surface. Thus, unless adjusted by device 1803 (which is shown in the fully retracted position), during the growth of the boule, surface 1803 will grow toward the bottom 1809, and thus, decrease the distance between surface 1802a and the bottom 1809. The shape of the flux can be used to create a predetermined temperature differential within the puck during the vapor deposition process. This predetermined temperature differential can address, reduce and eliminate the detrimental effects of passivation, which is the condition where species build up in the puck during the process that reduces or prevents Si—C vapor formation.

It is theorized that the process of sublimation and deposition takes place inside of the volumetric shape of the source material itself and follows the thermal gradient in the source material that naturally arises, or which thermal gradient may be determined by the shape of the puck. In an embodiment the binding material could preferably remain present and maintain the shape and integrity of the puck during sublimation temperatures, and thus, not sublime at or below the sublimation temperature of the SiC. This thermal gradient is typically from the exterior toward the interior and upward. It is theorized that material is continually sublimed and re-deposited on adjacent particles and in this way undergoes a refluxing or solid-state "fractional distillation" or "fractional sublimation" of the Si—C species.

It is further theorized that in an embodiment a volumetric shape and its predetermined gradient could allow some heavier impurities to be trapped behind in the bottom of the growth chamber within the puck, while the lighter elements are sublimed along with the Si—C vapor and are carried to the seed. This theoretically provides the ability to have dopants or other additives release at predetermined times in the process; as well as to mitigate potential adverse effects of impurities. It being understood that preferably ultra pure materials are used in the puck.

In an embodiment the puck provides for a more consistent rate of flux formation for a given temperature. The shape can be tailored to provide a more uniform temperature throughout the shape, allowing for a higher volume fraction of the shape to be subliming at once, driving higher rates of flux at the seed/vapor interface at a given temperature than a standard pile of powder or cylindrical shape of powder. Thus, growth of polytypes which require a lower temperature growth processes will not be limited to slower growth rates as a consequence.

Sublimation rate is measured in grams/hr. Flux is given by grams/cm$^2$-hr (i.e., the rate of material passing through an area). Thus, a key area is the flux area corresponding to the instantaneous surface area of the boule growth surface, e.g., the face of the boule where SiC is being deposited. Typically, the flux area, and the area of the boule face are about the same, and these areas are typically slightly smaller than the cross sectional area of the growth chamber of the vapor deposition apparatus.

For the purpose of calculations and this analysis it is assumed, for ease of calculations, that the cross sectional area of the growth chamber is the same as the area of the flux and the area of the boule face. Thus, the growth rate (μm/hr) of the boule can be equated to the flux of vapor as well— μm/hr→g/hr (density of fully dense SiC is 3.21 g/cc) through the area of the boule surface (cm$^2$). In-situ measurements can be done via X-ray imaging or X-ray computed tomography (CT). Otherwise, average growth rates can be determined by weighing the boule before/after growth.

Typical commercial growth rates are in the 200-500 μm/hr range. Embodiments of the present processes and volumetric shapes far exceed these existing commercial rates, while at the same time providing boules of equal and superior quality. For example, embodiments of the present inventions can have growth rates of about 550 to about 1,1000 μm/hr, about 800 to about 1,000 μm/hr, about 900 to about 1,100 μm/hr, about 700 μm/hr, about 800 μm/hr, about 900 μm/hr, about 1,000 μm/hr, 1,100 μm/hr at high temperatures and low pressure. Higher rates are contemplated and slower rates may also be used, as well as all rates within these ranges.

Generally, growth rates are driven by 1) temperature and 2) supplied gas pressure (Ar, N$_2$, etc). More gas pressure dilutes the vapor pressure of silicon carbon species at the seed, and face of the boule, and slows growth rate for any given temperature. Thus, pressure can be used to "dial-in" a growth rate. The chart of FIG. 19 shows growth rates for an embodiment of the present polysilocarb derived SiC (puck having a 1.4-1.45 g/cc packing density).

Figure 19:
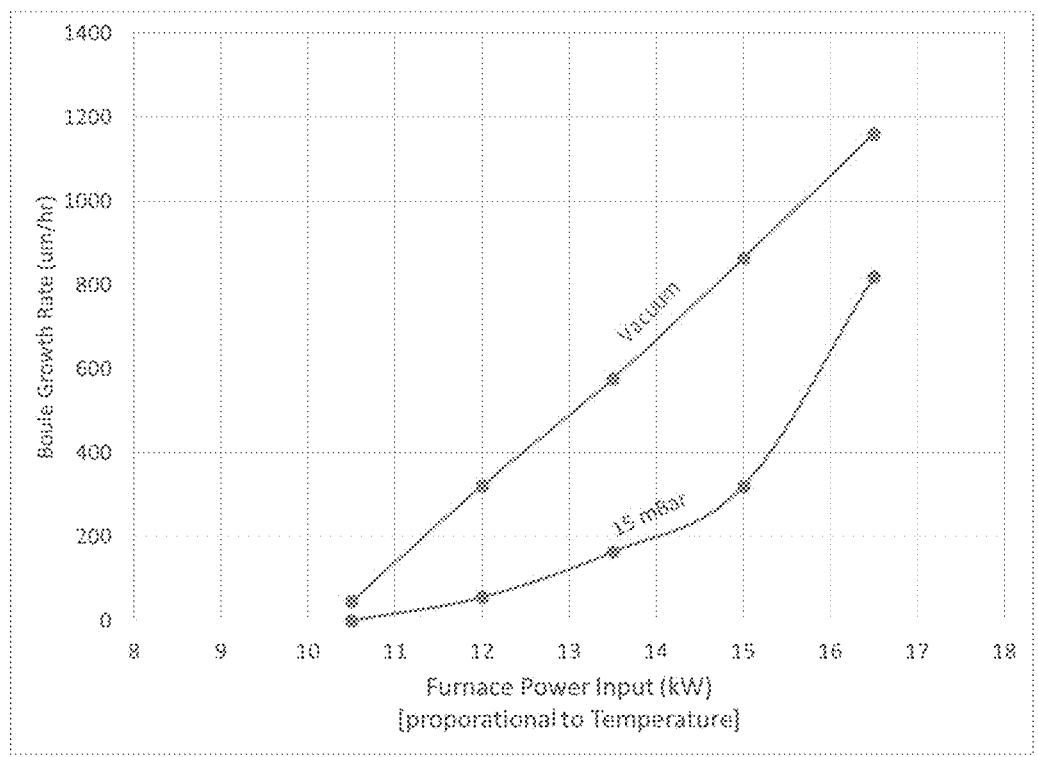
FIG. 19 is a chart showing embodiments of boule growth rates in accordance with the present inventions.

From the chart of FIG. 19, it can be seen that embodiments of the present inventions do not exhibit passivation. They are not self-limiting, and they are passivation free. These embodiments provide a significant improvement and advantage over existing sources of SiC starting materials in vapor deposition processes. These existing sources of SiC have a self-limiting effect, where the rate of flux production decreases over time as surface effects on the starting material restrict or inhibit sublimation. This self-limiting effect is generally known as passivation, but may also be referred to as source depletion, graphitization, or carbonization.

Thus, embodiments of the volumetric shapes, e.g., the pucks, given a constant temperature, can maintain a consistent rate of flux production, e.g., constant, over the entire operation of boule growth, including boules having about a 4 inch to about a 10 inch diameter, about 6 inch to about 8 inch diameter, about 4 inch diameter, about 6 inch diameter, about 8 inch diameter and larger and smaller, as well as all diameters within the range of these values. Embodiments of the volumetric shapes, given a constant temperature for the entire boule growth process, can maintain the rate of flux production, and thus the rate of boule growth at a constant rate, a constant rate, at a rate that has less than about 0.001% change, at a rate that has less than about 0.01% change, at a rate that has less than about 1% change, at a rate that has less than about 5% change, at a rate that has less than about 20% change, at rate that has from about 0.001% change to about 15% change, at rate that has from about 0.01% change to about 5% change, and combinations and variations of these during the growth of the boule, as well as all values within the range of these values. In embodiments, at constant temperature, the rate of flux formation remains: at about a 99.999% to about a 60% of its maximum rate; at about a 99% to about a 95% of its maximum rate; at about a 99.99% to about a 80% of its maximum rate; at about a 99% to about a 70% of its maximum rate; at about a 95% to about a 70% of its maximum rate; at about 99% to about 95% of its maximum rate; and combinations and variations of these during the growth of the boule, as well as, all values within the range of these percentages.

Embodiments have unique bulk densities. In an embodiment the volumetric shapes, e.g., pucks, are made in a molding process, and thus, the powder can be compacted to very high bulk density up to 2.0 g/cc (2.0/3.21=62% packing fraction or 38% porosity). The resulting shape still has the same high surface area of the starting material particles, yet allows for more weight of source material to occupy the bottom of the growth chamber. In this manner a larger boule can be grown from a higher density source material. More source material, which also remains active during the entirety of the growth process, results in longer growing times and thus longer, wider, and both, boules. These benefits are present regardless of the final shape of the growth interface. This also can elongate the growth cycle to further grow larger boules.

In this manner the capacity utilization of the growth portion of the cycle of the vapor deposition process can be maximized. Thus, embodiments of the present inventions provide the ability to greatly increase the capacity utilization of the growth cycle of existing vapor deposition apparatus. Typically, in existing vapor deposition apparatus there is required ~10-30 hr heat-up times (which is not a part of the growth cycle) and a ~30-50 hr cool-down times (which is not a part of the growth cycle). These non-growth cycle time will only increase with larger boule sizes (the chambers and the boules cannot be thermally shocked or they may break). Thus, the growth cycle (i.e., the time during the heating cycle when sublimation and deposition to grow the boule are occurring), if extended by 10-20 hrs of growth, can add 400 µm/hr of boule growth. This in turn will enable significantly more wafers to be produced per boule growth cycle and reduce the cost of consumables and ultimately the manufacturing cost per wafer. Thus, embodiments of the present inventions are the ability to substantially increase the growth duration capacity utilization of the furnace.

Thus, in embodiments the growth cycle of a vapor deposition apparatus, for boules of the same diameter, can be increased by using embodiments of the present polymer derived SiC and volumetric shapes compared to using currently available SiC source materials: by about 10% to about 100%, by about 10% to about 60%, by about 20% to about 60%, by about 33% to about 70%, at least about 30%, at least about 50%, at least about 70% and more, as well as, all values within the ranges of these percentages. In embodiments the number of wafers, for wafers having the same thickness and diameter, that can be eventually obtained (boule is grown and then cut to wafers having the same thickness) from a single growth cycle can be increased using embodiments of the present polymer derived SiC and volumetric shapes compared to using currently available SiC source materials: by about 10% to about 500%, by about 100% to about 300%, by about 10% to about 70%, by about 30% to about 70%, at least about 20%, at least about 50%, at least about 100%, at least about 200%, by at least 2 wafers, by at least 10 wafers, by at least 20 wafers, by at least 100 wafers, by at least 1,000 wafer, by about 2 to 100 wafers, by about 10 to 100 wafers, by about 50 to 200 wafers, by about 100 to 500 wafers, and more, as well as all values within the range of these values. The ability to obtain more wafers from a single growth cycle is also obtained by, and further increased, because the embodiments of the present boules will have substantially fewer defects, than boules grown from conventional SiC source materials, and thus there will be substantially more usable material in the boule to make wafers. This increased production of wafers, and increased efficiency of boule growth, and increased quality of the boule, can further have the effect of increased production of devices from a single growth cycle. Thus, the number of devices can be increased by at least about 100, by at least about 200, by at least about 1,000, by at least about 10,000, by at least about 100,000 and more, from about 100 to about 10,000, from about 1,000 to about 30,000, from about 500 to about 20,000 and from about 20,000 to about 50,000, as well as all values within the range of these values.

Embodiments provide the ability to have shape control in predetermined shapes, many of which shapes it is believed have not been known, and for a large part are unobtainable using existing starting materials. The shape of the volumetric shape, e.g., the puck, that is placed into the vapor deposition apparatus as the source material for boule growth, can drive or positively influence many parameters of the growth process to obtain larger boules, higher quality boules, higher quality wafers, more wafers, compared to conventional source materials, and combinations and variation of these. These improved growth parameter, include: reducing the axial thermal gradient of the source; radial thermal gradient of the source; increasing the axial thermal gradient of the source; surface area of the source material which is subliming, preventing flux restrictions; hotter internal source temperatures to provide more uniform sublimation throughout the source material; fast-flux and guided flux pathways through the source material (directing the vapor to desired locations—center or edge or both, which among other things, provide for a flatter boule growth face). The ability to direct the flux toward the edges of the boule during latter stages of growth enables the edges to grow as fast as the center does, despite the source being more completely consumed near the edges. Thus, the final geometry is not the typical convex boule that is obtained by using current source material, and which has wasted boule material that cannot be used to make wafers from. Instead, the present embodiments of source material provide boules that have flat faces, thus greatly increasing the about of the boule that can be used to make wafers.

Additional benefits that are obtained from the ability to have predetermined shapes of the starting material, in addition to the above, include: enabling radiative heating of the center of the growth face through line-of-sight to the crucible bottom, which, among other things, reduces the radial thermal gradient in the seed crystal and it is believed further enables the growth of larger boules (8" 10" and beyond), as well as damping the cool-down cycle to reduce stress in the crystal and preventing cracking; improving polytype stability and reducing line defects/dislocations, compared to using existing starting material in the same vapor deposition apparatus, through more uniform boule temperatures and less thermal stresses on the boule as a result; enables more complete utilization of the source material because of the ability to preselect or determine to not have starting material where it never gets completely sublimed by the end of the process; reduce waste source material, by having a large amount of the source material sublimed to form a boule, and thus improving source-to-boule yield and cost efficiency.

Figure 9:
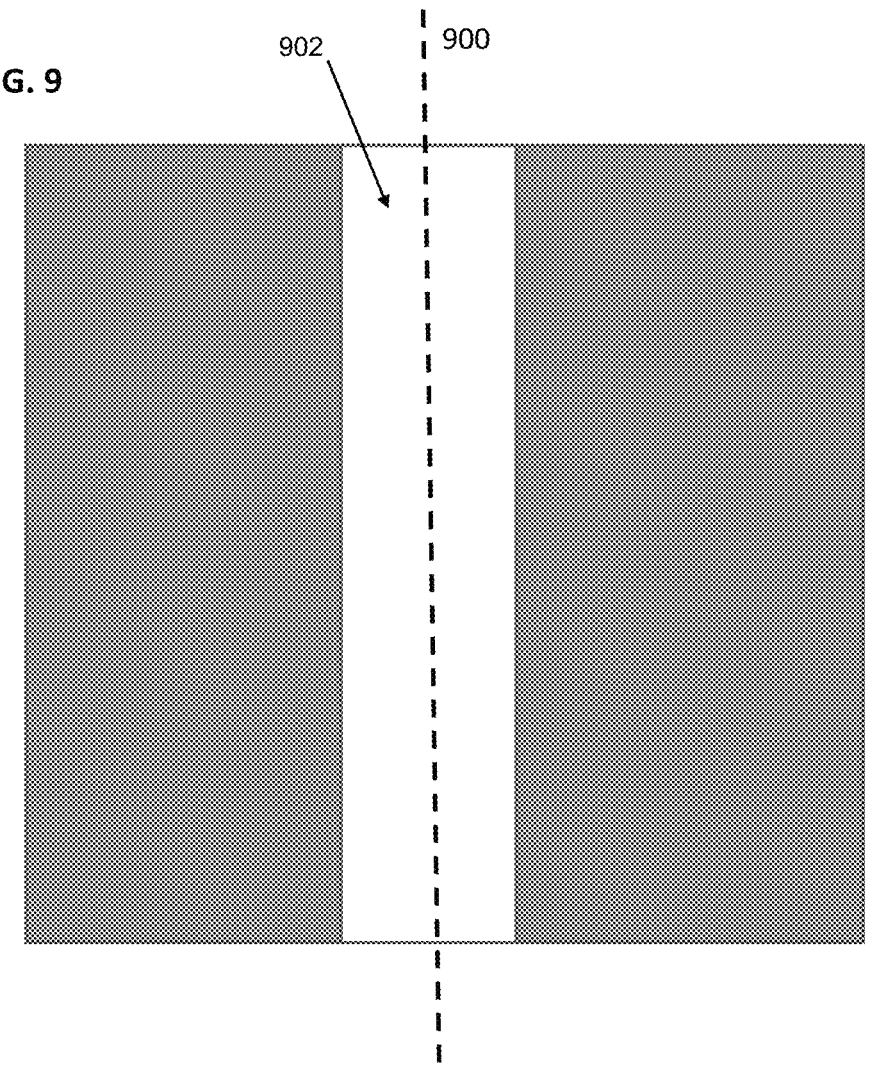
FIG. 9 is a schematic cross sectional view of an embodiment of a volumetric shape in accordance with the present inventions.
Figure 10:
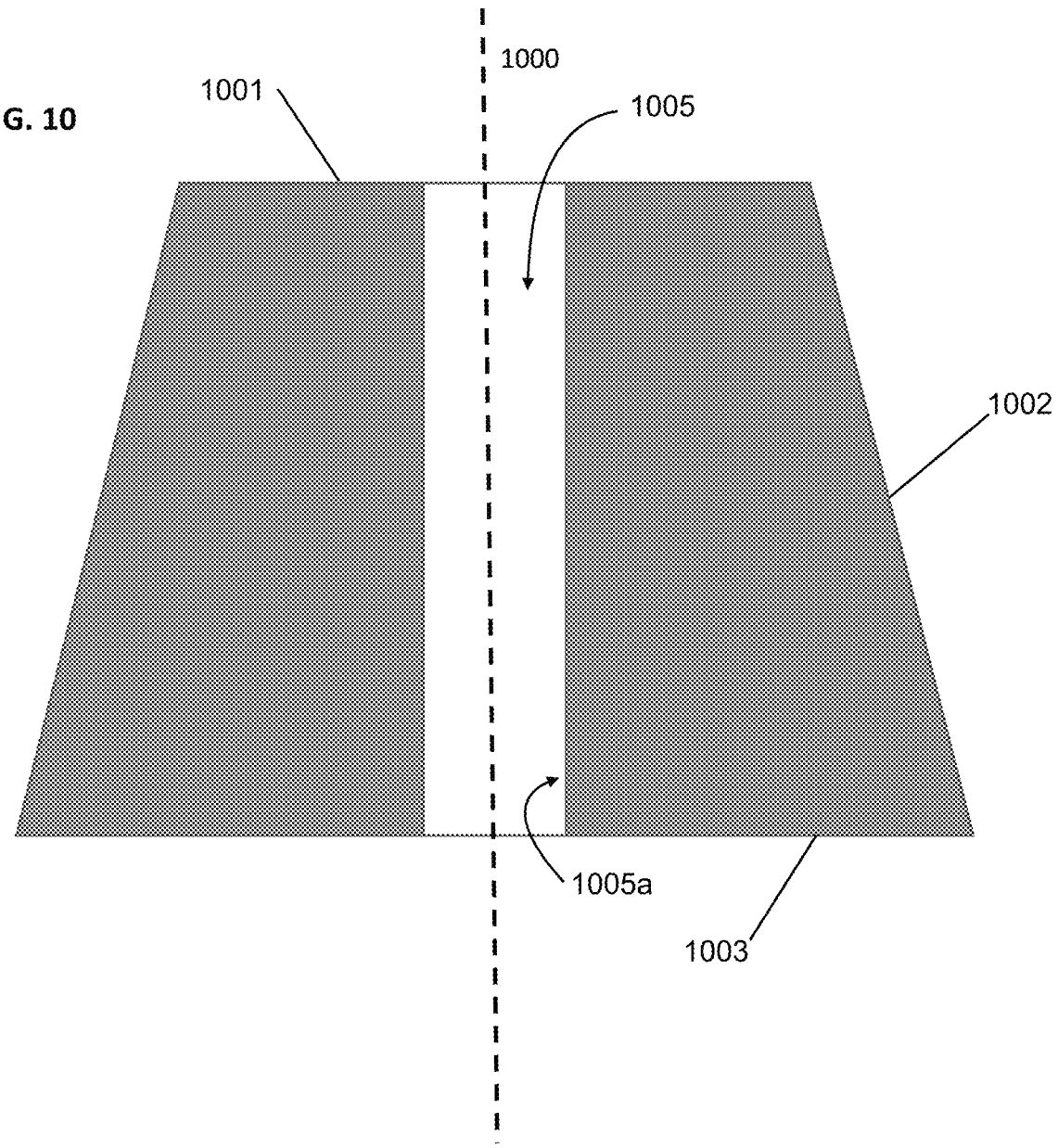
FIG. 10 is a schematic cross sectional view of an embodiment of a volumetric shape in accordance with the present inventions.

The center of the boule at the growth front, is typically, cooler than the edge which makes it more of a "sink" for material deposition (source to sink vapor flux). Thus, it is theorized that If the line-of-sight is open from bottom to top through the source material, the radiation from the bottom of the crucible will reach the center of the boule face and warm it up a little—even ones to tens of degrees C. matter—making the center less of a "sink" and allow for a more uniform temperature of the entire seed, thus creating a more uniform flux at all positions along the crystal and enable a flatter boule. It is further theorized that this open line of sight shape embodiment, will also allow for the material at the center of the source material to more effectively sublimate and get turned into boule—this is usually the last place to sublimate because it's the coldest part of the source material and the growth is stopped before it ever gets depleted. An example of an embodiment of an open line of sight shaped puck is shown in FIGS. 9 and 10.

Embodiments provide for the distribution of density of source material throughout a volumetric shape, which is used as the starting material in a vapor deposition apparatus. This predetermined distribution of density provides several advantages and improvements over existing source materials, including: predetermined and controlled thermal conducting to specific portions or areas of the shape, such as improved thermal conduction to the certain region, limited thermal conduction such that the source is consumed more evenly throughout, and having thermal conduction maintained in a controlled manner, preferably uniformly, during the duration of the growth cycle. The sublimation composition (i.e., the composition of the vapor that is formed from the sublimation of the starting material, e.g., the flux composition) may also be altered, either having a more sustained or uniform composition throughout the cycle or a more amplified composition at the outset of growth, which provides among other things, better polytype stability due to stable composition.

Embodiments provide for the distribution of different stoichiometry of powder throughout the shape, e.g., layers, zones, areas having different types of powder starting material, different binders, and combinations and variations of these. This predetermined distribution of different stoichiometries provide several advantages, including: customization of the sublimation composition as the source material is consumed from the outside in, which enables less shift in composition from beginning to end of the growth cycle. This predetermined distribution of different stoichiometries can also enhance polytype stability because of the consistent composition of the vapor.

Embodiments provide for the tailored stoichiometry of the source or starting material powder, the tailored stoichiometry of the volumetric shape binder, additives to the volumetric shape, additive to the starting material powder, and combinations and variations of these. For example, using up to 20% liquid-phase binders and particles means the stoichiometry can be shifted from 1:1 Si:C, e.g., form 1.5:1 Si:C to 1:1.5 Si:C, as well as, all values within the range of these ratios. Larger and smaller shifts are contemplated. Stoichiometry is maintained using PDC precursors, water, or evaporative solvents or non-Si or non-C compounds (e.g., boric acid, alumina, aluminum nitride, aluminum nitrate, calcium nitrate, sodium phosphate). Stoichiometry is shifted to C-rich using LDPE, carbon black, graphite powder, boron carbide, PAN, waxes, polylactic acid, cellulose, sucrose/sugars, sodium bicarbonate, starches, etc. Stoichiometry is shifted to Si-rich using Si-powder, Si-rich SiC to start, Silica, soda-lime glass, borosilicate glass, silicon nitride.

Silicon- or carbon-rich stoichiometries species will have a higher silicon or carbon content respectively in the vapor flux at the growth outset and can affect the polytype stability of the growth. Thus, for example, having a source material stoichiometry that provides a Carbon rich gas phase can increase 4H polytype stability. Having Nitrogen doping, either in the volumetric shape, the gas flow or both can similarly increase 4H polytype stability. Likewise, having growth temperatures in the 2,100 to 2,500° C., can increase 4H polytype stability.

This ability to tailor the stoichiometry of the powder can be combined with the ability to tailor the geometric location of the silicon-rich phase. In this manner, the location of the silicon-rich phase may be such that the "graphitization" phenomenon of depleted SiC can be in-situ reacted to form additional SiC for sublimation. Alternatively, the Si-rich region could offset the reduced Si-content in the vapor phase during later stages of growth, which would then allow for a more consistent flux of silicon-carbon species throughout the growth duration, especially during the latter stages of growth.

Generally, the process for obtaining SiC goes from a liquid precursor formulation to a cured material, to a pyrolized SiOC material, which is converted to a SiC material (alpha, beta, or both). During these processes—curing, pyrolizing and converting, some of the various building blocks are lost, typically C and O. Si may also be lost, but preferably the process and the precursor are such that Si loss is minimal to none. For example, excess C, built into the precursor or from an external source, e.g., in the oven, will drive the formation of CO over SiO resulting in less loss of Si. The greater degree of cross-linking that takes place in the cured material, the lower the Si losses during pyrolizing and converting, and thus, the greater the yield of SiC.

Processes, formulations and systems for making high purity and ultra high purity SiC and SiOC are disclosed and taught in US Publ. No. 2016/0207782, which is incorporated herein by reference.

In an embodiment the cured SiOC may be in a volumetric shape, e.g. a puck, pill, pellet, plate, bead or disc, which is then directly converted into a friable mass of SiC, without the need for intermediate processing steps, and with minimal to no grinding. In an embodiment the cured SiOC is ground into granular SiOC and then converted into granular SiC, which is then formed into a volumetric shape with the use of a binder. In an embodiment the SiOC (either cured or pyrolized) is formed into SiC particles. The particles can then be formed, e.g., pressed, into a volumetric shape, or mass of SiC. Preferably, the size and size distribution of the SiC particles are predetermined and no further grinding is needed. In an embodiment, if need be, these particles can then be ground down to smaller, more uniform or both, granules. The granules can then be formed, e.g., pressed, into a volumetric shape, or mass of SiC. In these, as well as, other embodiments when making high purity, and ultra high purity, SiC, it is preferably to have all components of the system free of substances that are viewed as impurities in the subsequent uses or process for the SiC; or to have these components shielded, encased or otherwise having mitigation steps implemented to avoid the introduction of impurities into the process, and the SiC.

Figure 16:
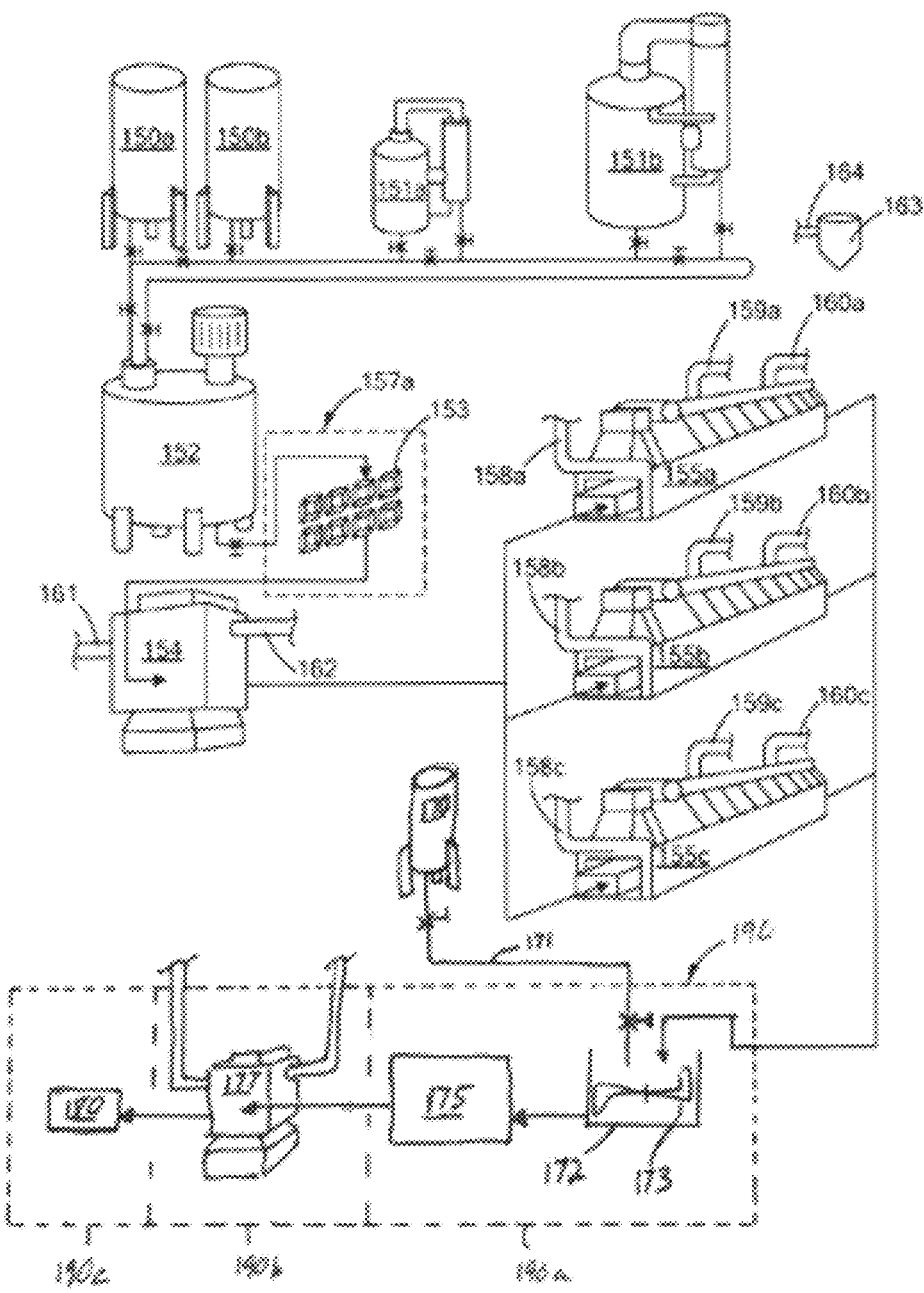
FIG. 16 is a process flow diagram of an embodiment of a system and method in accordance with the present inventions.

Turning to FIG. 16 there is provided a schematic perspective flow diagram of an embodiment of a system and method for making volumetric shapes of SiC derived from SiOC, and for making such volumetric shapes preferably in higher purity (e.g., 3-nines, 4-nines, 5-nines and more, and preferably 6-nines or more). The lines, valves and interior surfaces of the system containing the precursors and other materials are made from or coated with materials that will not contaminate, e.g., provide a source of impurities, the SiOC, derived SiC and volumetric shapes of SiC. Storage tanks 150a, 150b hold liquid polysilocarb precursors. In this embodiment one or both or none of the precursors can be taken through a distillation apparatus 151a and distillation apparatus 151b, to remove any impurities from the liquid precursor. The liquid precursors are then transferred to a mixing vessel 152 where they are mixed to form a precursor batch and catalyzed. In a clean room environment 157a the precursor batch is packaged into vessels 153 for placement in a furnace 154. The furnace 154 has sweep gas inlet 161 and off-gas take away line 162. The packaged and cured material is then transferred under clean room conditions, to several pyrolysis furnaces 155a, 155b, 155c, where it is transitioned from SiOC to SiC. The furnaces have sweep gas inlet lines 158a, 158b, 158c respectively, and two off-gas take away lines 159a and 160a, 159b and 160b, 159c and 160c respectively. The off-gasses can be processed, cleaned and starting materials recovered in the off-gas processing assembly 163 having an inlet line 164, which collects the off-gasses from various units in the system.

The resultant SiC is then transferred to a volumetric shape forming area 190, which preferably is under clean room conditions. In area 190 the SiC is provided to a mixing vessel 172, having a mixing device 173 (e.g., blades, paddles, agitators, etc.). A binder, from binder tank 170, is added to the vessel 172, via line 171. In the mixing vessel 172 the SiC is mixed with the binder to form a slurry or blend. The consistency of the slurry should be such as to facilitate the later pelletizing operation. The SiC-binder slurry is then transferred to a forming apparatus 175, where the slurry is formed into volumetric shapes, e.g., pellets, discs, blocks, etc., and feed into a oven 177, where the binder is cured to give the volumetric shape the desired strength. The cured volumetric shapes are then transferred to a packaging device 180, where they are packaged. Preferably these operations are performed under clean room conditions, and more preferable the operations are in separate clean rooms, or areas of a clean room, 190a, 190b, 190c.

Preferably, in making SiC, and materials for use in making SiC, in a preferred embodiment the polysilocarb precursors, can be mixed at about 1 atmosphere, in cleaned air.

Preferably, in making SiC, and materials for use in making SiC, the curing takes place at temperatures in the range of from about 20° C. to about 150° C., from about 75° C. to about 125° C. and from about 80° C. to 90° C. and variations and combinations of these temperatures, as well as, all values within the ranges of these temperatures. The curing is conducted over a time period that preferably results in a hard cured material. The curing can take place in air or an inert atmosphere, and preferably the curing takes place in an argon atmosphere at ambient pressure. Most preferably, for high purity materials, the furnace, containers, handling equipment, and other components of the curing apparatus are clean, essentially free from, and do not contribute any elements or materials, that would be considered impurities or contaminants, to the cured material.

Preferably, in making SiC, and materials for use in making SiC, the pyrolysis takes place at temperatures in the range of from about 800° C. to about 1300° C., from about 900° C. to about 1200° C. and from about 950° C. to 1150° C., as well as, all values within the range of these temperatures. The pyrolysis is conducted over a time period that preferably results in the complete pyrolysis of the preform. Preferably the pyrolysis takes place in inert gas, e.g., argon, and more preferably in flowing argon gas at or about at atmospheric pressure. The gas can flow from about 1,200 cc/min to about 200 cc/min, from about 800 cc/min to about 400 cc/min, and at about 500 cc/min, as well as, all values within the range of these flows. Preferably, an initial vacuum evacuation of the processing furnace is completed to a reduced pressure at least below 1E-3 Torr and re-pressurized to greater than or equal to 100 Torr with inert gas, e.g., Argon. More preferably, the vacuum evacuation is completed to a pressure below 1E-5 Torr prior to re-pressurizing with inert gas. The vacuum evacuation process can be completed anywhere from zero to >4 times before proceeding. Most preferably, for high purity materials, the furnace, containers, handling equipment, and other components of the curing apparatus are clean, essentially free from, free from and do not contribute any elements or materials, that would be considered impurities or contaminants, to the cured material.

The pyrolysis may be conducted in any heating apparatus, that maintains the request temperature and environmental controls. Thus, for example pyrolysis may be done with, pressure furnaces, box furnaces, tube furnaces, crystal-growth furnaces, graphite box furnaces, arc melt furnaces, induction furnaces, kilns, $MoSi_2$ heating element furnaces, carbon furnaces, vacuum furnaces, gas fired furnaces, electric furnaces, direct heating, indirect heating, fluidized beds, RF furnaces, kilns, tunnel kilns, box kilns, shuttle kilns, coking type apparatus, lasers, microwaves, other electromagnetic radiation, and combinations and variations of these and other heating apparatus and systems that can obtain the request temperatures for pyrolysis.

In embodiments were low N and O levels are required, the use of a vacuum, preferably a turbopump, to achieve 10E-6 Torr and backfilling with inert gas is preferable. This purging process can be done once, or multiple times, to achieve low levels. A constant flow rate of "sweeping" gas can help purge the furnace during volatile generation.

Preferably, in making SiC, the ceramic SiOC is converted to SiC in subsequent or continued pyrolysis or conversion steps. The conversion step from SiOC may be a part of, e.g., continuous with, the pyrolysis of the SiOC preform, or it may be an entirely separate step in time, location and both. Depending upon the type of SiC desired the convention step can be carried out from about 1,200° C. to about 2,550° C. and from about 1,300° C. to 1,700° C., as well as, all values within the range of these temperatures. Generally, at temperatures from about 1,600° C. to 1900° C., the formation of beta types is favored over time. At temperatures above 1900° C., the formation of alpha types is favored over time. Preferably the conversion takes place in an inert gas, e.g., argon, and more preferably in flowing argon gas at or about at atmospheric pressure. The gas can flow from about 600 cc/min to about 10 cc/min, from about 300 cc/min to about 50 cc/min, and at about 80 cc/min to about 40 cc/min, as well as, all values within the range of these flows. Most preferably, for high purity materials, the furnace, containers, handling equipment, and other components of the curing apparatus are clean, essentially free from, and do not contribute any elements or materials, that would be considered impurities or contaminants, to the SiC.

The subsequent yields for SiOC derived SiC are generally from about 10% to 50%, typically from 30% to 40%, although higher and lower ranges may be obtained, as well as, all values within the ranges of these percentages.

Most preferably, when making high purity SiC, the activities associated with making, curing, pyrolizing and converting the material are conducted in, under, clean room conditions, e.g., under an ISO 14644-1 clean room standard of at least ISO 5, of at least ISO 4, of at least ISO 3, of at least ISO 2, and at least ISO 1. In an embodiment the material handling steps are conducted in the cleanroom of at least ISO 5, while a less clean area (ISO>5) is used for the pyrolysis and conversion steps.

The volumetric shapes of SiC or SiOC and ultra pure SiC or SiOC can be any predetermined volumetric shape, including by way of example, spheres, pucks, pellets, rings, lenses, disks, panels, cones, frustoconical shapes, squares, rectangles, trusses, angles, channels, hollow sealed chambers, hollow spheres, blocks, sheets, coatings, films, skins, particulates, beams, rods, angles, slabs, columns, fibers, staple fibers, tubes, cups, pipes, and combinations and various of these and other more complex shapes, both engineering and architectural.

In making the volumetric shape, the amount of binder added to the SiC can vary from a light coating of the SiC particles to a sufficient amount to form a paste like slurry. Thus, depending on the forming apparatus requirements, the strength requirements of the volumetric shape, and the binder itself, from about 0.1% to about 65%, from about 0.1% to about 45%, from about 0.5% to about 40%, from about 20% to about 40%, from about 1% to about 15%, and from about 2% to about 7%, about 1% and more, about 2% and more, and about 3% and more binder is added to the SiC to form the slurry or blend, as well as, all amounts within the ranges of these percentages. Depending upon the amount of binder lost during curing this can result in volumetric shapes having from about 0.05% to about 25%, from about 0.75% to about 12%, from 1% to about 5%, about 1% and more, about 2% and more, about 4% and more, about 6% and more cured binder in the volumetric shape, as well as, all amounts within the ranges of these percentages.

The size of the SiC granules that are mixed with the binder to form the volumetric shape can be from about 0.1 μm (micron) to about 100 μm, about 0.5 μm to about 50 μm, about 0.3 μm to about 20 μm, about 0.3 μm to about 10 μm, and greater and smaller sizes, as well as combinations of different sizes and, as well as, all values within the ranges of these sizes. Thus the granules can have a primary particle $D_{50}$ size of from about 0.1 μm to about 20.0 μm, about 0.5 μm to about 10.0 μm, about 0.5 μm to about 2.0 μm, about 0.5 μm to about 1.0 μm about 1 μm to about 5 μm, about 1 μm, about 2 μm, about 3 μm, and greater and smaller $D_{50}$ sizes, as well as, all values within the ranges of these sizes.

The binders may be any binder used to hold the SiC in the predetermined shape during processing, curing and later use of the volumetric shape. Embodiments of the binders can preferably be oxygen free. Embodiments of the binders can preferably be made up of materials having only carbon and hydrogen. Embodiments of the binder can be made from materials having oxygen. Embodiments of the binder can be any sintering aid used for sintering SiC. Embodiments of the binder can be molten silica. Embodiments of the binders can be polysilocarb precursor materials, including all of the liquid precursors set forth in this specification. Combinations and variations of these and other materials may also be used as binders.

The binders can be cured, to the extent required, under the conditions used for curing the polysilocarb precursors, or under the conditions needed to transform the binder into a hard (e.g., tough) enough material to maintain the shape of the volumetric shape. Thus, the curing, hardening, forming, or setting up, as the case may be, should be done based upon the characteristics of the binder. Future consideration should be take to prevent the curing or hardening or setting up of the binder to introduce impurities or other undesired substances into the volumetric shape.

Examples of embodiments of binders that have no oxygen would include polyethylene, silicon metal, hydrocarbon waxes, polystyrene, and polypropylene and combinations and variations of these.

Examples of embodiments of binders that contain only carbon and hydrogen would include polyethylene, hydrocarbon waxes, carbon or graphite powders, carbon black, HDPE, LDPE, UHDPE, and PP and combinations and variations of these.

Examples of embodiments of binders that contain oxygen would include boric acid, boron oxide, silicon dioxide, polyalcohols, polylactic acids, cellulosic materials, sugars and saccharides, polyesters, epoxies, siloxanes, silicates, silanes, silsesquioxanes, acetates such as ethylvinylacetate (EVA), polyacrylates such as PMMA, and polymer-derived ceramic precursors and combinations and variations of these.

Examples of embodiments of binders that are sintering aids would include silicon, boron oxide, boric acid, boron carbide, silicon and carbon powders, silica, silicates and polymer-derived ceramic precursors and combinations and variations of these.

For pure and ultra pure SiC materials for use in applications such as growing boules and for making wafers, the binder material is preferable free from all materials that are considered to be contaminants. Thus, in embodiments the binder material is at least 5 nines, at least 6 nines, at least 7 nines, and at least 8 nines, pure, e.g., free from materials considered to be contaminants.

Preferably, the use of the binder adds no, and no detectable amounts of contaminants to the SiC or the SiOC. In an embodiment the binder also maintains proper stoichiometry of Si:C to maintain near a 1:1 ratio of silicon atoms to Carbon atoms after processing. In an embodiment the binder has a predetermined ratio of Si:C that is carbon rich, carbon starved, or stocheometric to provide the volumenteric shape with a predetermined SiC ratio.

For pure and ultra pure SiC applications and materials, the binder can preferably be cosmetic grade, electronics grade, and surgical grade materials.

Embodiments of binders, would include the precursor formulations, both catalyzed and uncatalyzed, as disclosed and taught in U.S. Pat. Nos. 9,499,677, 9,481,781 and US Patent Publication Nos. 2014/0274658, 2014/0323364, 2015/0175750, 2016/0207782, 2016/0280607, 2017/0050337, the entire disclosure of each of which are incorporated herein by reference. Methods of curing these binders are disclosed and taught in these patents and published applications, the entire disclosure of each of which are incorporated herein by reference.

In a preferred embodiment, the SiC volumetric shapes are made using polymer derived, and preferably polysilocarb polymer derived SiC (e.g., as taught and disclosed US Publ. No. 2016/0207782, which is incorporated herein by reference), and polysilocarb binders. In an embodiment the SiC is from conventional sources. This embodiment is less preferred as the convention SiC is believed to have different structures, e.g., morphology and surface properties, which result in poorer performance, in applications such as vapor deposition, than polymer derived SiC. In embodiments, the volumetric shapes are a mixture of polymer derived SiC and conventional SiC.

In an embodiment the binder is used to provide conductivity to the tablet, bead or volumetric shape. Thus, the binder can be carbon, silicon, or can in situ decompose into a conductive species such as carbon—examples include a polysaccharide, PE, hydrocarbon oils and waxes, etc. or polysilocarb formulations that have large carbon excesses and are thus far from achieving Si:C stoichiometry and instead in-situ form C—SiC composites, or can have carbon and silicon added to it. In this manner the volumetric shapes, e.g., discs, pucks, pellets, beads, tablets, pills, etc., having resistivities lower than 10,000 ohm-cm at 20° C., lower than 8,000 ohm-cm at 20° C., lower than 5,000 ohm-cm at 20° C., and lower than 2,000 ohm-cm at 20° C., as well as, all values within the range of these resistivities.

Generally, in an embodiment the binder material completely volatize under 700° C., completely volatize under 600° C., and completely volatize under 500° C., as well as, all values within the range of these temperatures. When using different types of PDCs as the binder material, the volatilization ranges may vary, and thus temperature ranges for the volatilization of the binder can range from about 900° C. to about 300° C., as well as, all values within the range of these temperatures. It is also preferable that the volatized components of the binder do not deposit out on, or otherwise form on, foul or contaminate, the inner components of the apparatus that is being used to make a structure from the SiC, e.g., a vapor deposition device.

Preferred embodiments of a binder material for use with ultra pure SiC to form a volumetric shape, e.g., tablet, disc, puck, pill, pellet, bead, having a resistivity lower than 8,000 ohm-cm at 20° C., and a purity (of the volumetric shape) of at least about 5-nines, is Silicon metal, carbon powder, hydrocarbon waxes, pure polyethylene, and distillable compounds containing primarily Silicon and Carbon and Hydrogen and polymer-derived ceramic precursors and combinations and variations of these.

Apparatus and processes for forming the volumetric shapes would include, for example, cold press, cold isostatic press, hot press, hot isostatic press, extruder, die casting, and molding processes and combinations and variations of these.

In embodiments utilizing directed flux, refluxing, fractional distillation or fractional sublimation and other embodiments where the predetermined shapes are to retain their structural integrity during most, and preferably the entirety, of the growth cycle, the binder must be such that it does not sublimate or otherwise lose the ability to maintain the structural integrity of the volumetric shape. Examples of these types of binders would include PDC precursors as binders. A preferred embodiment for maintaining the structural integrity of the volumetric shape, for example to function as are reflux structure, would be 10%-15% weight pure PDC precursor materials.

The ability to start with a liquid material, e.g., the precursor batch, having essentially all of the building blocks, e.g., Si and C, needed to make SiC provides a significant advantage in controlling impurities, contamination, and in making high purity SiOC, which in turn can be converted to high purity SiC, or which can be made directly in a single combined process or step. It is also theorized, in part based upon the performance of the present polymer derived SiC in vapor deposition apparatus and in growing boules, that the polymer derived SiC is significantly different from non-polymer derived SiC. Thus, synergistic benefits in boule growth and purity, wafer yield and device yield, further arise from the individual benefits of the present inventions of bulk density, particle size, phase of SiC (beta vs alpha), stoichiometry, oxygen content (very low to none, and lack of oxide layer), high and ultra high purity.

Thus, embodiments of the present inventions provide for the use of SiOC and SiOC volumetric shapes that are at least about 99.9% (3-nines), at least about 99.99% (4-nines), at least about 99.999% (5-nines), and least about 99.9999% (6-nines) and at least about 99.99999% (7-nines) or greater purity, as well as, all values within the range of these purities. Similarly, embodiments of the present inventions provide for the use of SiC and SiC volumetric shapes that are at least about 99.9% (3-nines), at least about 99.99% (4-nines), at least about 99.999% (5-nines), and least about 99.9999% (6-nines) and at least about 99.99999% (7-nines) or greater purity, as well as, all values within the range of these purities. These purity values are based upon the amount of SiOC, or SiC, as the case may be, verse all materials that are present or contained within a given sample of SiOC or SiC product. As used herein SiOC or SiC product, would refer to the powder SiOC or SiC, as well as, the volumetric shapes of these materials. Embodiments of the volumetric shapes of SiC and SiOC, with appropriate binder selection have the same purity levels.

It is also noted that lower purity levels of the volumetric shape may be acceptable, if the contaminants are volatilized (or otherwise removed) in a manner that does not adversely affect the use of the SiC and SiOC in its intended manufacturing process, or end use; and does not adversely affect the end product that is being made from the SiC and SiOC starting materials. Thus, for example, a 4-nines pure disc of SiC, where the SiC is 7-nines pure, and the binder, which lowers the overall purity of the disc, is removed prior to the disc reaching 700° C. in the boule forming vapor deposition process may be acceptable. Additionally, impurities that are too heavy (higher AMU) may be trapped within the puck, and thus, be mitigated.

In embodiments of the present inventions the high purity SiC volumetric shapes have low, very and low and below detection limits, amounts of materials that cause significant problems, or are viewed as impurities, in the later processing and manufacture of items, for example, boules, wafers, electronic components, optical components and other SiC based intermediate and end products.

Thus, polymer derived high purity SiC, and in particular polysilocarb derived high purity SiOC, as well as, the high purity SiC that the SiOC is converted into, has a purity of at least about 99.9%, at least about 99.99%, at least about 99.999%, and least about 99.9999% and at least about 99.99999% or greater. Further, it is noted that embodiments of the present invention include polymer derived SiC, and SiOC, of any purity level, including lower levels of purity, such as 99.0%, 95%, 90% and lower. It is believe that these lower, e.g., non-high, purity embodiments have, and will find, substantial uses and applications. Similarly, it is believed that embodiments of the high purity SiC will find applications, uses, and provide new and surprising benefits to applications that prior to the present inventions were restricted to Si or materials other than SiC. Embodiments of the volumetric shapes of SiC, with appropriate binder selection, have the same purity levels.

Embodiments of the present inventions include the use of high purity SiC in making wafers for applications in electronics and semiconductor applications. In both the vapor deposition apparatus and processes to create the boules and wafers for later use, high purity SiC is required. In particular, as set forth in Table 1, embodiments of high purity SiC can preferably have low levels of one, more than one, and all elements in Table 1, which in certain vapor deposition apparatus, electronics applications, and semiconductor applications are considered to be impurities. Thus, embodiments of SiC particles and volumetric shapes can be free of impurities, substantially free of impurities, and contain some but have no more than the amounts, and combinations of amounts, set out in Table 1.

TABLE 1

| Element | less than ppm | less than ppm | less than ppm | less than ppm | less than ppm |
| --- | --- | --- | --- | --- | --- |
| Al | 1,000 | 100 | 10 | 1 | 0.1 |
| Fe | 1,000 | 100 | 10 | 1 | 0.1 |
| B | 1,000 | 100 | 10 | 1 | 0.1 |
| P | 1,000 | 100 | 10 | 1 | 0.1 |
| Pt | 1,000 | 100 | 10 | 1 | 0.1 |
| Ca | 1,000 | 100 | 10 | 1 | 0.1 |
| Mg | 1,000 | 100 | 10 | 1 | 0.1 |
| Li | 1,000 | 100 | 10 | 1 | 0.1 |
| Na | 1,000 | 100 | 10 | 1 | 0.1 |
| Ni | 1,000 | 100 | 10 | 1 | 0.1 |
| V | 1,000 | 100 | 10 | 1 | 0.1 |
| Ti | 1,000 | 100 | 10 | 1 | 0.1 |
| Ce | 1,000 | 100 | 10 | 1 | 0.1 |
| Cr | 1,000 | 100 | 10 | 1 | 0.1 |
| S | 1,000 | 100 | 10 | 1 | 0.1 |
| As | 1,000 | 100 | 10 | 1 | 0.1 |
| Total of one or more of the above | 3,000 | 500 | 50 | 10 | 1 |

In an embodiment, Pr may also be considered an impurity in some applications, and if so considered, the limits and amounts of Table 1 may be applicable to Pr.

Unless specified otherwise, as used herein, when reference is made to purity levels, high purity, % purity, % impurities, and similar such terms, excess carbon, i.e., beyond stoichiometric SiC, is not included, referenced to, considered, or used in the calculations or characterization of the material. In some applications excess carbon may have little to no effect on the application or product, and thus, would not be considered an impurity. In other applications excess carbon may be beneficial, e.g., carbon can act as a sintering aid; excess carbon can be used to address and compensate for irregularities in vapor deposition apparatus and processes, and can be used to control or effect the vapor deposition processes.

In applications where nitrogen is viewed as a contaminate, embodiments of polysilocarb derived SiC and SiOC can have less than about 10,000 ppm, less than 1000 ppm, less than about 100 ppm, less than about 10 ppm, less than about 1 ppm and less than about 0.1 ppm nitrogen, and lower, and from about 1000 ppm to about 0.01 ppm nitrogen, from about 100 ppm to about 0.001 ppm nitrogen. Embodiments of the volumetric shapes of SiC have the same purity levels.

In an embodiment of the polysilocarb derived SiC it is essentially free from, and free from the presence of oxygen, in any form, either bound to Si or C or as an oxide layer. Thus, embodiments of polysilocarb derived SiC and volumetric shapes of the SiC can have less than about 10,000 ppm, less than 1000 ppm, less than about 100 ppm, less than about 10 ppm, less than about 1 ppm, and less than about 0.1 ppm oxygen, and lower, and from about 1000 ppm to about 0.01 ppm oxygen, from about 100 ppm to about 0.001 ppm oxygen. The polysilocarb derived SiC has the ability to resist, and does not form an oxide layer when exposed to air under standard temperatures and pressures. The absence of an oxide layer, i.e., oxide layer free SiC, under when stored under ambient conditions provides advantages in later manufacturing processes, where oxide layers can be viewed as an impurity, or otherwise a detriment to the manufacturing process. Embodiments of the volumetric shapes of SiC have the same purity levels.

Embodiment of the present polysilocarb SiC, and the SiC boules, wafers and other structures that are made from the polysilocarb derived SiC, exhibit polymorphism, and generally a one dimensional polymorphism referred to as polytypism. Thus, polysilocarb derived SiC can be present in many, theoretically infinite, different polytypes. As used herein, unless expressly provided otherwise, the term polytypism, polytypes and similar such terms should be given their broadest possible meaning, and would include the various different frames, structures, or arrangements by which silicon carbide tetrahedrons (SiC$_4$) are configured. Generally, these polytypes fall into two categories—alpha ($\alpha$) and beta ($\beta$).

Embodiments of the alpha category of polysilocarb derived SiC typically contains hexagonal (H), rhombohedral (R), trigonal (T) structures and may contain combinations of these. The beta category typically contains a cubic (C) or zincblende structure. Thus, for example, polytypes of polysilocarb derived silicon carbide would include: 3C—SiC ($\beta$-SiC or $\beta$ 3C—SiC), which has a stacking sequence of ABCABC . . . ; 2H—SiC, which has a stacking sequence of ABAB . . . ; 4H—SiC, which has a stacking sequence of ABCBABCB . . . ; and 6H—SiC (a common form of alpha silicon carbide, $\alpha$ 6H—SiC), which has a stacking sequence of ABCACBABCACB . . . . Examples, of other forms of alpha silicon carbide would include 8H, 10H, 16H, 18H, 19H, 15R, 21R, 24H, 33R, 39R, 27R, 48H, and 51R.

Embodiments of polysilocarb derived SiC may be polycrystalline or single (mono-) crystalline. Generally, in polycrystalline materials there are present grain boundaries as the interface between two grains, or crystallites of the materials. These grain boundaries can be between the same polytype having different orientations, or between different polytypes, having the same or different orientations, and combinations and variations of these. Mono-crystalline structures are made up of a single polytype and have essentially no grain boundaries.

Embodiments of the present methods result in boules, preferable single crystal boules of SiC. These boules can have lengths from about ½ inch to about 5 inches, about ½ inch to about 3 inches, about 1 inch to about 2 inches, greater than about ½ inch, greater than about 1 inch and greater than about 2 inches. Larger and smaller sizes, as well as, all values within the range of these sizes, are contemplated. The boules can have cross sections, e.g., diameters, of from about ½ inch to about 9 inches, from about 2 inches to about 8 inches, from about 1 inch to about 6 inches, greater than about 1 inch, greater than about 2 inches, greater than about 4 inches, about 4 inches, about 6 inches and about 8 inches about 12 inches and about 18 inches. Other sizes, as well as, all values within the range of these sizes, are contemplated.

In general, the process for making electronic components from SiC boules involves cutting the SiC single crystalline boule into a thin wafer. The wafer has the diameter of the boule and typically has a thickness of about 100 $\mu$m to about 500 $\mu$m. The wafers are then polished, on one or both sides. The polished wafer are then used as substrates for the fabricated of microelectronic semiconductor devices. Thus, the wafer serves as a substrate for microelectronic devices that are built in the wafer, built over the wafer or both. The fabrication of these microelectronic devices includes micro-fabrication processing steps, such as, epitaxial growth, doping or ion implantation, etching, deposition of various materials, and photolithographic patterning, to name a few. Once fabricated from the wafer, the wafer, and thus the individual microcircuits, is separated, in a processes know as dicing, into individual semiconductors devices. These devices are then used in the making of, e.g., incorporated into, various larger semiconductor and electronic devices.

Embodiments of the present methods and resultant SiC wafers include, among others, about 2-inch diameter wafers and smaller, about 3-inch diameter wafers, about 4-inch diameter wafers, about 5-inch diameter wafers, about 6-inch diameter wafers, about 7-inch diameter wafers, about 12-inch diameter wafers and potentially larger, wafers having diameters from about 2 inches to about 8 inches, wafers having diameters from about 4 inches to about 6 inches, square shaped, round shaped, and other shapes, surface area per side of about 1 square inch, about 4 square inches, about 8 square inches, about 10 square inches, about 12 square inches, about 30 square inches, about 50 square inches, and larger and smaller, a thickness of about 100 $\mu$m, a thickness of about 200 $\mu$m, a thickness of about 300 $\mu$m, a thickness of about 500 $\mu$m, a thickness of about 700 $\mu$m, a thickness from about 50 $\mu$m to about 800 $\mu$m, a thickness from about 100 $\mu$m to about 700 $\mu$m, a thickness from about 100 $\mu$m to about 400 $\mu$m, a thickness from about 100 $\mu$m to about 300 $\mu$m, a thickness from about 100 $\mu$m to about 200 $\mu$m and larger and smaller thickness, and combinations and variations of these, as well as, all values within the range of these dimensions.

Embodiments of the present methods and resultant cut and polished wafers may also include being used to initiate the growth of a boule, (i.e. as the "seed") from which the rest of the grown boule matches the structure. The wafer, or seed, can be, among others, about 2-inch diameter wafers and smaller, about 3-inch diameter wafers, about 4-inch diameter wafers, about 5-inch diameter wafers, about 6-inch diameter wafers, about 7-inch diameter wafers, about 12-inch diameter wafers and potentially larger, wafers having diameters from about 2 inches to about 8 inches, wafers having diameters from about 4 inches to about 6 inches, square shaped, round shaped, and other shapes, surface area per side of about 4 square inches, about 8 square inches, about 12 square inches, about 30 square inches, about 50 square inches, and larger and smaller, a thickness of about 100 μm, a thickness of about 200 μm, a thickness of about 300 μm, a thickness of about 500 μm, a thickness of about 1500 μm, a thickness of about 2500 μm, a thickness from about 50 μm to about 2000 μm, a thickness from about 500 μm to about 1800 μm, a thickness from about 800 μm to about 1500 μm, a thickness from about 500 μm to about 1200 μm, a thickness from about 200 μm to about 2000 μm, a thickness from about 50 μm to about 2500 μm, and larger and smaller thickness, and combinations and variations of these, as well as, all values within the range of these dimensions.

Embodiments of the present SiC boules, SiC wafers, and the microelectronics fabricated from those wafers, find applications and utilizations in among other things, diodes, broad band amplifiers, military communications, radar, telecom, data link and tactical data links, satcom and point-to-point radio power electronics, LEDs, lasers, lighting and sensors. Additionally, these embodiments can find applications and uses in transistors, such High-electron-mobility transisitors (HEMT), including HEMT-based monolithic microwave integrated circuit (MMIC). These transistors can employ a distributed (traveling-wave) amplifier design approach, and with SiC's greater band gap, enabling extremely wide bandwidths to be achieved in a small footprint. Thus, embodiments of the present inventions would include these devices and articles that are made from or otherwise based upon the present methods, vapor deposition techniques, and polymer derived SiC, SiC boules, SiC wafers and the microelectronics fabricated from these wafers.

Embodiments of polysilocarb derived SiC, in particular high purity SiC, have many unique properties that, among other things, make them advantageous and desirable for use in the electronics, solar, and power transmission industries and applications. They can function as a semiconductor material that is very stable, and suitable for several demanding applications, including high power, high-frequency, high-temperature, and corrosive environments and uses. Polymer derived SiC is a very hard material with a Young's modulus of 424 GPa. It is essentially chemically inert, and will not react with any materials at room temperature.

Embodiments of the present inventions have the ability to provide, and are, high purity SiOC and SiC in the form of volumetric structures, e.g., pucks, briquettes, bricks, blocks, tablets, pills, plates, discs, squares, balls, rods, random shapes, etc. These volumetric shapes have a wide range of sizes, generally, greater than or equal to 1/32 in$^3$ (inches$^3$), greater than or equal to 1/16 in$^3$, greater than or equal to 1/8 in$^3$, greater than or equal to 1/4 in$^3$, from about 1/16 in$^3$ to about 1 ft$^3$, although larger and smaller volumes are contemplated, as well as, all values within the range of these dimensions. Embodiments of the volumetric structures can be hard, structurally solid, or soft, and crumbly. For discs, plates, pills, and other more generally planar like volumetric structures, the area of the largest surface (i.e., width, not the thickness) can be greater than or equal to about 1/32 in$^2$, greater than or equal to about 1/16 in$^2$, greater than or equal to about 1/8 in$^2$, greater than or equal to about 1/4 in$^2$, greater than or equal to about 1/2 in$^2$, greater than or equal to about 1 in$^2$, and greater than or equal to about 2 in$^2$, and from about 1/4 in$^2$ to about 3 in$^2$, about 1/2 in$^2$ to about 4 in$^2$ and about 1/8 in$^2$ to about 3/4 in$^2$. These planar type volumetric shapes can have thickness of less than 1/64 in, less than 1/32, less than 1/2 in, from about 1/16 in to about 3/4 in, from about 1/8 of an inch to about 1/2 in, and greater than or equal to 1/8 in, greater than or equal to 1/4 in, and combinations and variations of these, as well as, all values within the range of these dimensions.

In a preferred embodiment, the volumetric shapes have a strength suitable for use, e.g., the capability to survive handling, and remain structurally intact, so that they can be shipped, un-packaged, and loaded into a vapor deposition apparatus for growing boules. Depending upon the binder used, or other joining processes these volumetric shapes can also have considerably greater strength.

Embodiment of the SiC volumetric structures can have an an elastic modules of about 100 kPa to about 100 MPa, about 500 kPa to about 500 Mpa, about 100 kPa to about 1 GPa, about 50 kPa to about 300 GPa, and greater and smaller values, and combinations and variations of these, as well as, all values within the range of these properties.

Embodiment of the SiC volumetric structures can have a hardness of about 10 Kg/mm$^2$ to about 2,500 Kg/mm$^2$, about 10 Kg/mm$^2$ to about 1,500 Kg/mm$^2$, about 100 Kg/mm$^2$ to about 2,000 Kg/mm$^2$, about 150 Kg/mm$^2$ to about 1,000 Kg/mm$^2$, about 300 Kg/mm$^2$ to about 1,750 Kg/mm$^2$, and greater and smaller values, and combinations and variations of these, as well as, all values within the range of these properties.

Embodiments of the SiC volumetric structures can have stiffness of from about 5 kPa to about 15 MPa, from about 10 kPa to about 10 MPa, from about 100 kPa to about 1 MPa, and greater than or equal to about 10 kPa, greater than or equal to about 100 kPa, and greater than or equal to about 1 MPa, and larger and smaller values, and combinations and variations of these, as well as, all values within the range of these properties.

Embodiments of the SiC volumetric structures can have compressive strengths of from about 1 MPa to about 3.5 GPa, about 10 MPa to about 2.5 GPa, about 50 MPa to about 1 GPa, about 50 MPa to about 750 MPa, about 100 MPa to about 2 GPa, about 200 MPa to about 800 MPa, and larger and smaller values, and combinations and variations of these, as well as, all values within the range of these properties.

In embodiment of these structures, which can be viewed as higher strength embodiments, these SiC volumetric structures can have: an elastic modulus of less than about 200 MPa, less than about 150 MPa, less than about 75 MPa, and less than about 10 MPa and smaller; a hardness of less than about 1,400 Kg/mm$^2$, less than about 800 Kg/mm$^2$, less than about 400 Kg/mm$^2$, less than about 100 Kg/mm$^2$ and smaller; and, compressive strength of less than about 1,850 MPa, of less than about 1,000 MPa of less than about 750 MPa, of less than about 200 MPa, of less than about 50 MPa, and smaller, and combinations and variations of these, as well as, all values within the range of these properties.

These SiC volumetric structures can have: an elastic modulus of greater than or equal to about 100 MPa, greater than or equal to about 200 MPa, and greater than or equal to 300 MPa; a hardness of greater than or equal to about 700 Kg/mm$^2$, greater than or equal to about 1,000 Kg/mm$^2$, and greater than or equal to about 2,000 Kg/mm$^2$; and, compressive strength of greater than or equal to about 50 MPa, of greater than or equal to about 200 MPa, and of greater than or equal to about 500 MPa, and combinations and variations of these, as well as, all values within the range of these properties.

In embodiments of these volumetric structures, which can be viewed as having lower strength, these embodiments can have lower or lesser stiffness values. For example stiffnesses down to 10 MPa or less. In an embodiment of this lower strength structures, hydrocarbon waxes for example may used and provide considerably less stiffness than for example a ceramic binder.

In general, in some embodiments these SiC volumetric shapes are weaker than their underlying SiC material that makes up their structure, and which has reported values of elastic modulus of about 410 GPa, hardness of about 2,800 Kg/mm$^2$ and compressive strength of about 3,900 MPa, and combinations and variations of these, as well as, all values within the range of these properties. The actual density of the SiC, measured by Helium Pycnometry, is from about 3.0 to 3.5 g/cc, or about 3.1 to 3.4 g/cc, or about 3.2 to 3.3 g/cc, and combinations and variations of these, as well as, all values within the range of these properties. The apparent density, or specific gravity, for embodiments of volumetric shapes of SiC, e.g., pellets, pills, etc., may be significantly lower.

In an embodiment the mass of the volumetric shape of SiC preferably, and typically, has an apparent density that is lower, than its SiC actual density, e.g., actual density of an SiC granule should be about 3.1 g/cc to 3.3 g/cc. The apparent density for the volumetric shape (e.g. a puck, pellet, cube, ball, bead, disk or plate) can be less than about 3 g/cc, less than about 2 g/cc. less than about 1 g/cc and lower, and can be from about 0.5 g/cc to about 1.8 g/cc, about 0.4 g/cc to about 2 g/cc. The bulk density for particles of the SiC can be less than about 3.0 g/cc, less than about 2.0 g/cc, less than about 1 g/cc, and from about 0.1 g/cc to about 2 g/cc, 0.5 g/cc to about 1.5 g/cc. Greater and lower apparent densities and bulk densities are also contemplated. Moreover, specific, i.e., predetermined and precise, apparent densities for a volumetric shapes of polymer derived SiC can be provided to match, and preferably enhance and more preferable optimize, later manufacturing processes. For example, in PVT wafer making, the volumetric shapes of SiC granules can have an apparent density that is specifically designed and tailored to match a specific PVT apparatus. In this manner, each PVT apparatus in a facility can have custom feed stock, which enables each apparatus' performance to be optimized by the use of the feed stock (e.g., the volumetric shapes of SiC) having predetermined and precise characteristics, such as shape, volume, weight, packing factor, bulk density, tap density, and apparent density.

In embodiments, the volumetric shapes of SiC can have a porosity built into the shape, that preferably is provided by, or in conjunction with the binder. This porosity is preferably open hole, or substantially open hole porosity. In this manner, the volumetric shape typically provides substantially greater available surface area than granular SiC, because the shape's structure includes pore surfaces that would not be present in a loose pile of SiC particles, e.g., where the granules are packed against one another. Thus, for example, if a discs of SiC were used in a vapor deposition process to make SiC boules (for subsequent conversion into SiC wafers), these SiC discs would provide substantially greater surface area from which to create SiC vapor, and substantially greater paths for movement of the SiC vapor, than could typically be obtained from using granular SiC in such a process. It is theorized that the increase surface area and the increased pathways, provides the ability to increase the rate of growth of the SiC boule, the quality of the SiC boule (and thus the subsequent wafers) and both of these. The SiC discs, e.g., the volumetric shape of SiC, may be easier to handle, measure, and use than the granular SiC material.

In embodiments the volumetric shape can be made from granules of SiC that were obtained by breaking apart a friable mass of SiC that was removed from the pyrolysis furnace. In this matter the granule size that is used to make the volumetric shape can be controlled. This also provides in some embodiments greater control over the binder addition and mixing process.

For an embodiment, the friable mass of SiC preferably, and typically, has an apparent density that is considerably lower, than its actual density, e.g., actual density should be about 3.2 g/cc. In generally, the granular SiC, which is obtained from crushing the friable mass, has an apparent and actual density that are essentially identical, e.g., about 3.1 to 3.3 g/cc.

The features of the high purity polysicocarb SiC provide several advantages and benefits for use in, e.g., as the Si and C source or starting material, vapor deposition processes, systems and apparatus, among other techniques for growing or creating a SiC mass, structure, article or volumetric shape. These features include: the ability to have high purity levels, a high purity levels, the ability to control particle size distribution (shape, size and both); predetermined particle size distribution; the ability to have volumetric shapes; predetermined volumetric shapes (e.g., pucks, pills, discs, etc.); the ability to have porosity and control porosity; predetermined porosity; the ability to control the amount of carbon; predetermined carbon amounts (both excess, i.e., greater than stoichiometric, starved, i.e., less than stoichiometric, and equal to, i.e., stoichiometric); and combinations and variations of these and other properties. While additional advantages for the present inventions may be seen, presently and by way of example, these advantages in vapor deposition processes would include shortening the time to grow the boule or other structure, longer run times before cleaning, the ability to optimize an apparatus, the ability to grow larger diameter boules or other structures, the ability to increase quality, the ability to reduce problematic areas, problematic regions or problematic occurrences (e.g., pipes, occlusions, imperfections) from the boule or other structure, reduced costs, greater control over the process, and combinations and variations of these.

In an embodiment, if dopants are required to be added to the material, they can be added by way of the precursor and thus be present in a controlled manner and amount for growth into a boule, or other structure. Embodiments of precursor formulations may have dopant, or complexes that carry and bind the dopant into the ceramic and then the converted SiC, so that upon vapor deposition process the dopant is available and in a usable form.

Additionally, dopants or other additives to provide custom or predetermined properties to wafers, layers and structures that are made from embodiments of the polymer derived SiC. In these embodiments, such property enhancing additives would not be considered impurities, as they are intended to be in, necessary to have in, the end product. The property enhancing additives can be incorporated into the liquid precursor materials. Depending on the nature of the property enhancing additive, it may be a part of the precursor back bone, it may be complexed, or part of a complex, to incorporate it into the liquid precursors, or it can be present in other forms that will enable it to survive (e.g., be in a form that lets it function as intended in the final material). The property enhancing additive can also be added as a coating to the SiC or SiOC powdered material, can be added as a vapor or gas during processing, or can be in powder form and mixed with the polymer derived SiC or SiOC particles, to name a few. In an embodiment the property enhancing additive comprises or is a part of the binder for the volumetric shape. In an embodiment the property enhancing additive can be a coating on the volumetric shape. Further, the form and manner in which the property enhancing additive is present, should preferably be such that it has minimal, and more preferably, no adverse effect on processing conditions, processing time, and quality of the end products. Thus, a polysilocarb derived SiC, or SiC volumetric shape, having greater than 5-nines purity, greater than 6-nines purity and greater than 7-nines purity can have amounts of a property enhancing additive present. These amounts can be from about 0.01% to about 50%, about 0.1% to about 5%, about 1% to about 10%, less than 25%, less than 20%, less than 10% and less than 1%, as well as greater and smaller amounts depending upon the additive and the predetermined properties it is intended to impart.

The use of ultra pure polymer derived SiC, the use of the present volumetric shapes of SiC, and the use of the present vapor deposition techniques, individually and collectively, provide superior quality, and reduce defects in the boules, wafers and semiconductors that are made from these ultra pure polymer derived materials when compared to boules and wafers made from other sources of SiC, i.e., non-polymer derived ceramic based SiC. While not being bound by the present theory, it is believed that the polymer derived ceramic processes used to obtain ultra pure SiC from liquid SiOC starting materials, e.g., polysilocarb precursors, provides starting raw material SiC that has different features, and morphology, from other sources of SiC, which differences permit the polymer derived ceramic material to preform significantly better in vapor deposition techniques than other sources of SiC. Further, it is believed that the present volumetric shapes and vapor deposition techniques provide the ability to further benefit from, and synergistically build upon, the benefits of the ultra pure polymer derived SiC. Moreover, when polymer derived ceramic SiC is used as a seed crystal it is believed that additional enhancements in boule and wafer qualities and efficiencies of manufacturing can be achieved over other SiC seed crystals.

Thus, it is believed and theorized that the benefits and improve features from the use of ultra pure polymer derived SiC, the use of the present volumetric shapes of SiC, and the use of the present vapor deposition techniques, individually and collectively, include enhancements and improvements, in at least one or more, and preferably all, of the following properties and features, and the reduction of at least one or more, and preferably all, of the following deleterious properties or effects (to the extent that they were present in a vapor deposition process using conventional SiC starting material):

Bow—a measure of concave or convex deformation of the median surface of a wafer, independent of any thickness variation which may be present. Bow is determined at the center point of the wafer with respect to a reference plane determined by three points equally spaced on a circle whose diameter is 6.35 mm less than the nominal wafer diameter. Bow is a bulk property of the wafer, not a property of an exposed surface. Generally, bow is determined with the wafer in a free, unclamped position. (Not to be confused with warp.)

Diameter—the linear distance across a circular silicon wafer which includes the wafer center and excludes any flats or other peripheral fiducial areas.

Edge contour—the cross sectional profile of a wafer edge shaped by grinding or etching. Edges may be either rounded or beveled.

Flatness—for wafer surfaces, the deviation of the front surface, expressed as TIR or maximum FPD, relative to a specified reference plane when the back surface of the wafer is ideally flat, as when pulled down by vacuum onto an ideally clean flat chuck. The flatness of a wafer may be described as: the global flatness; the maximum value of site flatness as measured on all sites; or the percentage of sites which have a site flatness equal to or less than a specified value.

Flatness quality area—that portion of the surface of a wafer over which the specified flatness values apply. The flatness quality area is most frequently defined with an edge exclusion area, a peripheral annulus usually 3 mm wide.

Focal plane—the plane perpendicular to the optical axis of an imaging system which contains the focal point of the imaging system.

Focal plane deviation (FPD)—the distance parallel to the optical axis from a point on the wafer surface to the focal plane. global flatness—the TIR or maximum FPD within the flatness quality area relative to a specified reference plane.

Maximum FPD—the largest of the absolute values of the focal plane deviations.

Primary flat—the flat of longest length which is oriented with respect to a specific crystallographic plane. Also known as major flat.

Reference plane—a plane specified by one of the following: three points at specified locations on the front surface of the wafer; the least squares fit to the front surface of the wafer using all points within the flatness quality area; the least squares fit to the front surface of the wafer using all points within a site; or an ideal back surface (equivalent to the ideally flat chuck surface that contacts the wafer).

Secondary flat(s)—the flat or flats of a length shorter than that of the primary flat whose angular position with respect to the primary flat identifies the conductivity type and orientation of the wafer. Also known as minor flat.

Site—a rectangular area, on the front surface of the wafer, whose sides are parallel with and perpendicular to the primary flat and whose center falls within the flatness quality area.

Site flatness—the TIR or maximum FPD of the portion of a site which falls within the flatness quality area.

Thickness—the distance through the wafer between corresponding points on the front and back surface.

Total indicator reading (TIR)—the smallest perpendicular distance between two planes, both parallel with the reference plane, which enclose all points within a specified flatness quality area or site on the front surface of a wafer.

Total thickness variation (TTV)—the difference between the maximum and minimum thickness values encountered during a scan pattern or a series of point measurements on a wafer.

Warp—the difference between the maximum and minimum distances of the median surface of the wafer from a reference plane encountered during a scan pattern. Warp is a bulk property of the wafer, not a property of an exposed surface. The median surface may contain regions with upward or downward curvature or both. Generally, warp is determined with the wafer in a free, unclamped position. (Not to be confused with bow.)

Utodoping—dopant, from sources other than the dopant intentionally added to the vapor phase, which is incorporated into an epitaxial layer during growth.

Autodoping barrier—a film or layer which impedes transport of impurity atoms from the back surface of a substrate to the epi layer during epitaxial deposition. Also known as backseal.

Conductivity type—defines the nature of the majority of the carriers in silicon: n-type material, in which electrons are the majority carrier, is formed when a donor dopant impurity is added to the silicon; p-type material, in which holes are the majority carrier, is formed when an acceptor dopant impurity is added to the silicon.

Crystal orientation—the crystallographic axis, on which the silicon crystal is grown.

Dislocation—a line imperfection in a crystal which forms the boundary between slipped and nonslipped regions of the crystal.

Dislocation density—the number of dislocation etch pits per unit area on an exposed wafer surface.

Dislocation etch pit—a sharply defined depression in the immediate region of a stressed or defective crystal lattice, resulting from preferential etching.

Dopant—a chemical element from the third (such as boron) or fifth (such as phosphorus or antimony) column of the periodic table, intentionally incorporated into a silicon crystal in trance amounts to establish its conductivity type and resistivity. P-Type Bor 0.001-50 ohmcm. N-Type Phosphorus 0.1-40 ohmcm Antimony 0,005-0,025 ohmcm Arsenic <0,005 ohmcm.

Extrinsic gettering—controlled damage or stress to the crystal lattice structure intentionally introduced by mechanical means or by deposition of a polysilicon or other film on the back surface of a silicon wafer.

Flat orientation (primary)—the crystallographic plane, which ideally coincides with the surface of the primary flat, The primary flat is usually a <110> plane.

Miller indices—the reciprocals of the intercepts of a crystallographic plane with the x-, y-, and z-axes, respectively. For example, the cube face perpendicular to the x-axis is the <100> plane. A family of planes is denoted by curly brackets; e.g., all cube faces are the <100> planes. Directions are denoted by Miller indices in square brackets; e.g., the x-axis is the <100> direction an the cube diagonal is the <111> direction. Families of directions are denoted by angular brackets; e.g., all cubic axes are the <100> directions. A negative direction is denoted by a minus sign over the index; e.g., the negative x-axis is the <$\bar{1}$00> direction.

Polycrystalline silicon (polisilicon, poly)—silicon made up of randomly oriented crystallites and containing large-angle grain boundaries, twin boundaries, or both.

Radial oxygen variation—the difference between the average oxygen concentration at one or more points symmetrically located on a silicon wafer and the oxygen concentration at the center of the wafer, expressed as a percent of the concentration at the center. Unless otherwise specified, the radial oxygen variation to be determined using the average of the oxygen concentrations at the two points 10 mm from the edge of the wafer. Radial oxygen variation is sometimes determined using the average of the oxygen concentrations at several symmetric points half way between the center and the edge of the wafer. Also known as oxygen gradient.

Radial resistivity variation—the difference between the average resistivity at one or more points symmetrically located on a silicon wafer and the resistivity at the center of the wafer, expressed as a percent of the resistivity at the center, Unless otherwise specified, the radial resistivity variation can be determined using the average resistivity of four points 6 mm from the edge of the wafer on two perpendicular diameters. Radial resistivity variation is sometimes determined using the average of the resistivity at the four point half way between the center and the edge of the wafer on the same diameters. Also known as resistivity gradient.

Resistivity (ohm·cm)—the ratio of the potential gradient (electric field) parallel with the current to the current density, In silicon, the resistivity is controlled by adding dopant impurities; lower resistivity is achieved by adding more dopant.

Slip—a process of plastic deformation in which one part of a crystal undergoes a shear displacement relative to another in a fashion which preserves the crystallinity of the silicon. After preferential etching, slip is evidenced by a pattern of one or more parallel straight lines of 10 or more dislocation etch pits per millimeter which do not necessarily to each other. On <111> surfaces, groups of lines are inclined at 60° to each other; on <100> surfaces, they are inclined at 90° to each other.

Stacking fault—a two-dimensional defect resulting from a deviation from the normal stacking sequence of atoms in a crystal. It may be present in the bulk crystal, grow during epitaxial deposition (usually as a result of a contaminated or structurally imperfect substrate surface); or develop during oxidation. On <111> surfaces, stacking faults are revealed by preferential etching either as closed or partial equilateral triangles. On <100> surfaces, stacking faults are revealed as closed or partial squares.

Striations—helical features on the surface of a silicon wafer associated with local variations in impurity concentration. Such variations are ascribed to periodic differences in dopant incorporation occurring at the rotating solid-liquid interface during crystal growth. Striations are visible to the unaided eye after preferential etching and appear to be continuous under 100× magnification.

Subsurface damage—residual crystallographic imperfections apparent only after preferential etching of the polished silicon surface. Such damage is usually considered to be caused by mechanical processing of the wafer.

Twinned crystal—a crystal in which the lattice consists of two parts related to each other in orientation as mirror images across a coherent planar interface known as the twinning plane or twin boundary, In silicon, this plane is a <111> plane. Also known as twin.

Wafer orientation—the crystallographic plane, described in terms of Miller indices, with which the surface of the wafer is ideally coincident. Generally, the surface of the wafer corresponds within a few degrees with the low index plane perpendicular to the growth axis. In such cases, the orientation may also be described in terms of the angular deviation a of the low-index crystallographic plane from the polished wafer surface.

Chip—region where material has been removed from the surface or edge of the wafer. The size of a chip is defined by its maximum radial depth and peripheral chord length as measured on an orthographic shadow projection of the specimen outline. Also known as clamshell, conchoidal fracture, edge chip, flake, nick, peripheral chip, peripheral indent, and surface chip.

Contamination—a broad category of foreign matter visible to the unaided eye on the wafer surface. In most cases, it is removable by gas blow off, detergent wash, or chemical action. See also particulate contamination, stain.

Crack—cleavage that extends to the surface of a wafer and which may or may not pass through the entire thickness of the wafer. Also known as fissure; see also fracture.

Cratering—a surface texture of irregular closed ridges with smooth central regions. crow's-foot—intersecting cracks in a pattern resembling a "crow's foot" (Y) on <111> surfaces and a cross (+) on <100> surfaces.

Dimple—a smooth surface depression, larger than 3 mm in diameter, on a wafer surface.

Fracture—a crack with single or multiple lines radiating from a point.

Groove—a shallow scratch with rounded edges, usually the remnant of a scratch not completely removed during polishing.

Haze—a cloudy or hazy appearance attributable to light scattering by concentrations of microscopic surface irregularities such as pits, mounds, small ridges or scratches, particles, etc.

Imbedded abrasive grains—abrasive particles mechanically forced into the surface of the silicon wafer. This type of contamination may occur during slicing, lapping, or polishing.

Indent—an edge defect that extends from the front surface to the back surface of the silicon wafer.

Light point defects (LPD)—individual fine points of reflected light seen when the wafer is illuminated by a narrow-beam light source held perpendicular to the wafer surface.

Mound—irregularly shaped projection with one or more facets. Mounds can be extensions of the bulk material or various forms of contamination, or both. A high density of mounds can also appear as haze.

Orange peel—a large-featured, roughened surface, similar to the skin of an orange, visible to the unaided eye under fluorescent light but not usually under narrow-beam illumination.

Particulate contamination—a form of contamination comprising particles, such as dust, lint, or other material resting on the surface of the wafer and standing out from the surface. May usually be blown off the surface with clean, dry nitrogen.

Pit—a depression in the surface where the sloped sides of the depression meet the wafer surface in a distinguishable manner (in contrast to the rounded sides of a dimple).

Saw blade defect—a roughened area visible after polishing with a pattern characteristic of the saw blade travel. It may be discernible before chemical polishing. Also known as saw mark.

Scratch—a shallow groove or cut below the established plane of the surface, with a length-to-width ratio greater than 5:1. A macroscratch is $=0.12$ μm in depth and is visible to the unaided eye under both incandescent (narrow-beam) and fluorescent illumination. A microscratch is <0.12 μm in depth and is not visible to the unaided eye under fluorescent illumination.

Spike—a tall, thin dendrite or crystalline filament which often occurs at the center of a recess in the surface of an epitaxial layer.

Stain—a form of contamination such as a streak, smudge, or spot which contains foreign chemical compounds such as organics or salts.

Threading Edge Dislocation (TED).
Threading Screw Dislocation (TSD).
Basal Plan Dislocation (BPD).
Micropipes.
Macro-Defects in Boules.
Carbon Inclusions.
Silicon Droplets.
Voids.

Wafers having the following features can be made with the polymer derived ultra pure SiC materials.

| Type | Description |
| --- | --- |
| 2" 6H N-Type | 6H—N 2" dia, Type/Dopant: N/Nitrogen Orientation: <0001> +/− 0.5 degree Thickness: 330 ± 25 um D Grade, MPDa100 cm−2 D Grade, RT: 0.02-0.2 Ω · cm Single face polished/Si face epi-ready with CMP, Surface Roughness: <0.5 nm |
| 2" 6H N-Type | 6H—N 2" dia, Type/Dopant: N/Nitrogen Orientation: <0001> +/− 0.5 degree Thickness: 330 ± 25 um B Grade, MPDa30 cm−2 B Grade, RT 0.02~0.2 Ω · cm Single face polished/Si face epi-ready with CMP, Surface Roughness: <0.5 nm |
| 2" 4H N-Type | 4H—N 2" dia, Type/Dopant: N/Nitrogen Orientation: <0001> +/− 0.5 degree Thickness: 330 ± 25 um D Grade, MPDa100 cm−2 D Grade: RT: 0.01-0.1 Ω · cm D Grade, Bow/Warp/TTV <25 um Single face polished/Si face epi-ready with CMP, Surface Roughness: <0.5 nm |
| 2" 4H N-Type | 4H—N 2" dia, Type/Dopant: N/Nitrogen Orientation: <0001> +/− 0.5 degree Thickness: 330 ± 25 um B Grade, MPDa30 cm−2 B Grade: RT: 0.01-0.1 Ω · cm B Grade, Bow/Warp/TTV <25 um Single face polished/Si face epi-ready with CMP, Surface Roughness: <0.5 nm |
| 3" 4H N-Type | 4H—N 3" dia, Type/Dopant: N/Nitrogen Orientation: 4 degree +/− 0.5 degree Thickness: 350 ± 25 um D Grade, MPDa100 cm−2 D Grade, RT: 0.01-0.1 Ω · cm D Grade, Bow/Warp/TTV <35 um Double face polished/Si face epi-ready with CMP, Surface Roughness: <0.5 nm |
| 3" 4H N-Type | 4H—N 3" dia, Type/Dopant: N/Nitrogen Orientation: 4 degree +/− 0.5 degree Thickness: 350 ± 25 um B Grade, MPDa30 cm−2 B Grade, RT: 0.01-0.1 Ω · cm B Grade, Bow/Warp/TTV <35 um Double face polished/Si face epi-ready with CMP, Surface Roughness: <0.5 nm |
| 3" 4H SI | 4H—SI 3" dia, Type/Dopant: Semi-insulating/V Orientation: <0001> +/− 0.5 degree Thickness: 350 ± 25 um D |

| Type | Description |
|---|---|
| | Grade, MPDa100 cm−2 D Grade, RT: 70% ≥1E5 Ω · cm Double face polished/Si face epi-ready with CMP, Surface Roughness: <0.5 nm |
| 3" 4H SI | 4H—SI 3" dia, Type/Dopant: Semi-insulating/V Orientation: <0001> +/− 0.5 degree Thickness: 350 ± 25 um B Grade, MPDa30 cm−2 B Grade, RT: 80% ≥1E5 Ω · cm Double face polished/Si face epi-ready with CMP, Surface Roughness: <0.5 nm |
| 2" 6H SI | 6H—SI 2" dia, Type/Dopant: Semi-insulating/V Orientation: <0001> +/− 0.5 degree Thickness: 330 ± 25 um D Grade, MPDa100 cm−2 D Grade, RT: 70% ≥1E5 Ω · cm Single face polished/Si face epi-ready with CMP, Surface Roughness: <0.5 nm |
| 2" 6H SI | 6H—SI 2" dia, Type/Dopant: Semi-insulating/V Orientation: <0001> +/− 0.5 degree Thickness: 330 ± 25 um B Grade, MPDa30 cm−2 B Grade, RT: 85% ≥1E5 Ω · cm Single face polished/Si face epi-ready with CMP, Surface Roughness: <0.5 nm |
| 4" 4H N-Type | 4H—N 4"dia.(100 mm ± 0.38 mm), Type/Dopant: N/ Nitrogen Orientation: 4.0° ± 0.5° Thickness: 350 μm ± 25 μm D Grade, MPDa100 cm−2 D Grade, 0.01~0.1 Ω · cm D Grade, TTV/Bow/ Warp <45 um Double face polished/Si face epi-ready with CMP, Surface Roughness: <0.5 nm |

SSP = Single Side Polished,
DSP = Double Side Polished,
E = Etched,
C = AsCut,
L = Lapped,
Und = Undoped (Intrinsic)

It is theorized that there could be additional embodiments for getting the SiC powder into a volumetric shape: using graphite parts or graphite foam as inserts in the growth chamber to force powder into a specific geometry (e.g., spacers); using water or other high purity volatile liquid to make a "wet sand" and use "sand-castle" molds to make shapes in the growth chamber—then gently evaporate the volatile liquid before growing the boule; permeable sacrificial molds made from porous carbon or porous SiC (e.g., a K-CUP made of compatible materials).

EXAMPLES

The following examples are provided to illustrate various embodiments of systems, processes, compositions, applications and materials of the present inventions. These examples are for illustrative purposes, may be prophetic, and should not be viewed as, and do not otherwise limit the scope of the present inventions. The percentages used in the examples, unless expressly provided otherwise, are weight percents of the total, e.g., formulation, mixture, product, or structure. The usage X/Y or XY indicates % of X and the % of Y in the formulation, unless expressly provided otherwise. The usage X/Y/Z or XYZ indicates the % of X, % of Y and % of Z in the formulation, unless expressly provided otherwise.

Example 1

A polysilocarb formulation using the mixing type method is formulated. The formulation is made by mixing together, at room temperature, 41% MHF and 59% TV. This precursor formulation has 0.68 moles of hydride, 0.68 moles of vinyl, and 1.37 moles of methyl. The precursor formulation has the following molar amounts of Si, C and O based upon 100 g of formulation.

| | Moles | Molar Ratio of Si, C, O (% of total moles in "Moles" Column) |
|---|---|---|
| Si | 1.37 | 25% |
| C | 2.74 | 50% |
| O | 1.37 | 25% |

As calculated, the SiOC derived from this formulation will have a calculated 1.37 moles of C after all CO has been removed, and has 0% excess C. This material is then pyrolized into a ceramic and further converted to SiC particles, that would be stoichiometric, and formed into a puck.

Example 2

A polysilocarb formulation using the mixing type method is formulated. The formulation is made by mixing together, at room temperature, 90% methyl terminated phenylethyl polysiloxane. (having 27% X) and 10% TV. This precursor formulation has 1.05 moles of hydride, 0.38 moles of vinyl, 0.26 moles of phenyl, and 1.17 moles of methyl. The precursor formulation has the following molar amounts of Si, C and O based upon 100 g of formulation.

| | Moles | Molar Ratio of Si, C, O (% of total moles in "Moles" Column) |
|---|---|---|
| Si | 1.17 | 20% |
| C | 3.47 | 60% |
| O | 1.17 | 20% |

As calculated, the SiOC derived from this formulation will have a calculated 2.31 moles of C after all CO has been removed, and has 98% excess C. This material is then pyrolized into a ceramic and further converted to SiC particles, that would have excess C, and formed into a puck.

Excess carbon in the starting material, and starting volumetric shape can be obtained by several embodiments. For example excess carbon can be obtained from formulations with residual excess C from a PDC route, such as with excess of C in the formulation (e.g., DCPD type formulation) should yield SiC and C as the equilibrium phases after full pyrolysis to >1600° C. In another embodiment excess C can be obtained by the addition of C-powder or C-containing species to the liquid PDC formulation prior to cure & pyrolysis. In another embodiment SiOC pigment, which has excess free C, can be added to the volumetric shape. Further, binders which decompose into C in the puck formation can be used. Also, C-containing powders in combination with binders to incorporate more C in the formulation.

Example 3

A polysilocarb formulation using the mixing type method is formulated. The formulation is made by mixing together at room temperature 70% methyl terminated phenylethyl polysiloxane (having 14% X) and 30% TV. This precursor formulation has 0.93 moles of hydride, 0.48 moles of vinyl, 0.13 moles of phenyl, and 1.28 moles of methyl. The precursor formulation has the following molar amounts of Si, C and O based upon 100 g of formulation.

|    | Moles | Molar Ratio of Si, C, O (% of total moles in "Moles" Column) |
|----|-------|-------|
| Si | 1.28  | 23%   |
| C  | 3.05  | 54%   |
| O  | 1.28  | 23%   |

As calculated, the SiOC derived from this formulation will have a calculated 1.77 moles of C after all CO has been removed, and has 38% excess C. This material is then pyrolized into a ceramic and further converted to SiC particles, that would have excess C, and formed into a puck. In some of these non-stochiometric formulations (i.e., Si:C molar ratio is not 1:1), having excess carbon, the actual density of the starting material will be <3.21 g/cc.

Example 4

A polysilocarb formulation using the mixing type method is formulated. The formulation is made by mixing together at room temperature 50% methyl terminated phenylethyl polysiloxane (having 20% X) and 50% TV. This precursor formulation has 0.67 moles of hydride, 0.68 moles of vinyl, 0.10 moles of phenyl, and 1.25 moles of methyl. The precursor formulation has the following molar amounts of Si, C and O based upon 100 g of formulation.

|    | Moles | Molar Ratio of Si, C, O (% of total moles in "Moles" Column) |
|----|-------|-------|
| Si | 1.25  | 22%   |
| C  | 3.18  | 56%   |
| O  | 1.25  | 22%   |

As calculated, the SiOC derived from this formulation will have a calculated 1.93 moles of C after all CO has been removed, and has 55% excess C. This material is then pyrolized into a ceramic and further converted to SiC particles, that would have excess C, and formed into a puck.

Example 5

A polysilocarb formulation using the mixing type method is formulated. The formulation is made by mixing together at room temperature 65% methyl terminated phenylethyl polysiloxane (having 40% X) and 35% TV. This precursor formulation has 0.65 moles of hydride, 0.66 moles of vinyl, 0.25 moles of phenyl, and 1.06 moles of methyl. The precursor formulation has the following molar amounts of Si, C and O based upon 100 g of formulation.

|    | Moles | Molar Ratio of Si, C, O (% of total moles in "Moles" Column) |
|----|-------|-------|
| Si | 1.06  | 18%   |
| C  | 3.87  | 54%   |
| O  | 1.06  | 28%   |

As calculated, the SiOC derived from this formulation will have a calculated 2.81 moles of C after all CO has been removed, and has 166% excess C. This material is then pyrolized into a ceramic and further converted to SiC particles, that would have excess C, and formed into a puck.

Example 6

A polysilocarb formulation using the mixing type method is formulated. The formulation is made by mixing together at room temperature 65% MHF and 35% dicyclopentadiene (DCPD). This precursor formulation has 1.08 moles of hydride, 0.53 moles of vinyl, 0.0 moles of phenyl, and 1.08 moles of methyl. The precursor formulation has the following molar amounts of Si, C and O based upon 100 g of formulation.

|    | Moles | Molar Ratio of Si, C, O (% of total moles in "Moles" Column) |
|----|-------|-------|
| Si | 1.08  | 18%   |
| C  | 3.73  | 64%   |
| O  | 1.08  | 18%   |

As calculated, the SiOC derived from this formulation will have a calculated 2.65 moles of C after all CO has been removed, and has 144% excess C. This material is then pyrolized into a ceramic and further converted to SiC particles, that would have excess C, and formed into a puck.

Example 7

A polysilocarb formulation using the mixing type method is formulated. The formulation is made by mixing together at room temperature 82% MHF and 18% dicyclopentadiene (DCPD). This precursor formulation has 1.37 moles of hydride, 0.27 moles of vinyl, 0.0 moles of phenyl, and 1.37 moles of methyl. The precursor formulation has the following molar amounts of Si, C and O based upon 100 g of formulation.

|  | Moles | Molar Ratio of Si, C, O (% of total moles in "Moles" Column) |
| --- | --- | --- |
| Si | 1.37 | 25% |
| C | 2.73 | 50% |
| O | 1.37 | 25% |

As calculated, the SiOC derived from this formulation will have a calculated 1.37 moles of C after all CO has been removed, and has 0% excess C. This material is then pyrolyzed into a ceramic and further converted to SiC particles, that would be stoichiometric, and formed into a puck.

Example 8

A polysilocarb formulation using the mixing type method is formulated. The formulation is made by mixing together at room temperature 46% MHF, 34% TV and 20% VT. This precursor formulation has 0.77 moles of hydride, 0.40 moles of vinyl, 0.0 moles of phenyl, and 1.43 moles of methyl. The precursor formulation has the following molar amounts of Si, C and O based upon 100 g of formulation.

|  | Moles | Molar Ratio of Si, C, O (% of total moles in "Moles" Column) |
| --- | --- | --- |
| Si | 1.43 | 30% |
| C | 1.95 | 40% |
| O | 1.43 | 30% |

As calculated, the SiOC derived from this formulation will have a calculated 0.53 moles of C after all CO has been removed, and has a 63% C deficit, or is 63% C starved. This material is then pyrolyzed into a ceramic and further converted to SiC particles, that would be C starved, and formed into a puck.

Si rich formulations can be obtained, for example, by having a starting material or starting puck, that is C-starved (e.g. SiOC ceramic that is derived from only MHF as its precursor material) with respect to the oxygen present and the silicon present. Depending on which is the limiting reagent during the vapor deposition process, the remaining is Si—C and C, the SiO$_2$+C will react to form SiC+C; or the SiO$_2$+C will react incompletely to form Si—O (which leaves the apparatus) and Si and SiC. In another embodiment the starting material or starting puck is formulated as SiC+Si powder+binder to make the shape. This will provide a Si rich starting material.

Example 9

A polysilocarb formulation using the mixing type method is formulated. The formulation is made by mixing together at room temperature 70% MHF, 20% TV and 10% VT. This precursor formulation has 1.17 moles of hydride, 0.23 moles of vinyl, 0.0 moles of phenyl, and 1.53 moles of methyl. The precursor formulation has the following molar amounts of Si, C and O based upon 100 g of formulation.

|  | Moles | Molar Ratio of Si, C, O (% of total moles in "Moles" Column) |
| --- | --- | --- |
| Si | 1.53 | 31% |
| C | 1.87 | 38% |
| O | 1.53 | 31% |

As calculated, the SiOC derived from this formulation will have a calculated 0.33 moles of C after all CO has been removed, and has a 78% C deficit, or is 78% C starved. This material is then pyrolyzed into a ceramic and further converted to SiC particles, that would be C starved, and formed into a puck.

Example 10

About 100 grams of a polysilocarb formulation is made. The formulation is blended at room temperature for 15 minutes and then 1% catalyst is added and the mixture is stirred for another 10 minutes. The catalyst has 10 ppm Pt in a short chain vinyl terminated polysiloxane.

The formulation is poured into a Teflon (PTFE, polytetrafluoroethylene)-coated aluminum foil pan and cured for 2.5 hours at 90° C. in argon or air.

The cured polymer is mechanically broken into sizes that fit into ceramic boats (e.g., crucibles that are 3.5" long×2.5" wide×⅝" deep); and is placed in those ceramic boats. The ceramic boats containing the cured polymer are heated in a stainless steel retort filled with argon gas flowing at 500 cc/min as follows:

room temp to 82.2° C. at a heating rate of 82.2° C./hr, with a 1 hour hold at 82.2° C.;

82.2° C. to 182° C. at a heating rate of 48.9° C./hr, with a 1 hour hold at 182° C.;

182° C. to 210° C. at a heating rate of 48.9° C./hr, with a 2 hour hold at 210° C.;

210° C. to 1,100° C. at a heating rate of 115.6° C./hr, with a 2 hour hold at 1.10° C.; and, cool furnace to 204.4° C. before opening.

The pyrolized material is placed in graphite boats, with the pyrolized material being in powder form or in chunks. The graphite boats are placed into an alumina tube furnace with two end blocks of insulation and caps to allow gas in flow and waist gas outflow. Argon gas at a rate of 50 cc/min is flowed through the tube furnace. The material is then heated to 1,650° C. over a 10 hour period (about 3° C./min heating rate) and is held at this temperature for an additional 10 hours. The furnace is then slowly cooled to 700° C. over a 5 hour period, the furnace is then cooled further, with the end caps being removed when the temperature is at least below 300° C.

The resultant polysilocarb derived SiC is removed from the furnace.

The SiC is then formed into a disc by pressing the SiC powder in a cylindrical die at a temperature above the melting temperature of a wax binder which has been melt-mixed into the SiC powder. The die can be sized such that a single monolith of pressed and sintered powder can be slid into a crucible for PVT growth. The die can also be sized to produce disc "chips" to pour into a crucible.

Example 11

A polysilocarb formulation is made in a clean room environment using glassware that has been cleaned so as to essentially remove all potential impurities, including in particular Al, Fe, and B. The formulation is blended at room temperature for about 10 to 20 minutes and then from 0.25% to 2% catalyst solution is added and the mixture is stirred for another 10 minutes. The catalyst solution has 10 ppm Pt. The final catalyzed formulation has between 10 and 50 ppb Pt.

In the clean room environment, the formulation is placed into a PFA (perfluoroalkoxy polymer) bottle or jar, purged with argon, and lid closed. The formulation is cured for from 1.5 hours to 4 hours at from 75° C. to 160° C.

In the clean room environment, the cured polymer is placed into ceramic crucibles. The filled crucibles are then covered with ceramic caps, and placed in a ceramic retort filled with argon gas flowing at 500 cc/min. The crucibles, furnace and all associate apparatus and equipment are clean and essentially contaminate free; and in particular are such that they do not provide a source of Al or B. The crucibles are heated at a rate of increase from about 30° C. to about 180° C./hr as follows:

room temp to 1,000° C. at a heating rate of 180° C./hr, with a 2 hour hold at 1,000° C.; and, cool furnace to 204.4° C. before opening.

The pyrolized material is placed in graphite boats, with the pyrolized material being in powder form or in chunks. The graphite boats are placed into an alumina tube furnace with two end blocks of insulation and caps to allow gas in flow and waste gas outflow. (Graphite box furnaces, RF furnaces, or other types of suitable heating apparatus can be used). The crucibles, furnace and all associate apparatus and equipment are clean and essentially contaminate free; and in particular, are such that they do not provide a source of Al, Fe, or B. Argon gas at a rate of 50 cc/min is flowed through the tube furnace. The material is then heated to from 1,400° C. to 1,650° C. over a from 7 to 15 hour period (about 3° C./min heating rate) and is held at this temperature for an additional 10 hours. The furnace is then slowly cooled to 700° C. over a 5 hour period, the furnace is then cooled further, with the end caps being removed when the temperature is at least below 300° C.

The resultant polysilocarb derived SiC is removed from the furnace.

Example 12a

The SiC of Example 11 is then formed into a volumetric shape of Examples 13-28, by mixing with 10 wt % virgin polysilocarb precursor and mixing until uniformly wetted by the resin. The paste is then pressed into the shape using a cold-press and a die. The shape is removed from the die and placed in a carbon crucible. The crucible is put in a graphite furnace and heated to 1750° C. for at least 1 hour. The sample is a handleable shape with specific gravity of 3.21 g/cc.

Example 12b

The SiC of Example 11 is then formed into a volumetric shape of Examples 13-28, by mixing with 14 wt % virgin polysilocarb precursor and mixing until uniformly wetted by the resin. The paste is then pressed into the shape using a cold-press and a die. The shape is removed from the die and placed in a carbon crucible. The crucible is put in a graphite furnace and heated to 1750° C. for at least 1 hour. The sample is a handleable shape with specific gravity of 3.21 g/cc.

Example 12c

The SiC of Example 11 is then formed into a volumetric shape of Examples 13-28, by mixing with 20 wt % virgin polysilocarb precursor and mixing until uniformly wetted by the resin. The paste is then pressed into the shape using a cold-press and a die. The shape is removed from the die and placed in a carbon crucible. The crucible is put in a graphite furnace and heated to 1750° C. for at least 1 hour. The sample is a handleable shape with specific gravity of 3.21 g/cc.

Example 12d

The SiC of Example 11 is then formed into a volumetric shape of Examples 13-28, by mixing with 30 wt % virgin polysilocarb precursor and mixing until uniformly wetted by the resin. The paste is then pressed into the shape using a cold-press and a die. The shape is removed from the die and placed in a carbon crucible. The crucible is put in a graphite furnace and heated to 1750° C. for at least 1 hour. The sample is a handleable shape with specific gravity of 3.21 g/cc.

Example 13

In FIGS. 1A to 1D there is provided a volumetric shape in the form of cylinder 1 having a flat top 2, a side 3, and flat bottom. In this embodiment the shape has a height of about 4 inches and a diameter of about 6 inches. Other sizes for this shape are contemplated, including for example a height of about 1 to 6 inches and diameters of about 2 to 12 inches; and a height of about ½ to 7 inches and diameters of about ½ to about 17.

Example 14

Figure 2A:
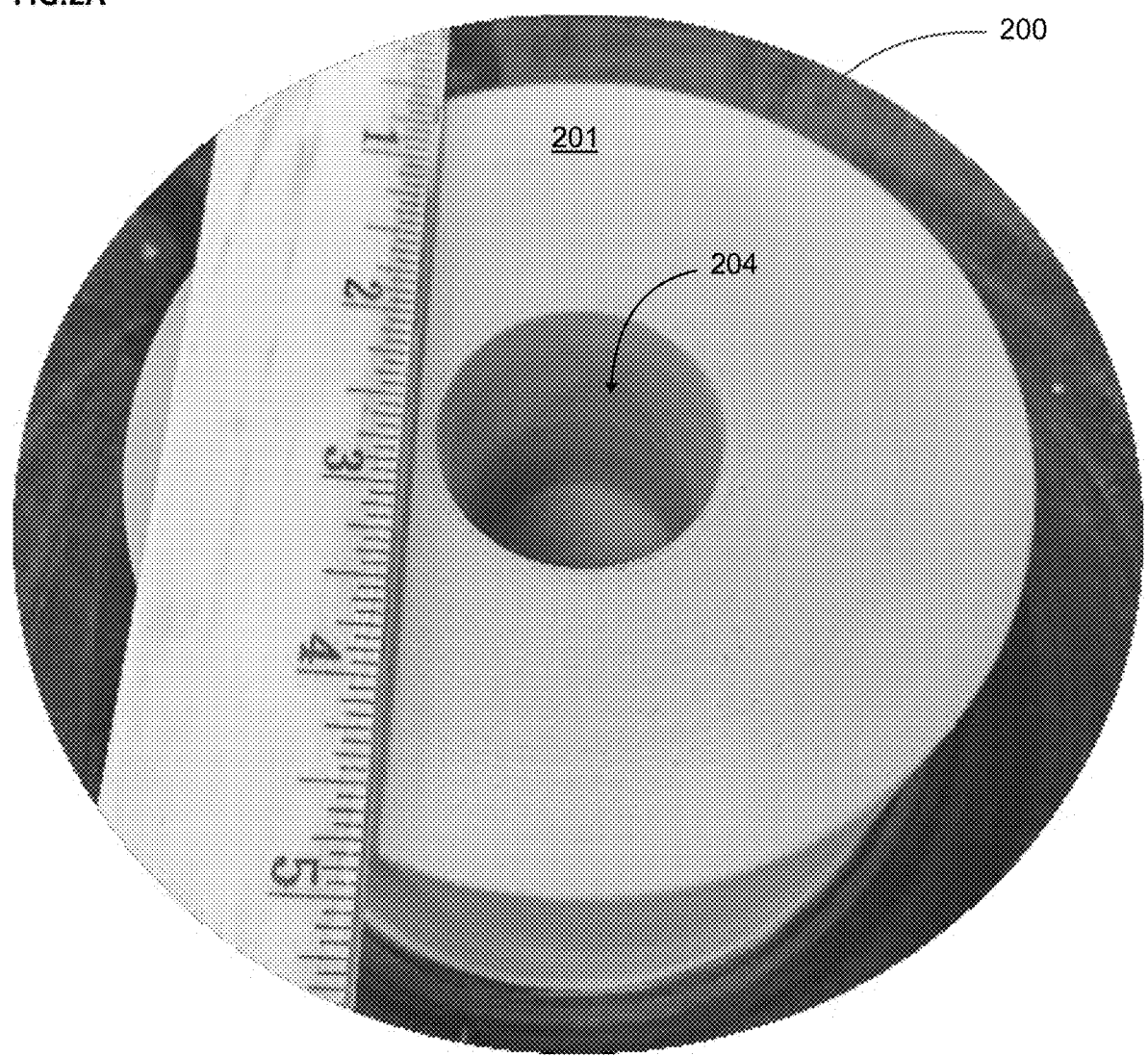
FIG. 2A is top perspective view of an embodiment of a volumetric shape in accordance with the present inventions (4½ inch diameter, partial central cylindrical opening top).
Figure 2B:
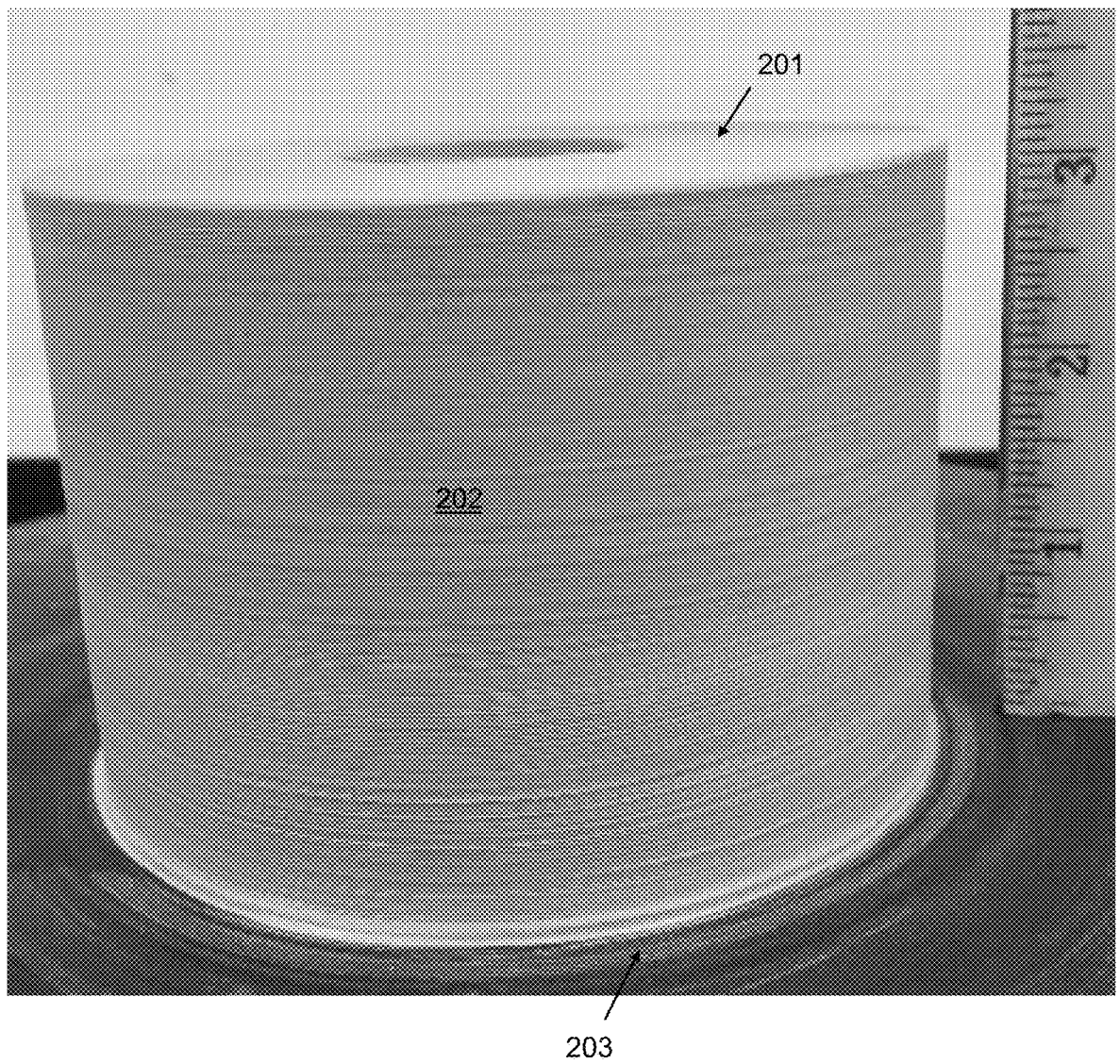
FIG. 2B is a side perspective view of the embodiment of FIG. 2A.
Figure 2C:
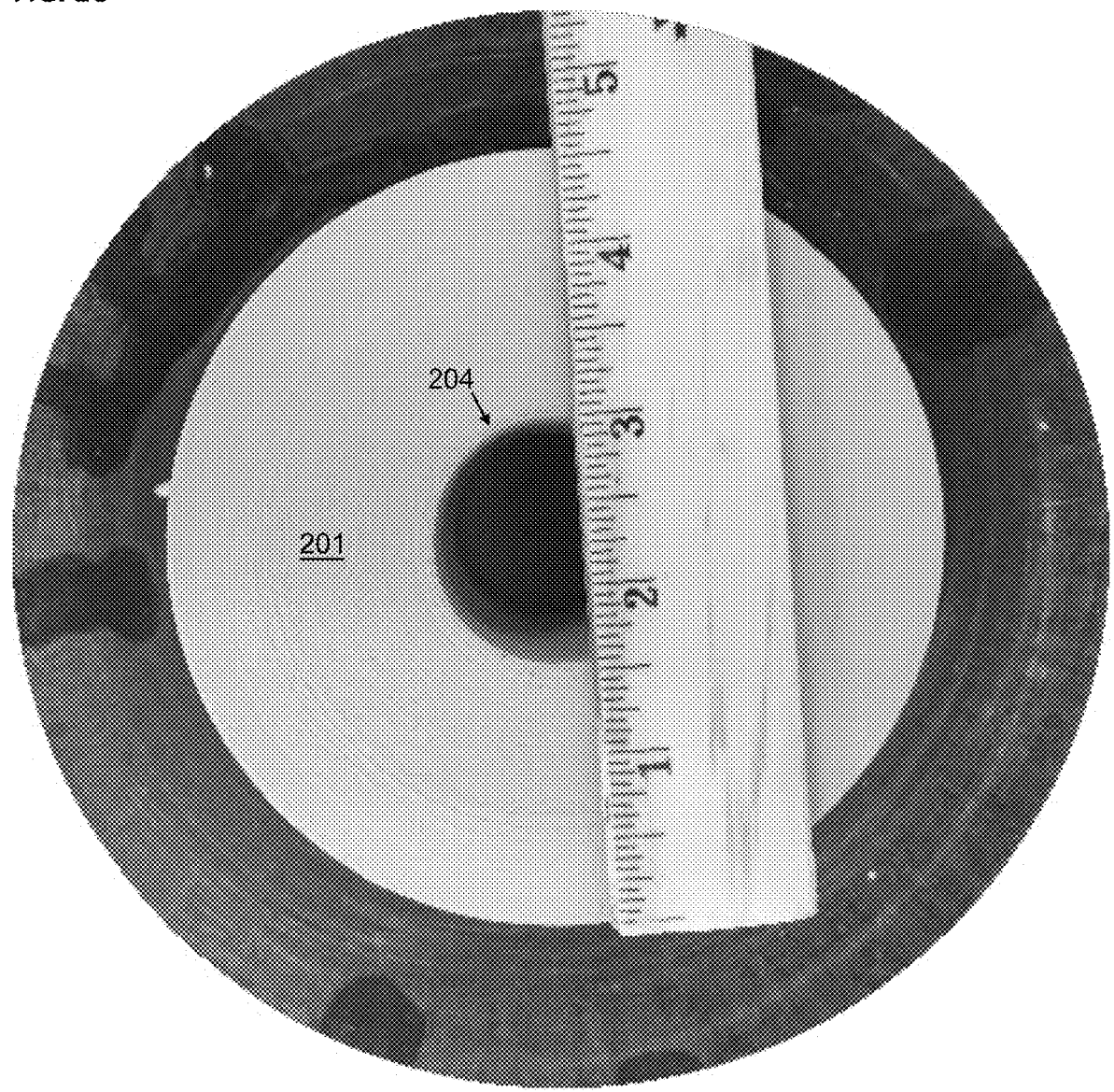
FIG. 2C is top view of the embodiment of FIG. 2A.
Figure 2D:
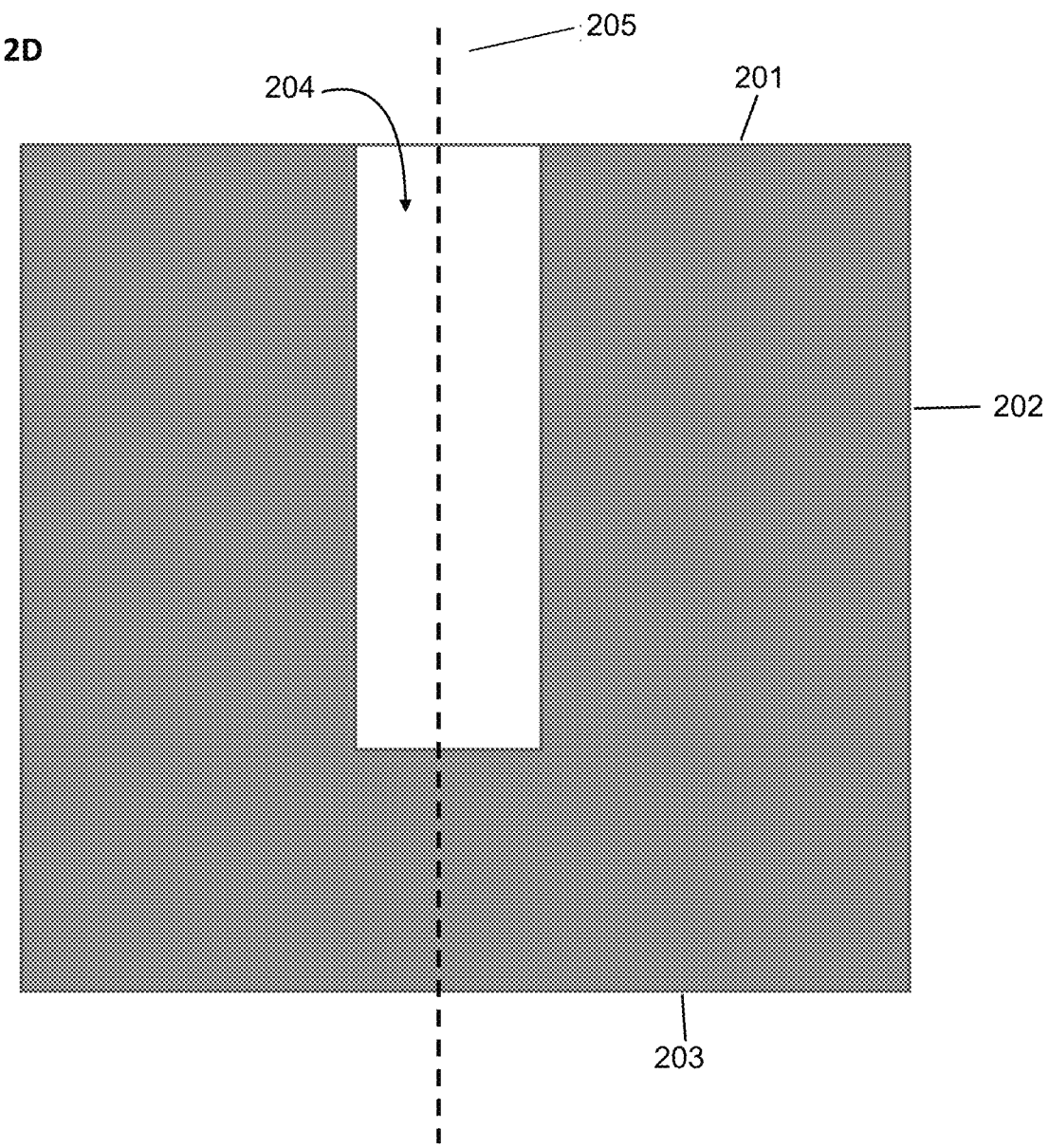
FIG. 2D is a schematic cross sectional view of the general type of embodiment shown in FIGS. 2A to 2C.

In FIGS. 2A to 2D there is provided a volumetric shape 200 in the form of a cylinder with a flat bottom 203 and an annular hole 204 in the top 201. The annular hole 204 has a bottom and does not extend entirely through the volumetric shape 200. The volumetric shape 200 has side 202. The shape has a height of about 3 inches and a diameter of 4 inches. The annular opening is about 1½ inches in diameter. Turning to FIG. 2D there is provided a cross sectional schematic of this type of shape. It being understood that the schematic would be rotated about axis 200 to provide the 3-D shape. Other sizes for this shape are contemplated, including for example a height of about 1 to 6 inches and diameters of about 2 to 12 inches; and a height of about ½ to 7 inches and diameters of about ½ to about 17.

Example 15

Figure 3A:
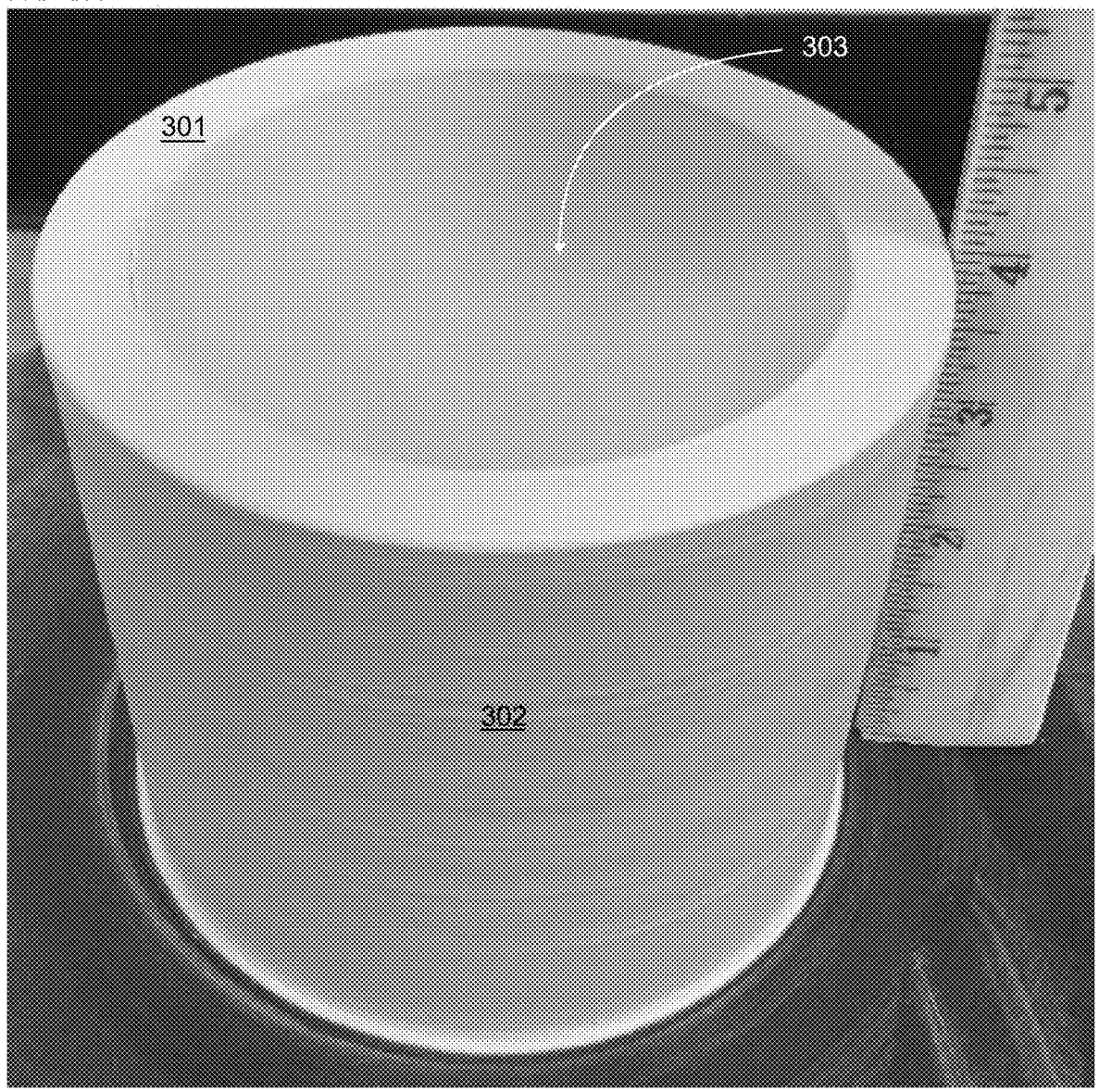
FIG. 3A is a perspective view of an embodiment of a volumetric shape in accordance with the present inventions.
Figure 3B:
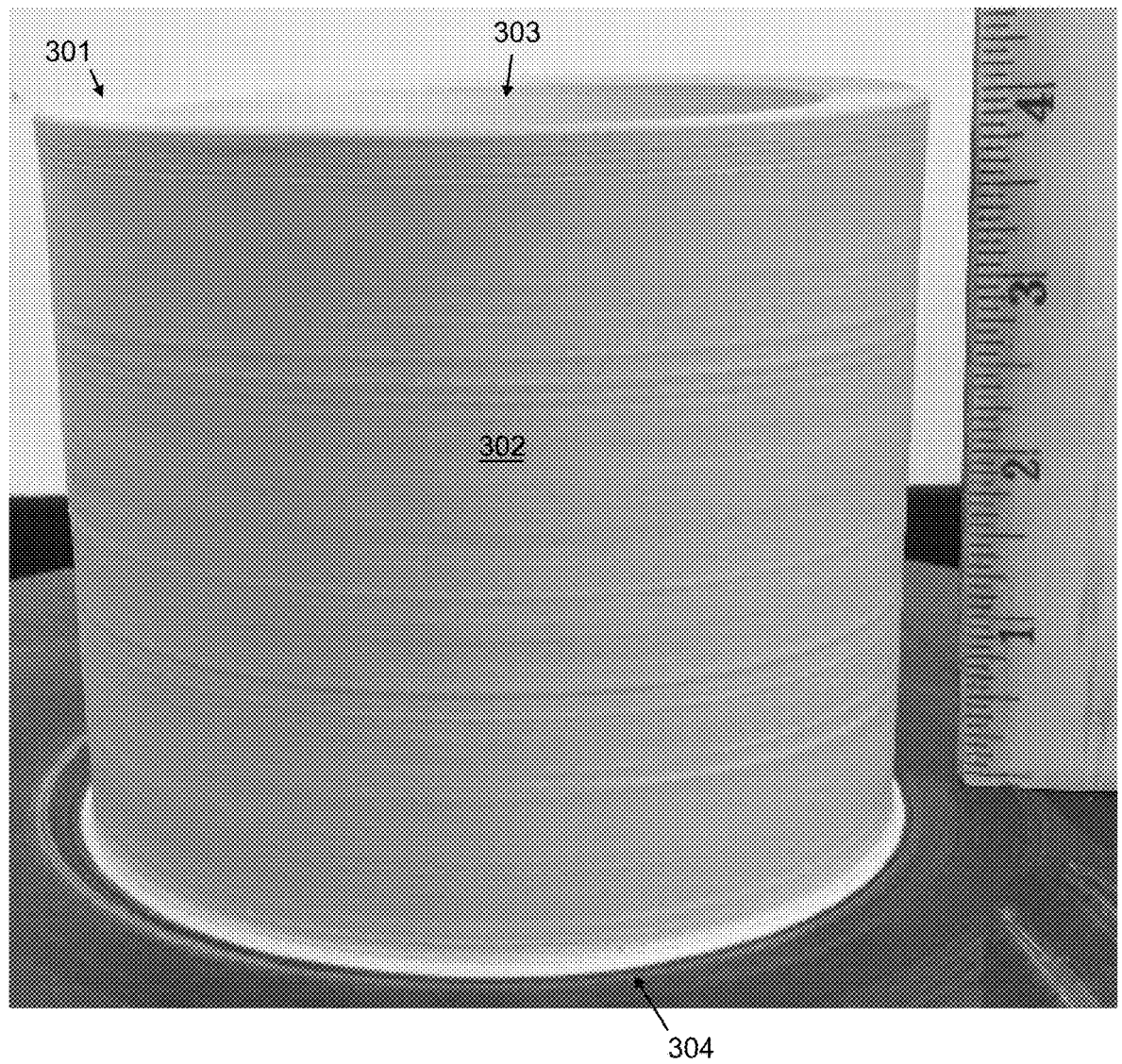
FIG. 3B is a side perspective view of the embodiment of FIG. 3A.
Figure 3C:
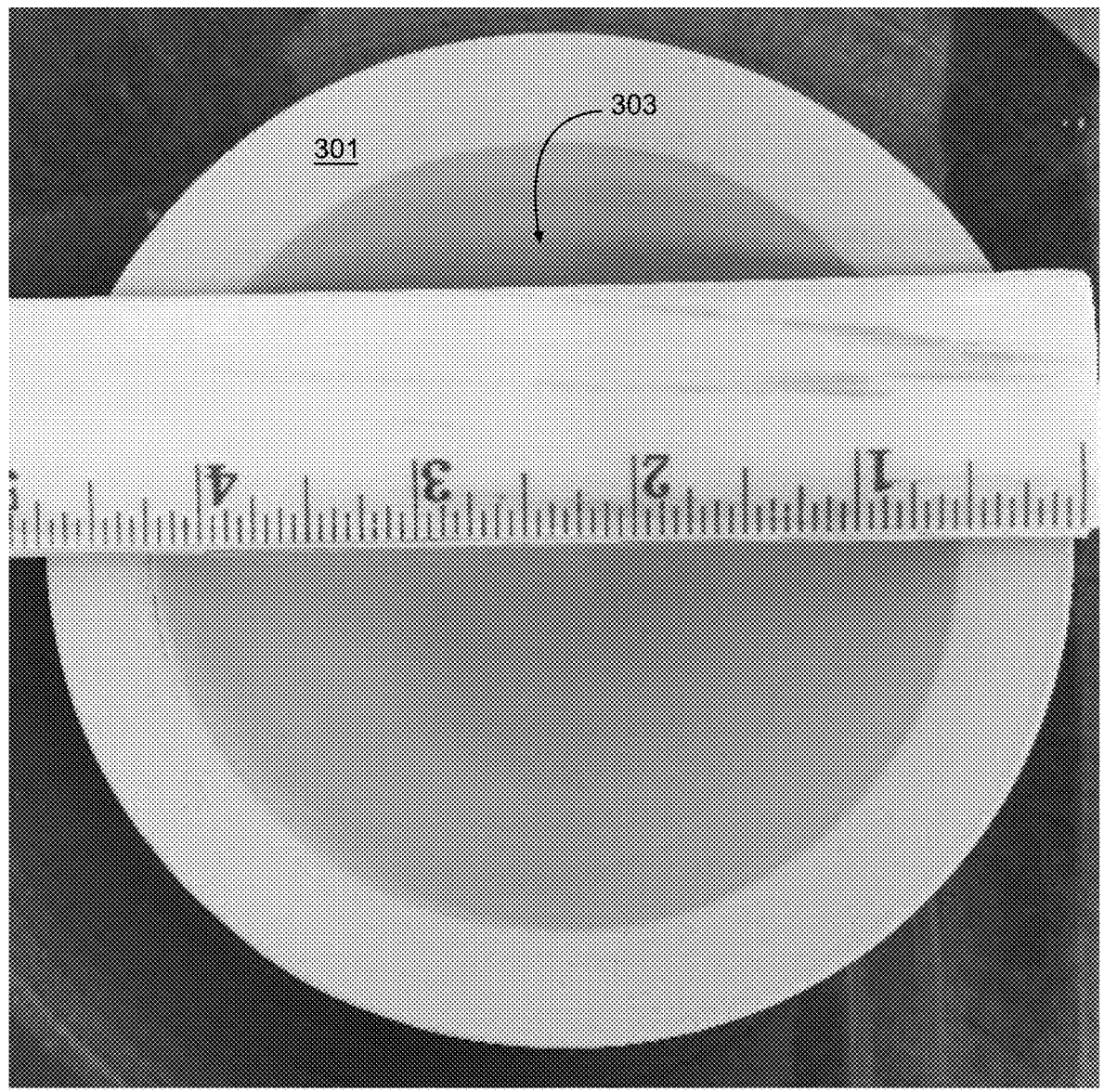
FIG. 3C is a top view of the embodiment of FIG. 3A.
Figure 3D:
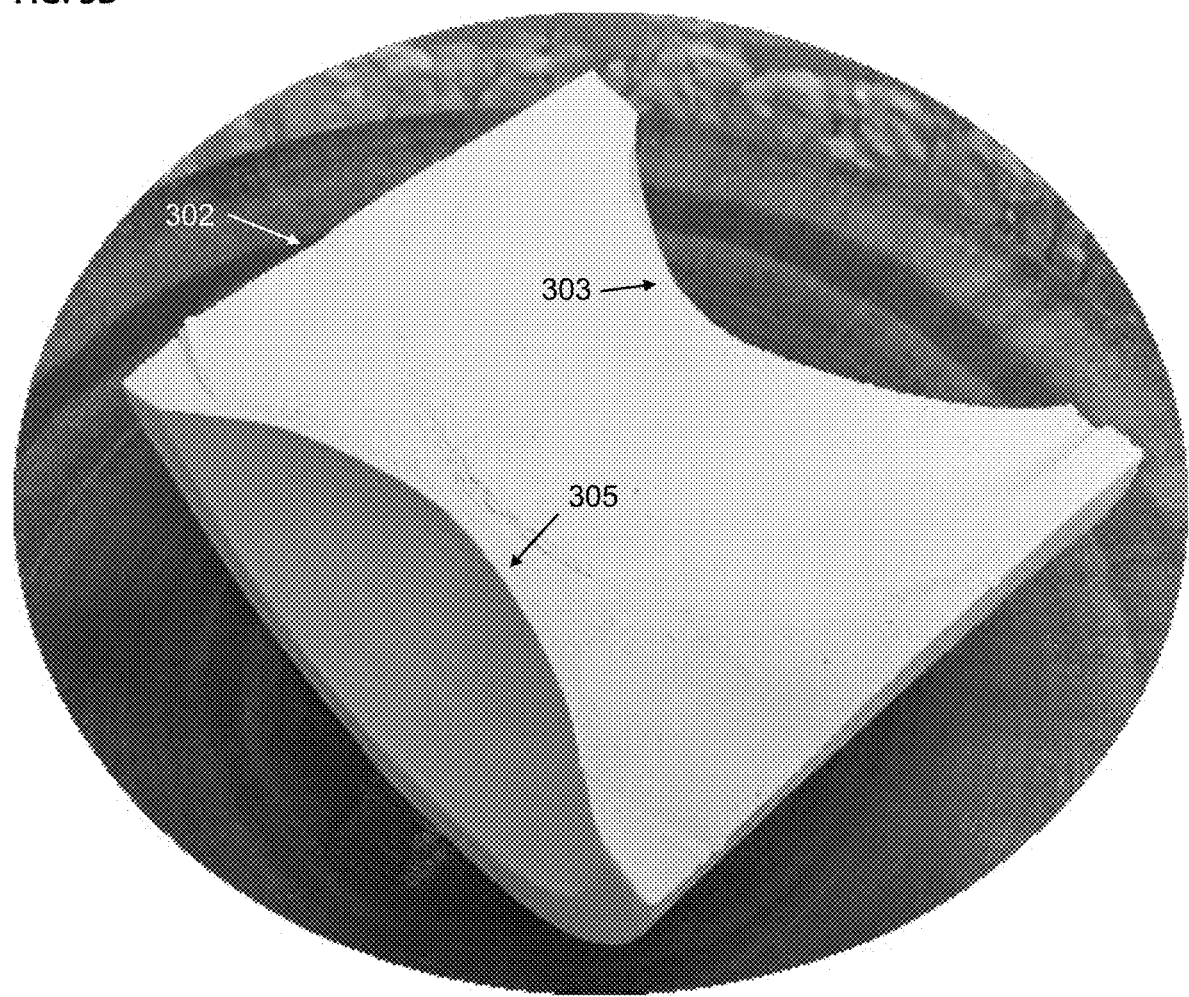
FIG. 3D is a perspective view of a cross section of the embodiment of FIG. 3A.
Figure 3E:
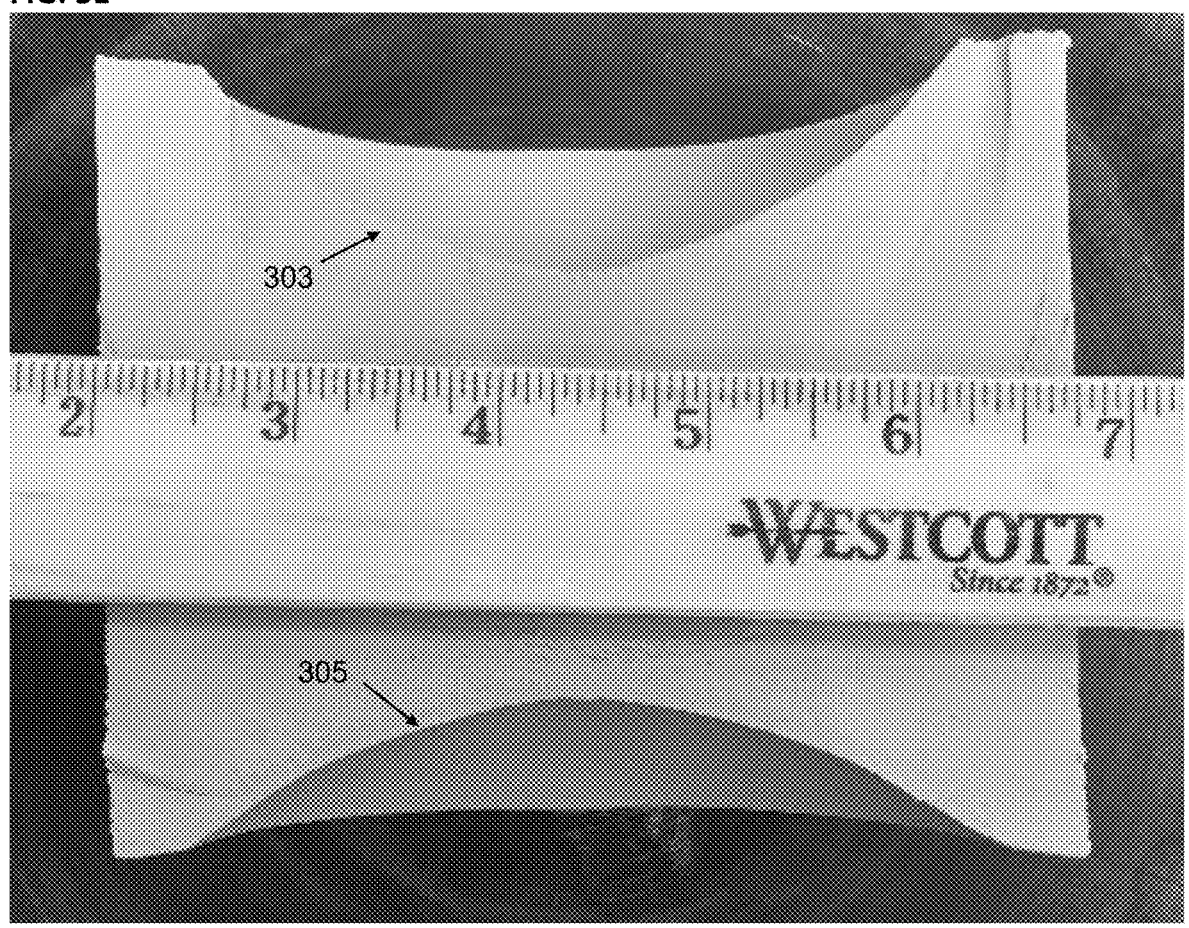
FIG. 3E is a side view of the cross section of FIG. 3D.
Figure 3F:
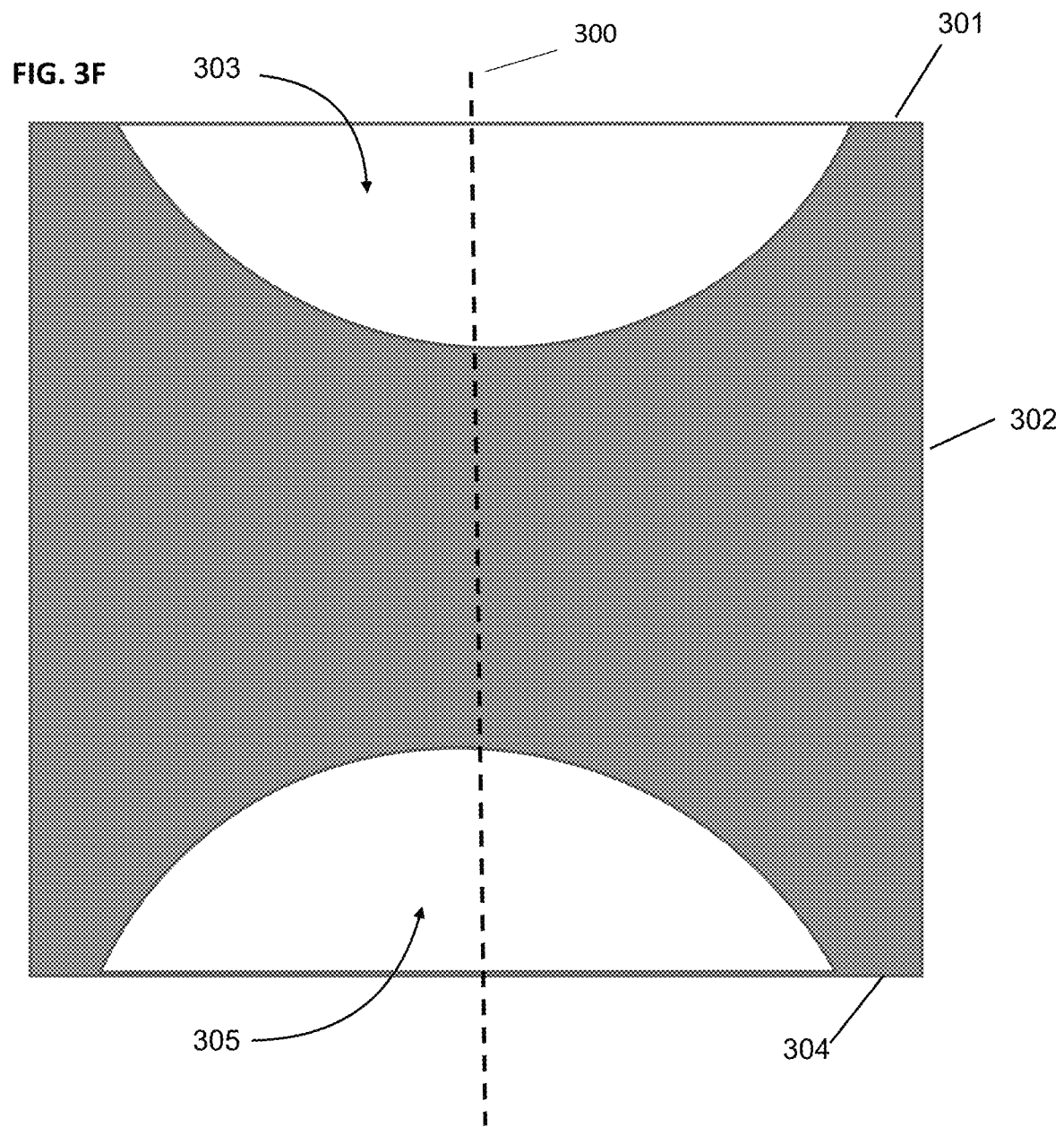
FIG. 3F is a schematic cross sectional view of the general type of embodiment shown in FIGS. 3A to 3E.

In FIGS. 3A to 3F there is provided a volumetric shape in the form of a cylinder with a spherical opening 303 formed in the top 301 and a spherical opening 305 formed in the bottom 304. The shape has a side 302. The shape has a height of about 4 inches and a diameter of about 4¾ inches. The opening has a diameter of about 3¾ inches. Turning to FIG. 3F there is provided a cross sectional schematic of this type of shape. It being understood that the schematic would be rotated about axis 300 to provide the 3-D shape. Other sizes for this shape are contemplated, including for example a height of about 1 to 6 inches and diameters of about 2 to 12 inches; and a height of about ½ to 7 inches and diameters of about ½ to about 17.

In this embodiment (as well as the other embodiments of the Examples), the openings are coaxial with axis. It being understood that in embodiments the openings may be off axis, e.g., not on the same axis as the axis of the volumetric shape.

Example 16

Figure 4A:
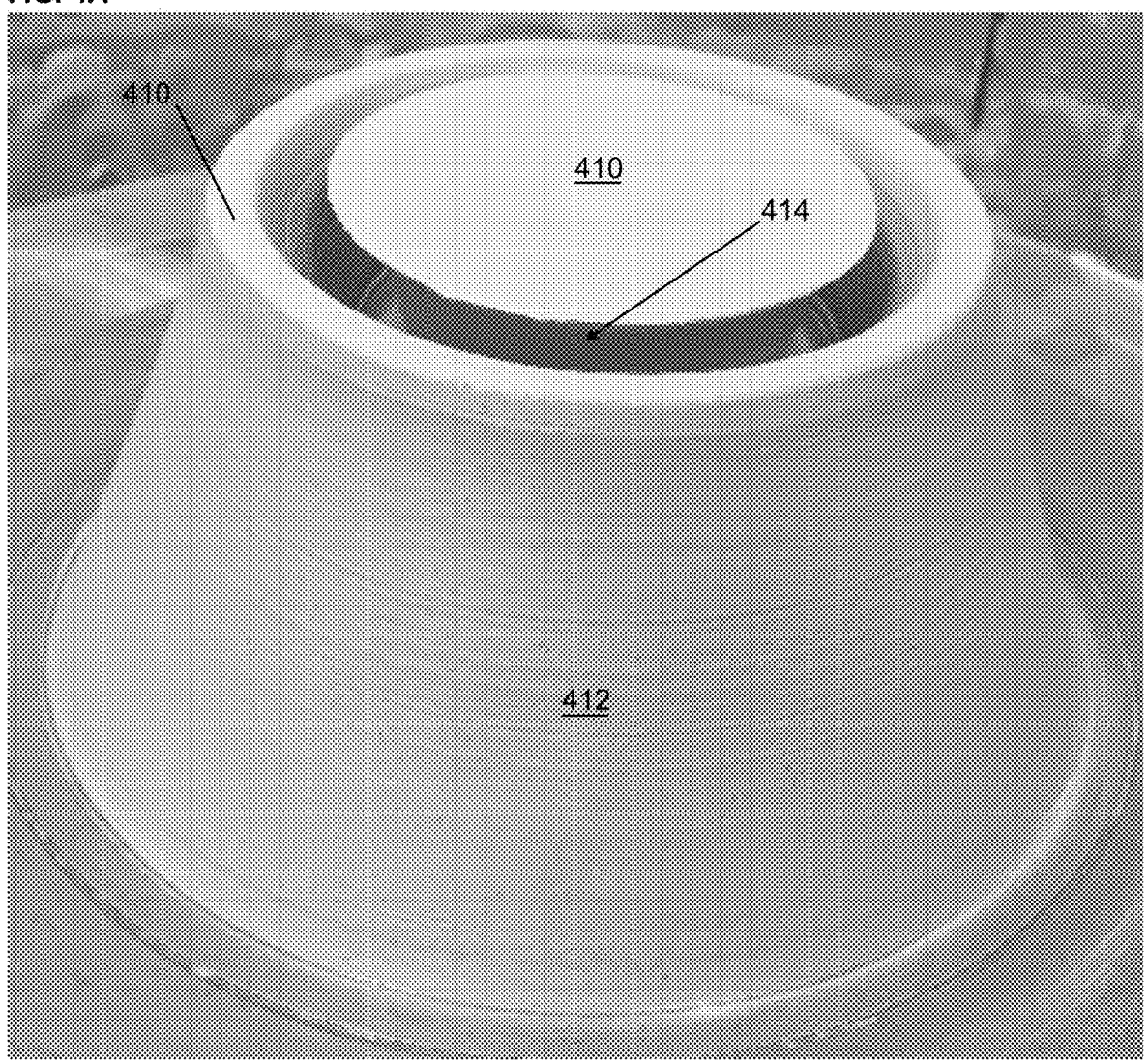
FIG. 4A is a perspective view of an embodiment of a volumetric shape in accordance with the present inventions (tapered cylinder with top angled annular channel).
Figure 4B:
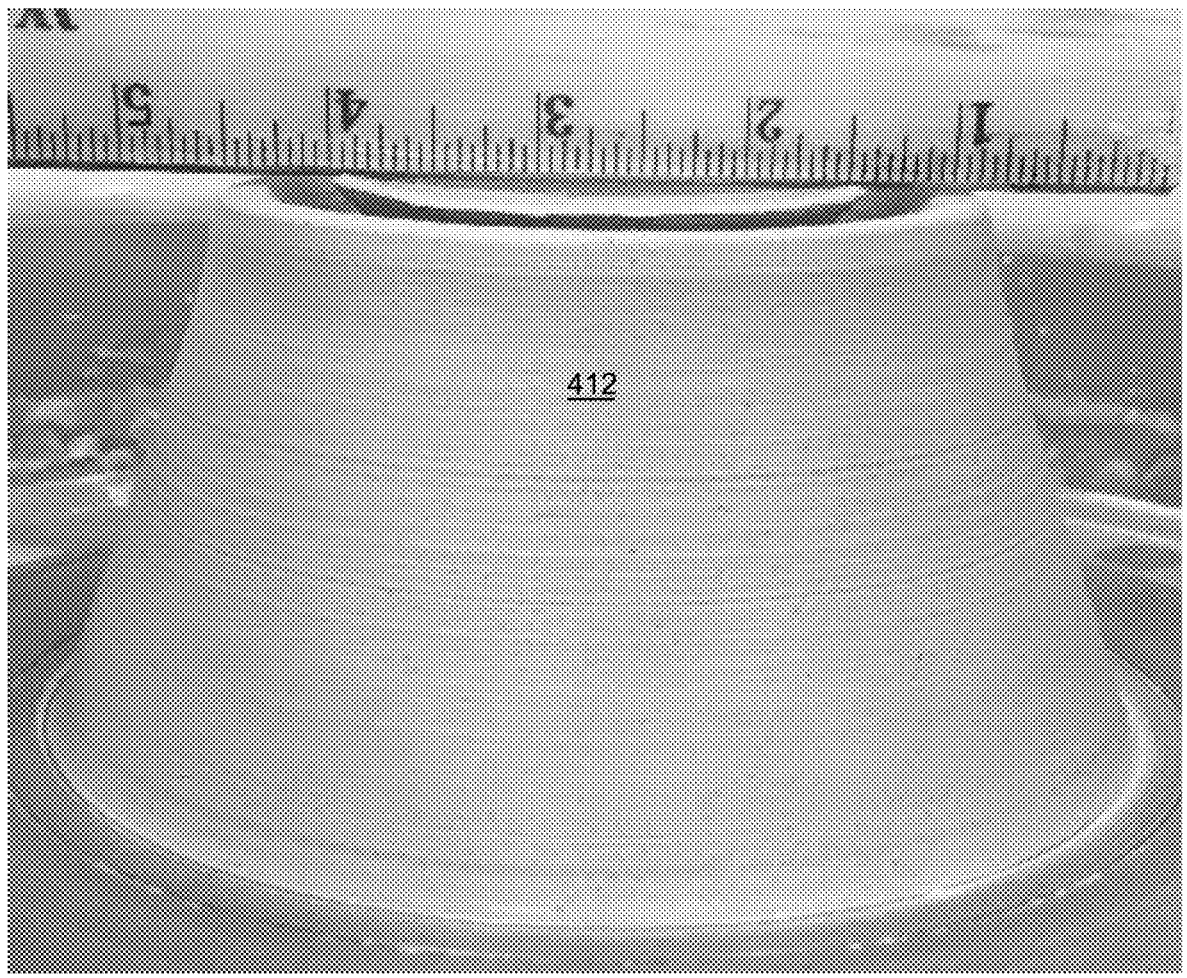
FIG. 4B is a side perspective view of the embodiment of FIG. 4A.
Figure 4D:
FIG. 4D is a top view of the embodiment of FIG. 4A.
Figure 4F:
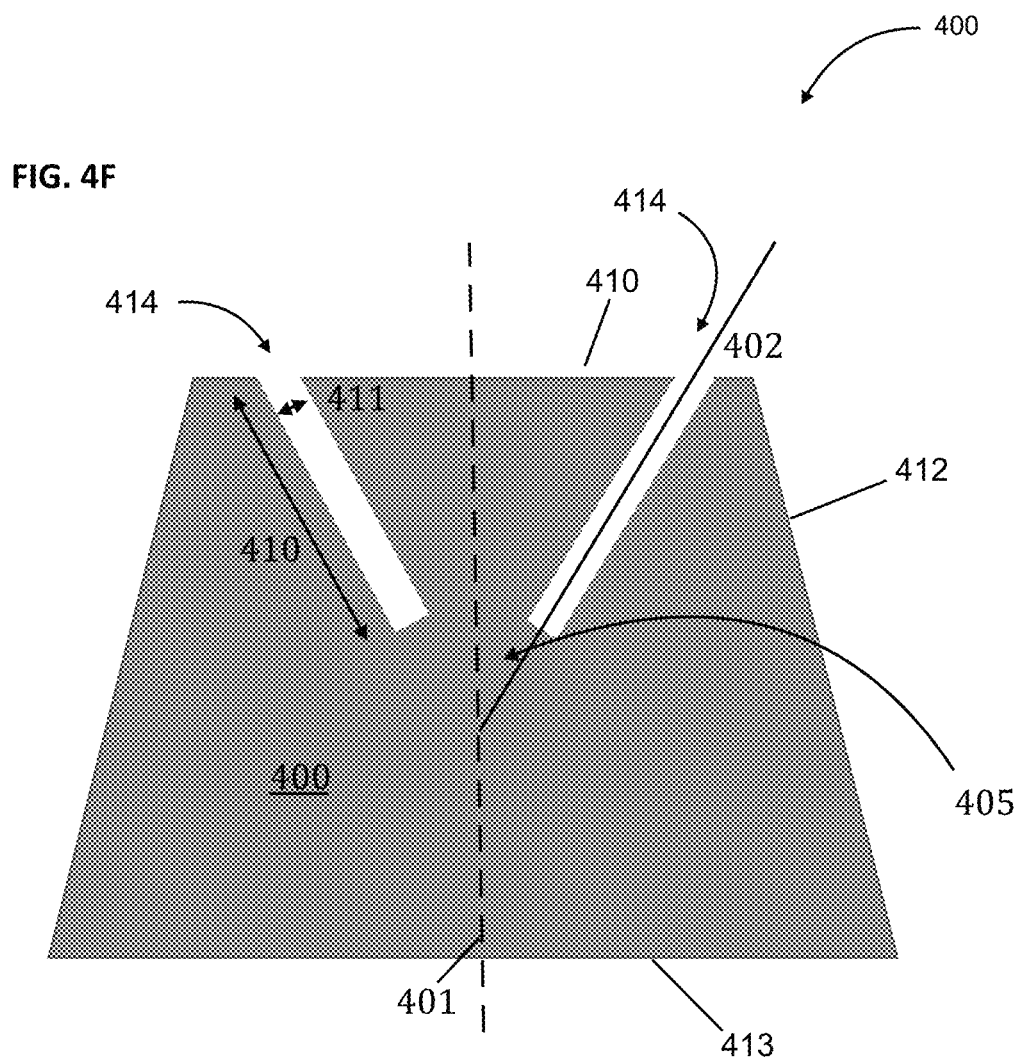
FIG. 4F is a schematic cross sectional view of the general type of embodiment shown in FIGS. 4A to 4E.

In FIGS. 4A to 4F this is provided a volumetric shape that is conical with a flat top 410 and flat bottom 413. The top 410 has an angled annular opening 414, or channel, formed in it. The volumetric shape as a side 412. The diameter of top is about 4⅛ inches and the diameter of the bottom is about 4⅜ inches. The height is about 2½ inches. The annular channel has an opening width of about ½ inch and extends down into the shape about 1 inch. Turning to FIG. 4F there is provided a cross sectional schematic of this type of shape 400. It being understood that the schematic would be rotated about axis 401 to provide the 3-D shape. The angled annular channel has a length (shown by double arrow 410 and a width shown by double arrow 411. The angle 405 of the annular channel 414 is determined by the angle formed between line 402 (which is the centerline of the cross section of the channel 414) and axis 401. This angle 405 in FIG. 4F is 60°, and in embodiments can range from about 89° to about 0° and preferably from about 80° to about 40°, and combinations and variations of these, as well as, all values within the range of these angles. Other sizes for this shape are contemplated, including for example a height of about 1 to 6 inches and diameters of about 2 to 12 inches; and a height of about ½ to 7 inches and diameters of about ½ to about 17, and combinations and variations of these, as well as, all values within the range of these dimensions.

Example 17

Figure 5A:
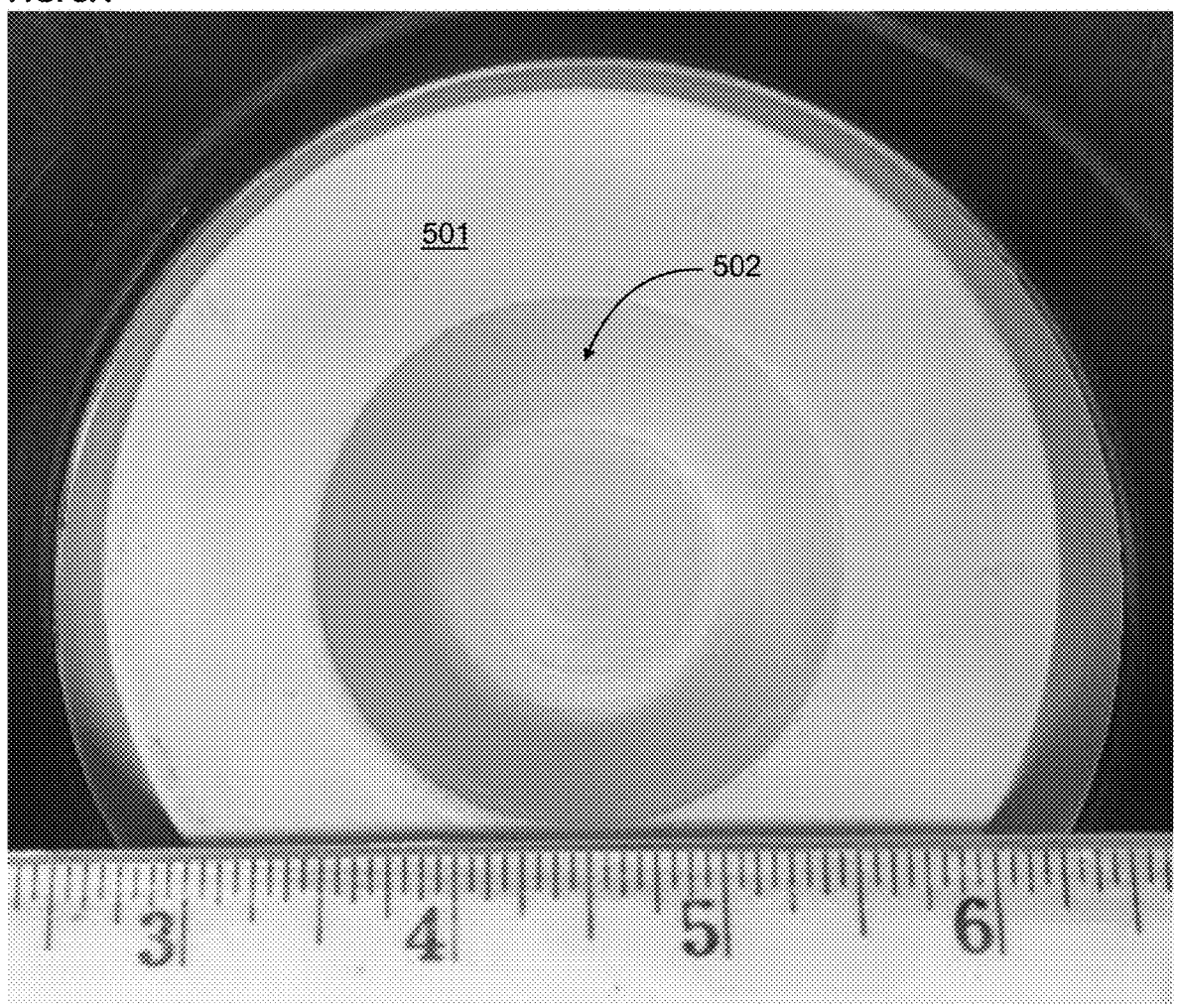
FIG. 5A is a top view of an embodiment of a volumetric shape in accordance with the present inventions (tapered cylinder with top and bottom cut outs).
Figure 5B:
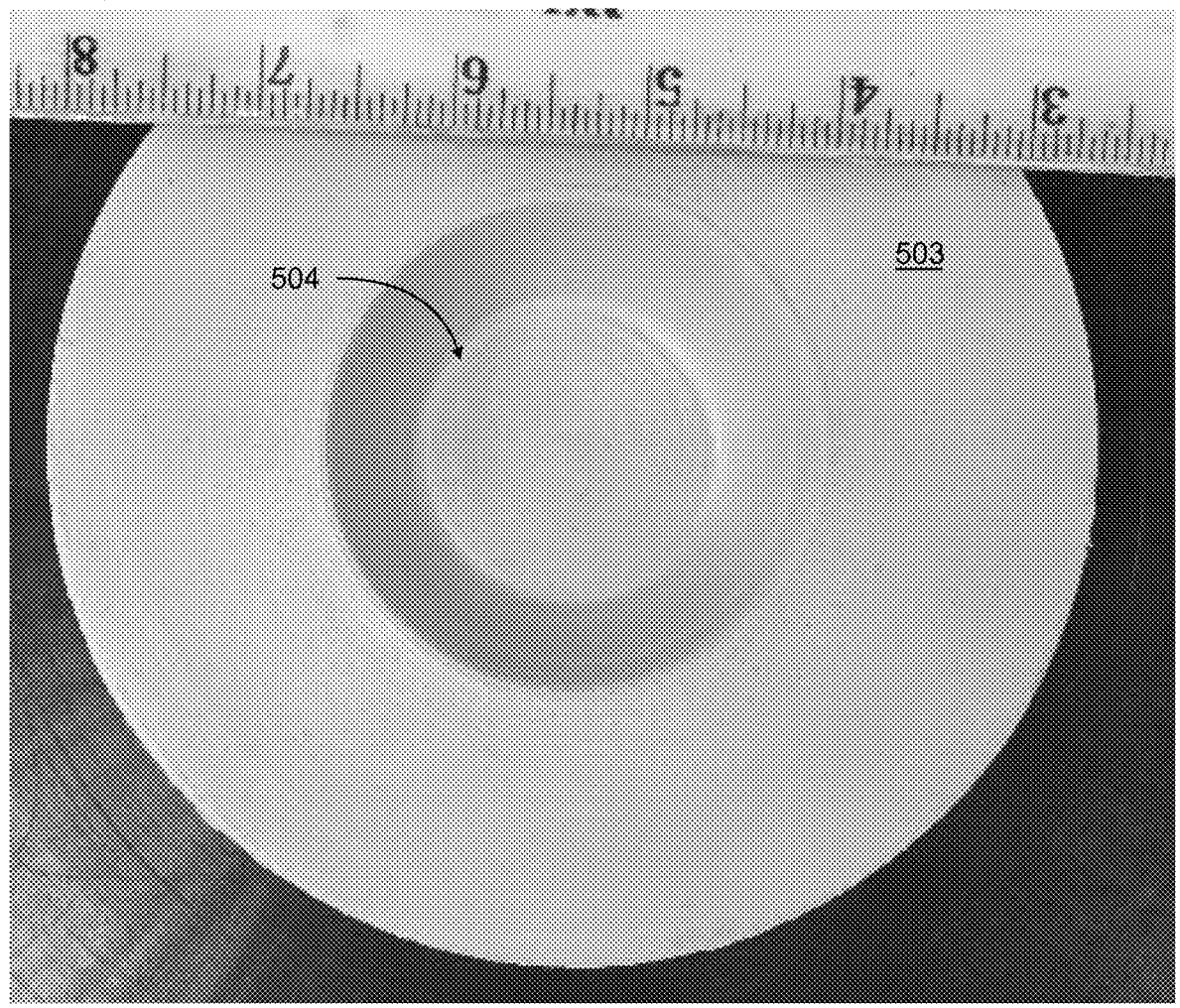
FIG. 5B is a bottom view of the embodiment of FIG. 5A.
Figure 5C:
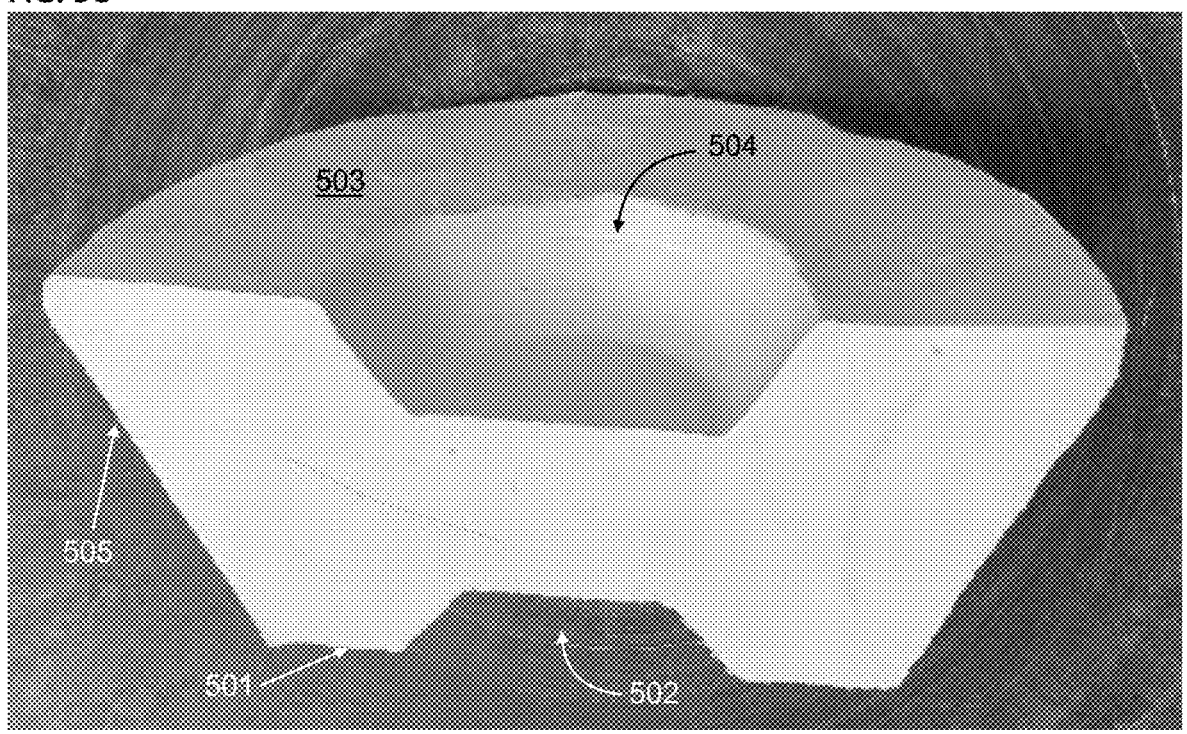
FIG. 5C is a perspective view of a cross section of the embodiment of FIG. 5A.
Figure 5D:
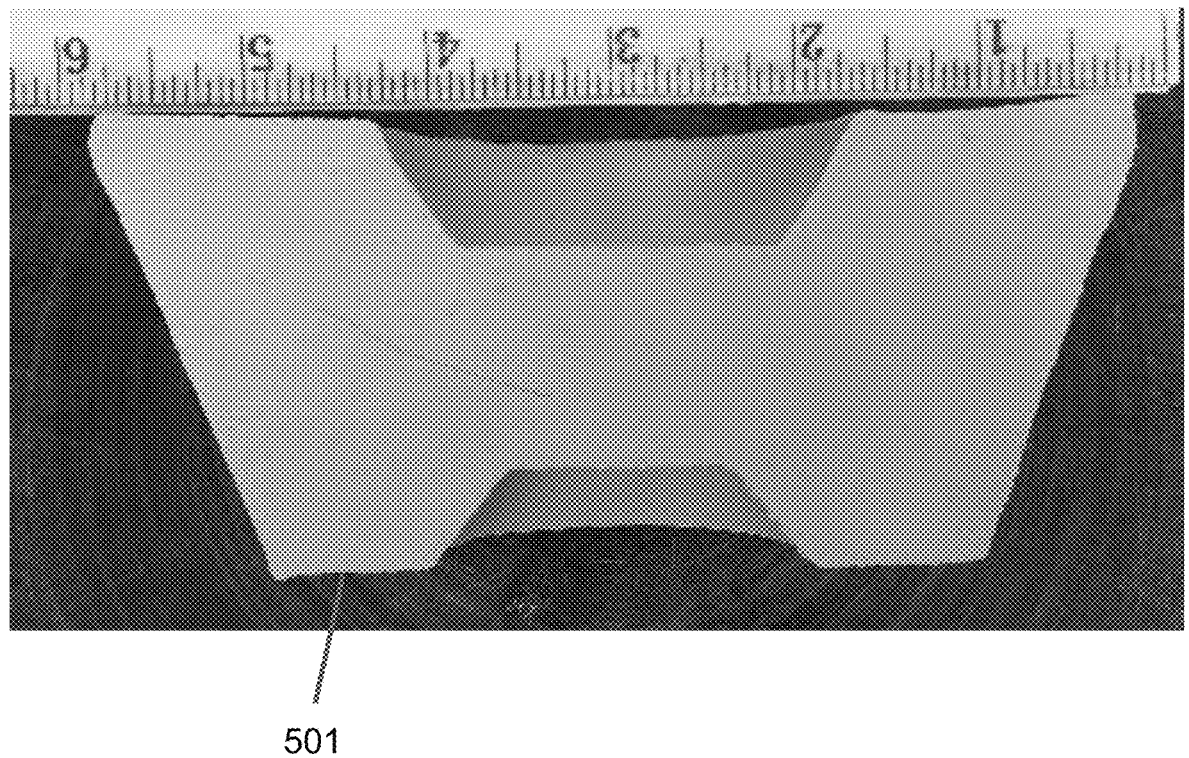
FIG. 5D is a side view of a cross section of the embodiment of FIG. 5A.
Figure 5E:
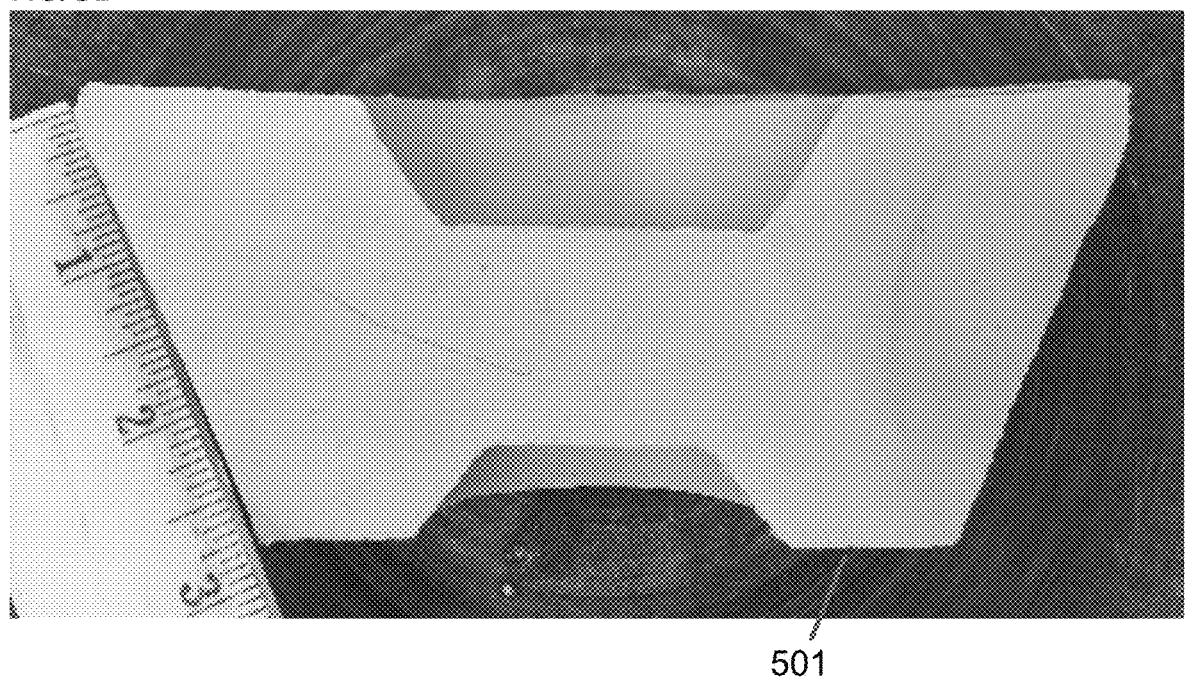
FIG. 5E is a side view of a cross section of the embodiment of FIG. 5A.
Figure 5F:
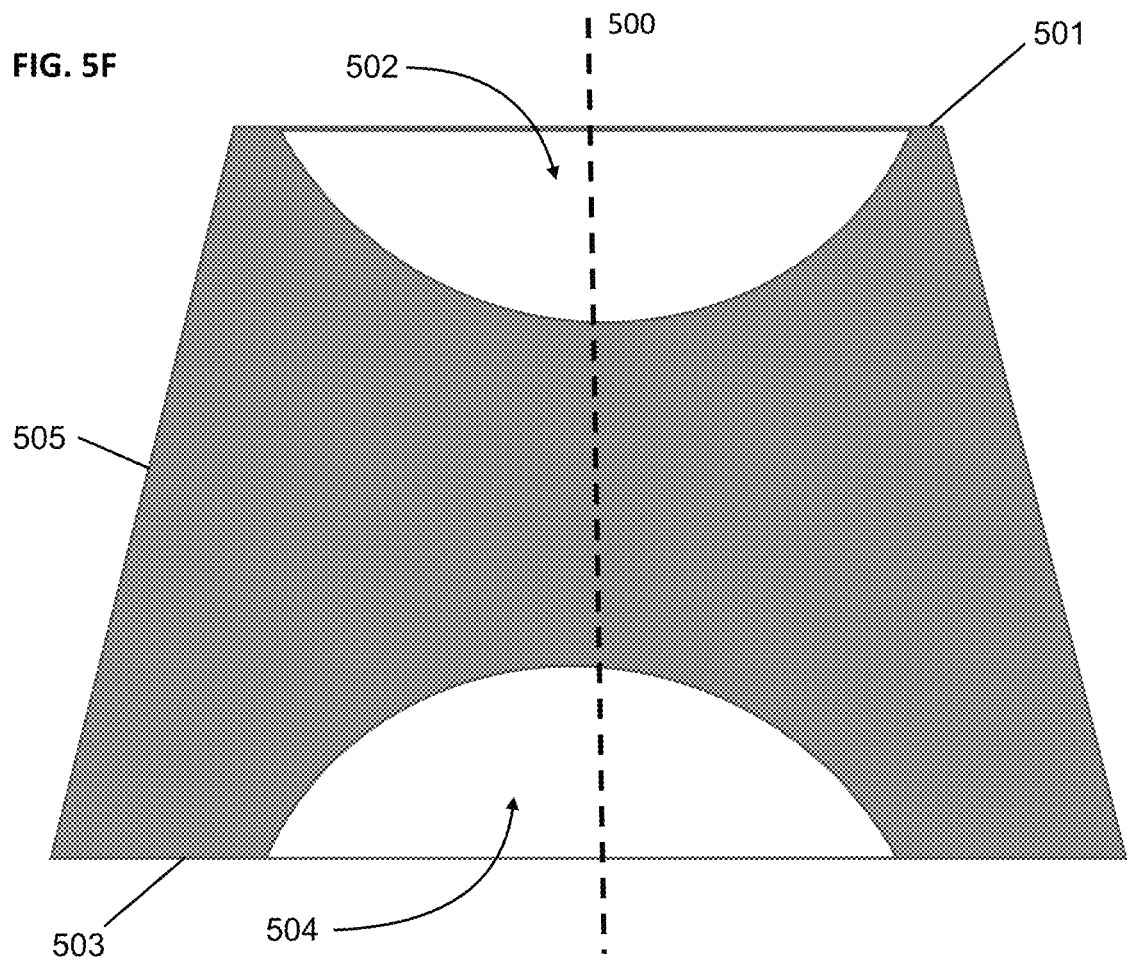
FIG. 5F is a schematic cross sectional view of the general type of embodiment shown in FIGS. 5A to 5E.

In FIGS. 5A to 5F there is provided a conical shape having a flat top 501 and flat bottom 503, and the top 501 and bottom 503 having openings 502, 504. The shape has a side 505, e.g., side wall or side surface or outer side surface. The opening can be spherical (as shown in FIG. 5F), conical with flat bottom (as shown in FIGS. 5A to 5E) or conical. The diameter of the top is about 3½ inches and at the bottom is about 5 inches. The length of the side wall is about 2⅞ inches. Turning to FIG. 5F there is provided a cross sectional schematic of this type of shape. It being understood that the schematic would be rotated about axis 500 to provide the 3-D shape. Other sizes for this shape are contemplated, including for example a height of about 1 to 6 inches and diameters of about 2 to 12 inches; and a height of about ½ to 7 inches and diameters of about ½ to about 17.

Example 18

Figure 6A:
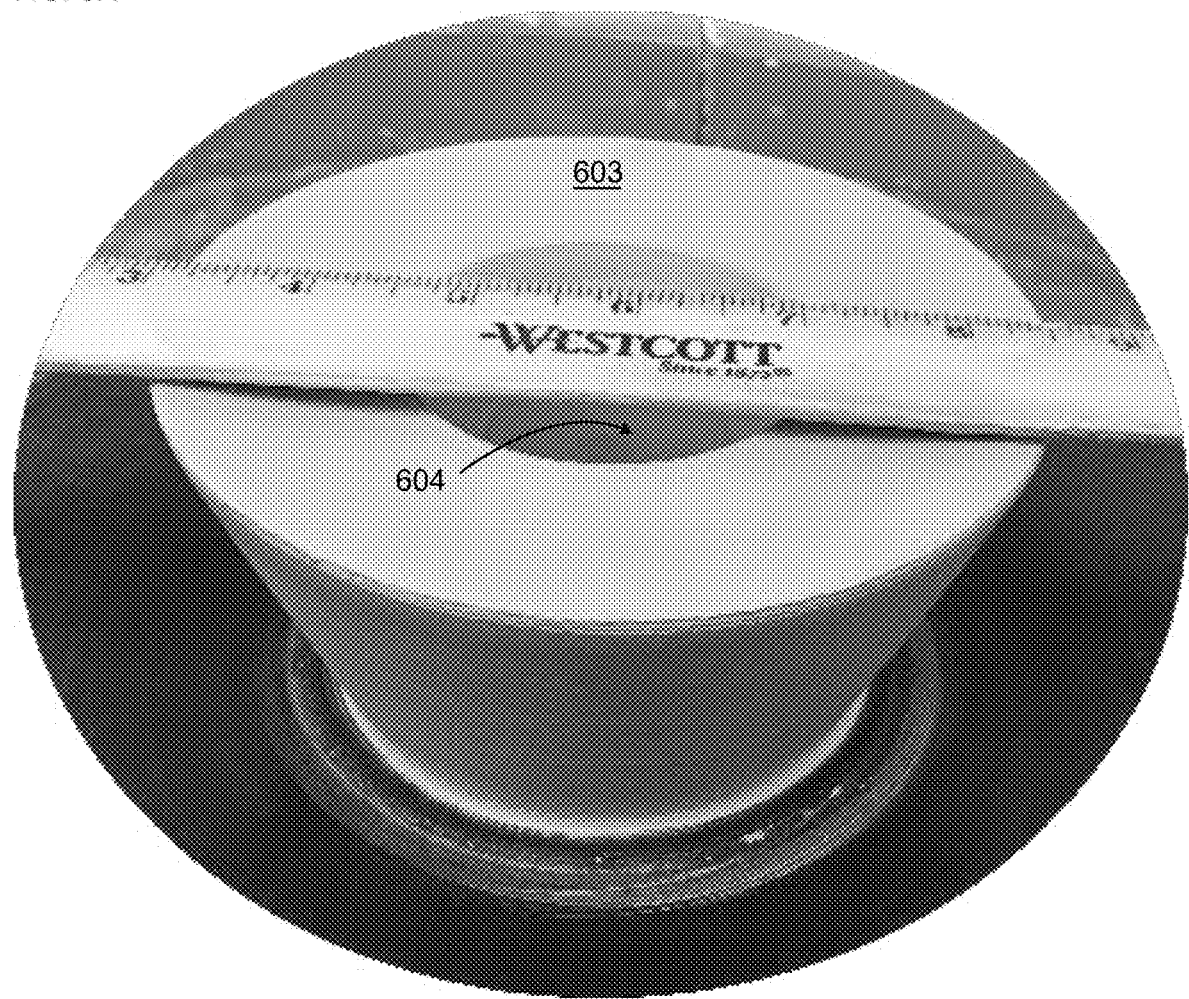
FIG. 6A is a bottom perspective view of an embodiment of a volumetric shape in accordance with the present inventions (tapered cylinder bottom cut out).
Figure 6B:
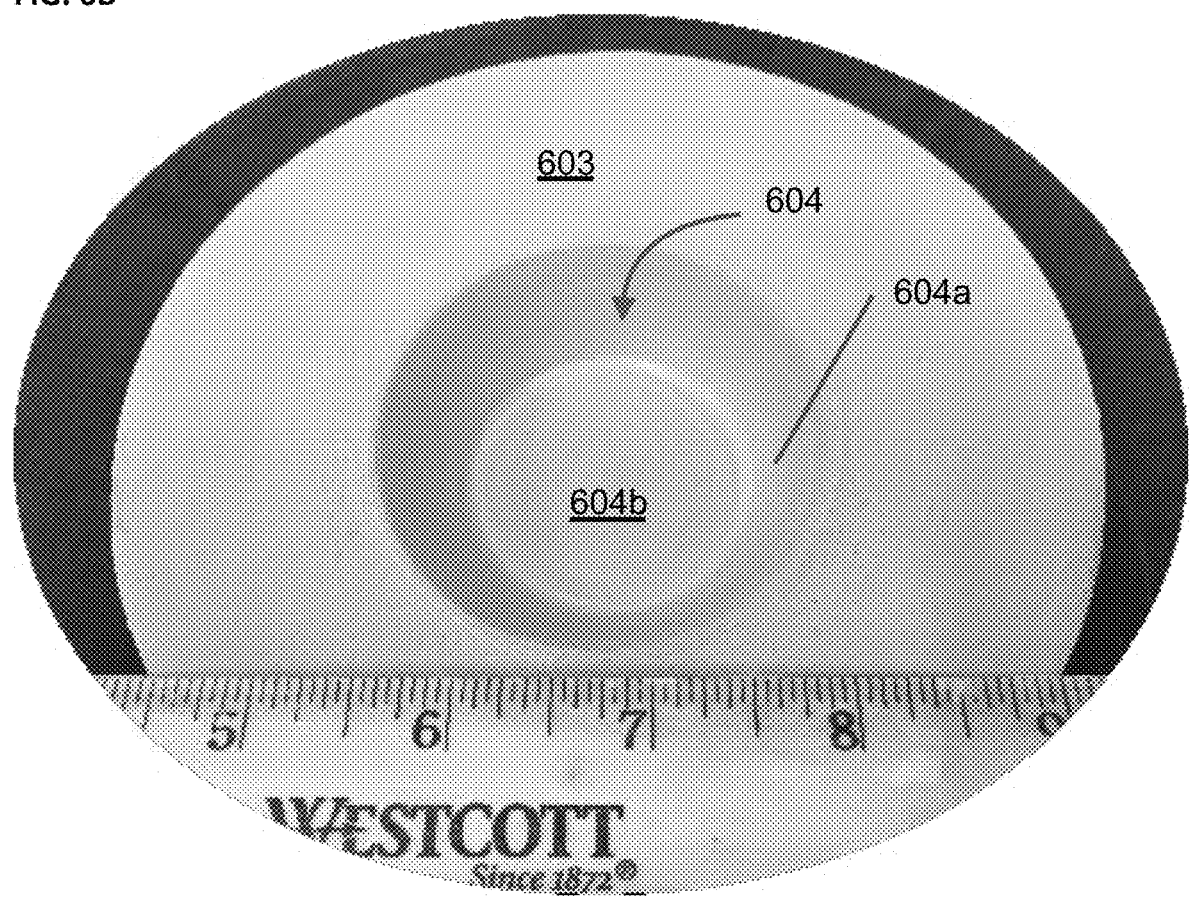
FIG. 6B is bottom view of the embodiment of FIG. 6A.
Figure 6C:
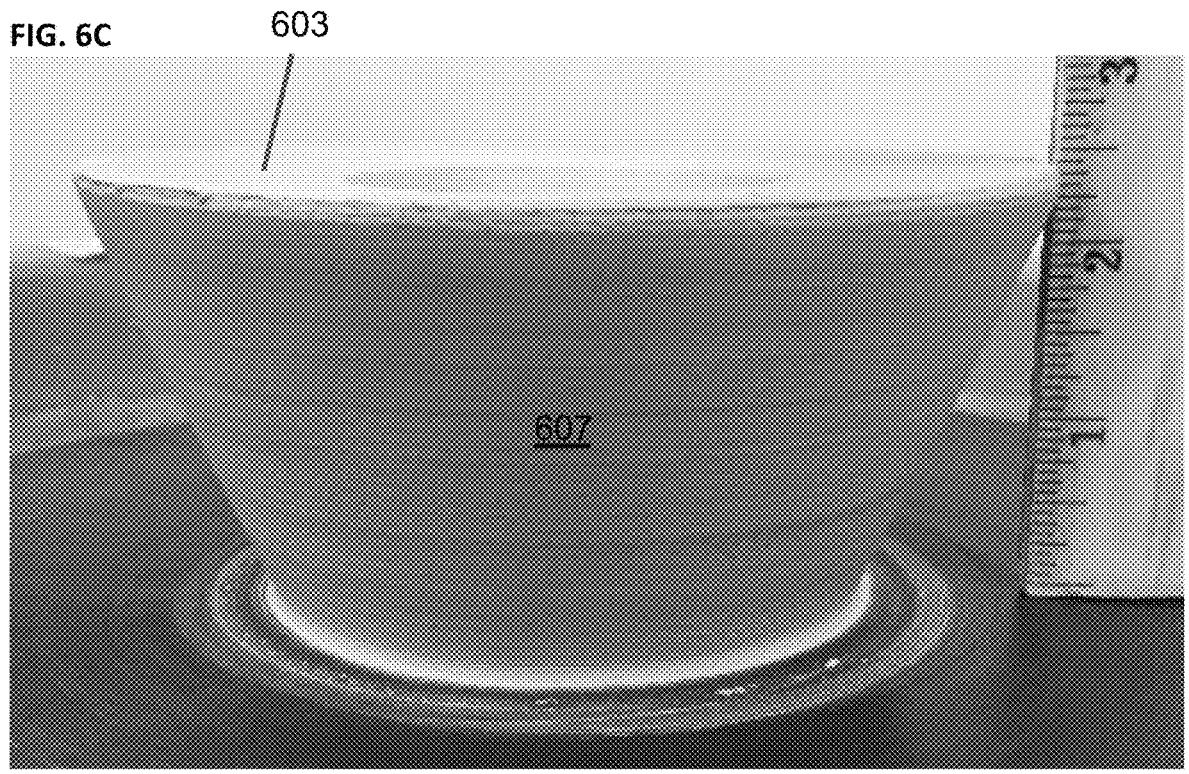
FIG. 6C is a side perspective view of the embodiment of FIG. 6A.
Figure 6D:
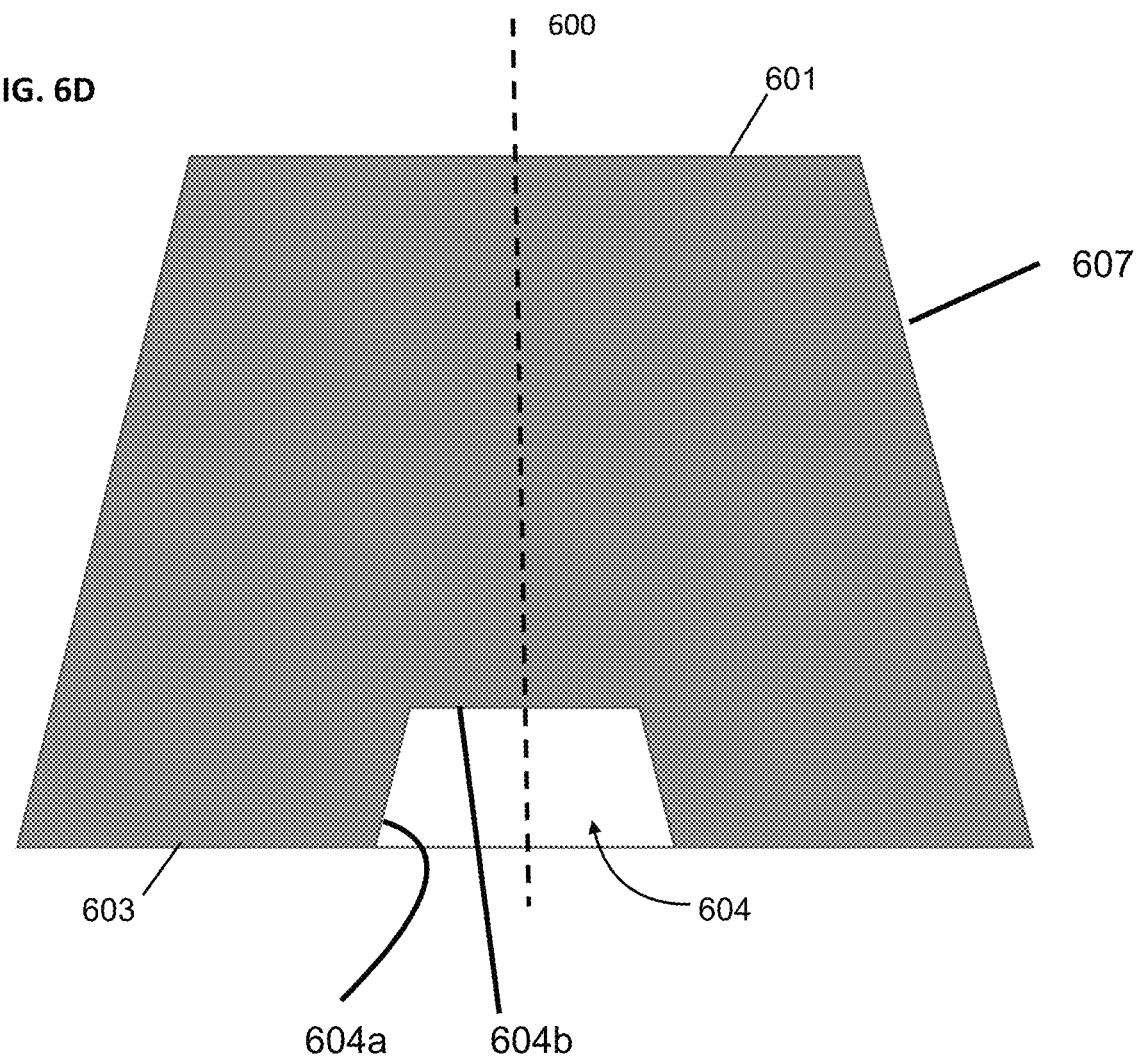
FIG. 6D is a schematic cross sectional view of the general type of embodiment shown in FIGS. 6A to 6C.

In FIGS. 6A to 6D there is provided a conical shape having a flat top 601 and flat bottom 603, and with the bottom 603 having an opening 604. The shape has a side 607. The opening 604 has a conical side wall 604a, (e.g., an inner wall, side 607 being an outer wall) and a flat bottom surface 604b. In embodiments the opening can be other shapes. The diameter of the bottom is about 5½ inches and the top is about 3 inches. The diameter of the opening is about 2⅛ inches. The height is about 2⅜ inches. Turning to FIG. 6D there is provided a cross sectional schematic of this type of shape. It being understood that the schematic would be rotated about axis 600 to provide the 3-D shape. Other sizes for this shape are contemplated, including for example a height of about 1 to 6 inches and diameters of about 2 to 12 inches; and a height of about ½ to 7 inches and diameters of about ½ to about 17, and combinations and variations of these, as well as, all values within the range of these sizes.

Example 19

Figure 20A:
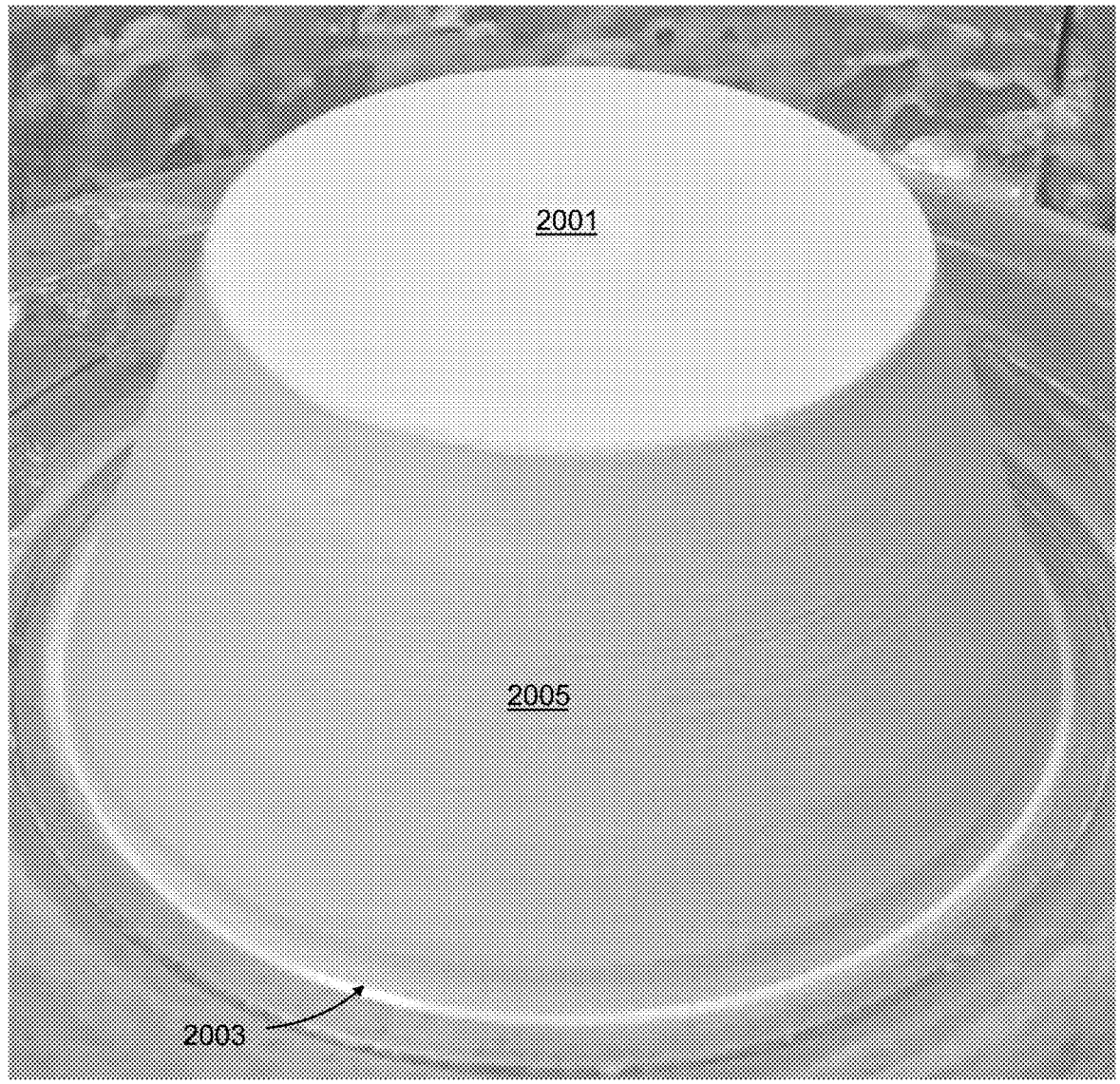
FIG. 20A is a top perspective view of a volumetric shape in accordance with the present inventions (tapered cylinder, no cutouts, flat bottom and top).
Figure 20B:
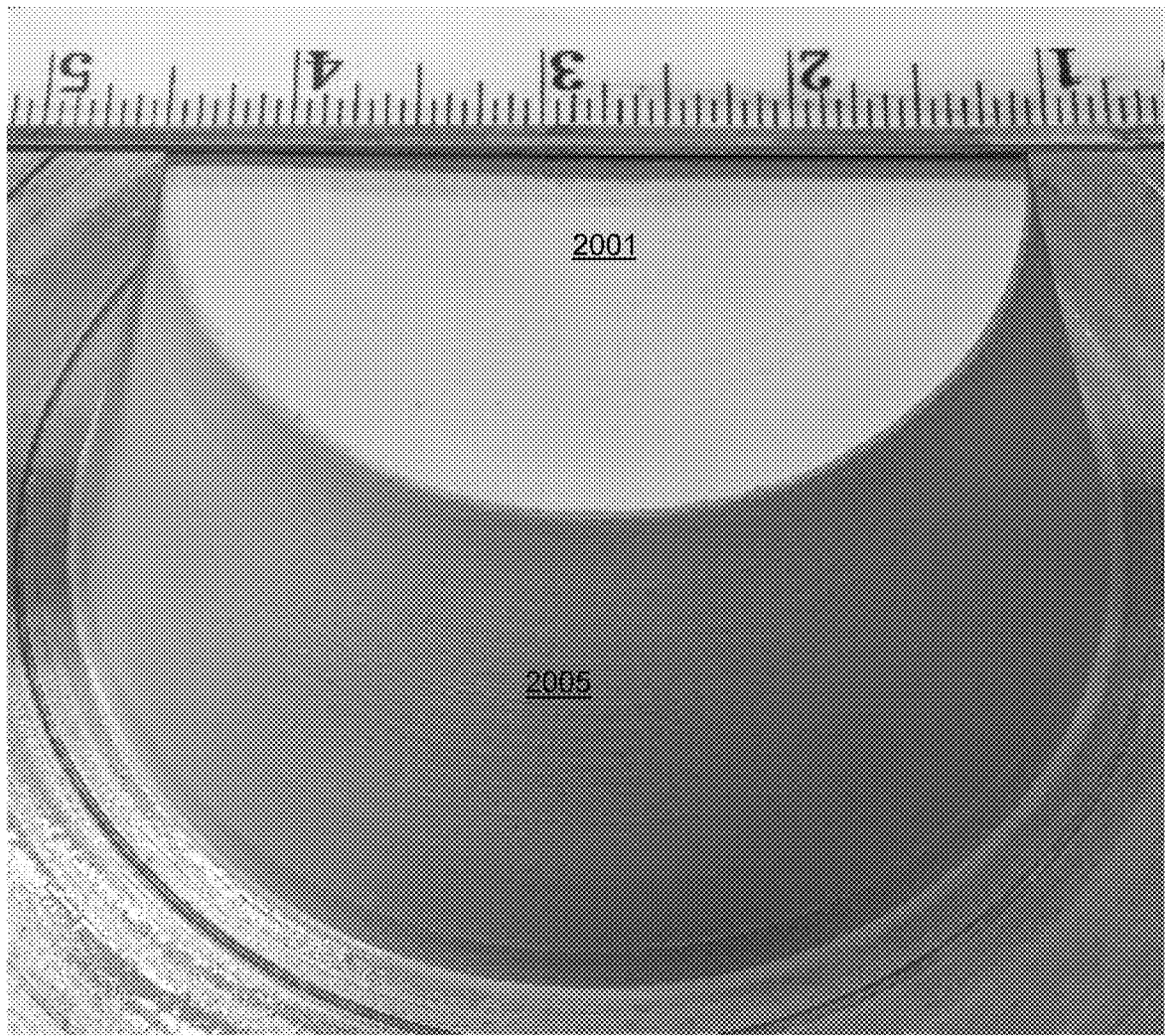
FIG. 20B is a top perspective view of the volumetric shape of FIG. 20A.
Figure 20C:
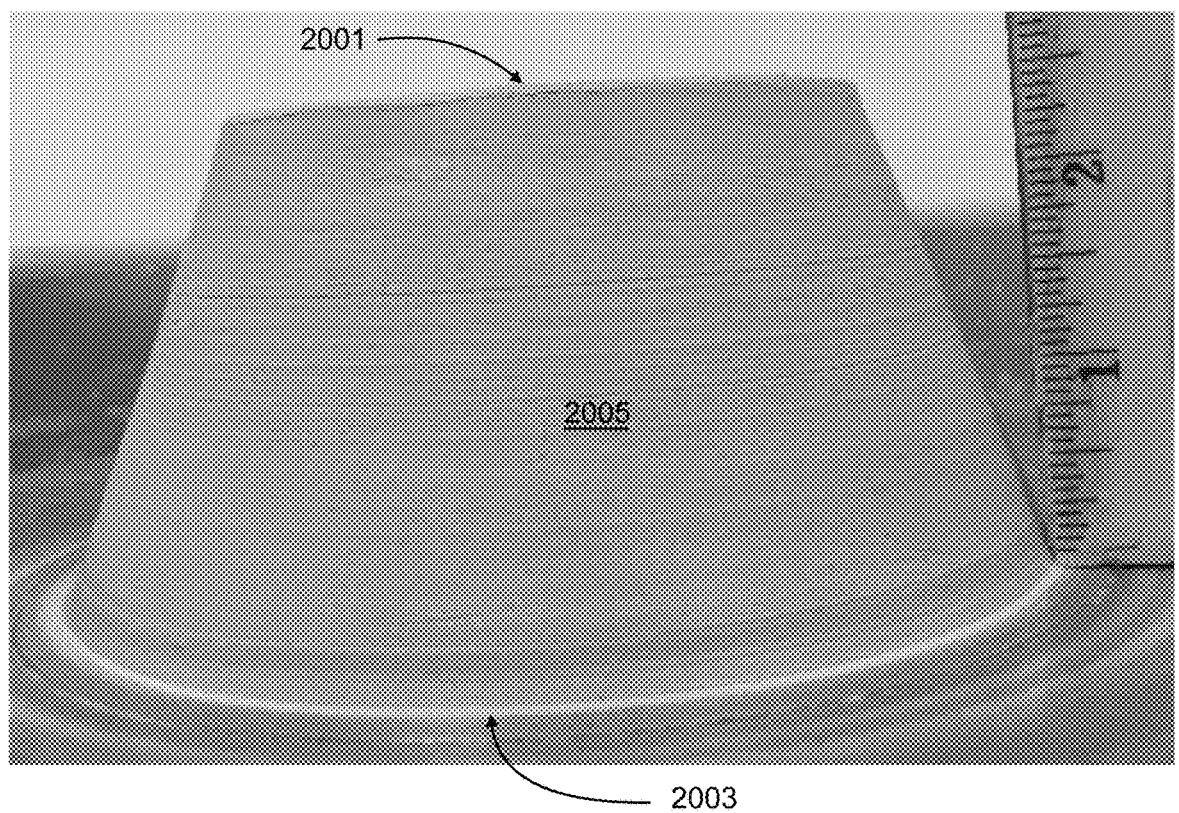
FIG. 20C is a side perspective view of the volumetric shape of FIG. 20A.

In FIGS. 20A to 20C there is provided a conical shape having a flat top 2001 and a flat bottom 2003, and a side wall 2005. The shape as no surface openings in the top, bottom or side. The diameter of the top is about 3¾ inches and the diameter of the bottom is about 4¼ inches. The height is 2½ inches. Other sizes for this shape are contemplated, including for example a height of about 1 to 6 inches and diameters of about 2 to 12 inches; and a height of about ½ to 7 inches and diameters of about ½ to about 17.

Example 20

Figure 7:
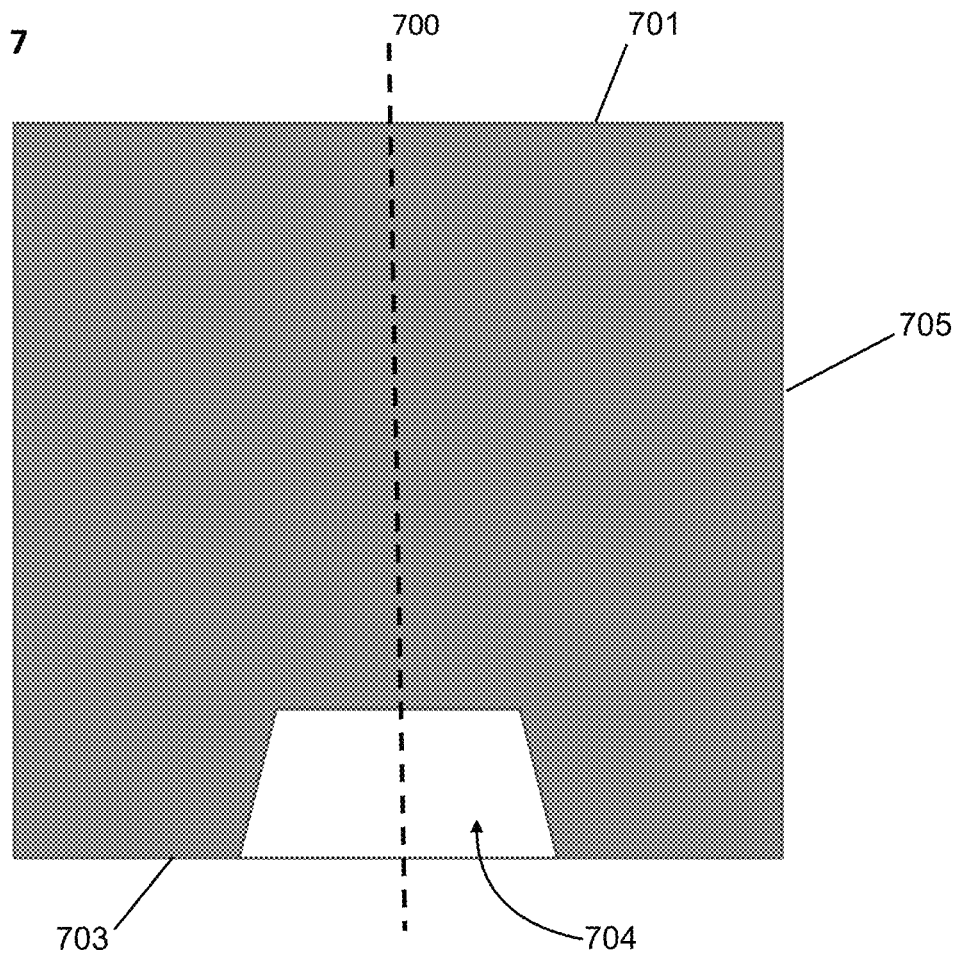
FIG. 7 is a schematic cross sectional view of an embodiment of a volumetric shape in accordance with the present inventions.

Turning to FIG. 7 there is provided a cross sectional schematic of a cylindrical shape. The shape has a top 701, a side 705 and a bottom 703. The bottom has opening 704. It being understood that the schematic would be rotated about axis 700 to provide the 3-D shape. Sizes for this shape, including for example a height of ½ to 7 inches and diameters of about ½ to about 17 inches, other sizes are also contemplated.

Example 21

Figure 8:
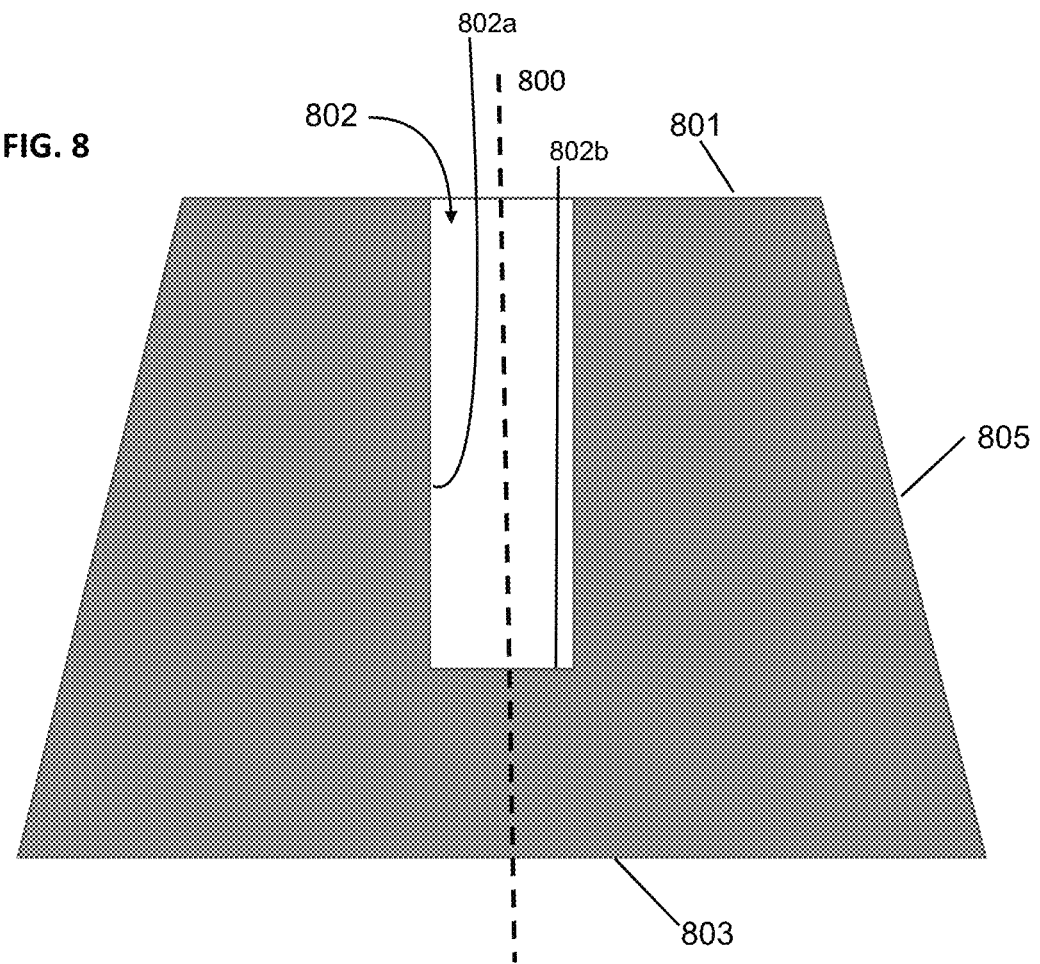
FIG. 8 is a schematic cross sectional view of an embodiment of a volumetric shape in accordance with the present inventions.

Turning to FIG. 8 there is provided a cross sectional schematic of a conical shape with a top opening. The shape has a flat top 801, a flat bottom 803 and side or outer wall 805. There is an opening 802 in the top 801 that extends down into the shape, at least 40%, at least 50%, at least 60% and at least 80% of the shapes height. The opening 802 has a side wall 802a, that is cylindrical, and a bottom surface 802b that is circular. It being understood that the schematic would be rotated about axis 800 to provide the 3-D shape. Sizes for this shape, including for example a height of ½ to 7 inches and diameters of about ½ to about 17 inches, other sizes are also contemplated.

Example 22

Turning to FIG. 9 there is provided a cross sectional schematic of a cylindrical shape with a central through opening 902. Thus, the opening 902 extends from the top through the bottom of the shape. In this manner the shape could be viewed as an annular. It being understood that the schematic would be rotated about axis 900 to provide the 3-D shape. Sizes for this shape, including for example a height of ½ to 7 inches and diameters of about ½ to about 17 inches, other sizes are also contemplated.

Example 23

Turning to FIG. 10 there is provided a cross sectional schematic of a conical shape with a central through opening. The shape has a flat top surface 1001, a flat bottom surface 1003, and a side wall 1002. The shape has a central opening 1005 that extends through the top 1001 and bottom 1003 surfaces. The opening 1005a has a side wall 1005a. The opening 1005 does not have a bottom. It being understood that the schematic would be rotated about axis 1000 to provide the 3-D shape. Sizes for this shape, including for example a height of ½ to 7 inches and diameters of about ½ to about 17 inches, other sizes are also contemplated.

Example 24

Figure 11:
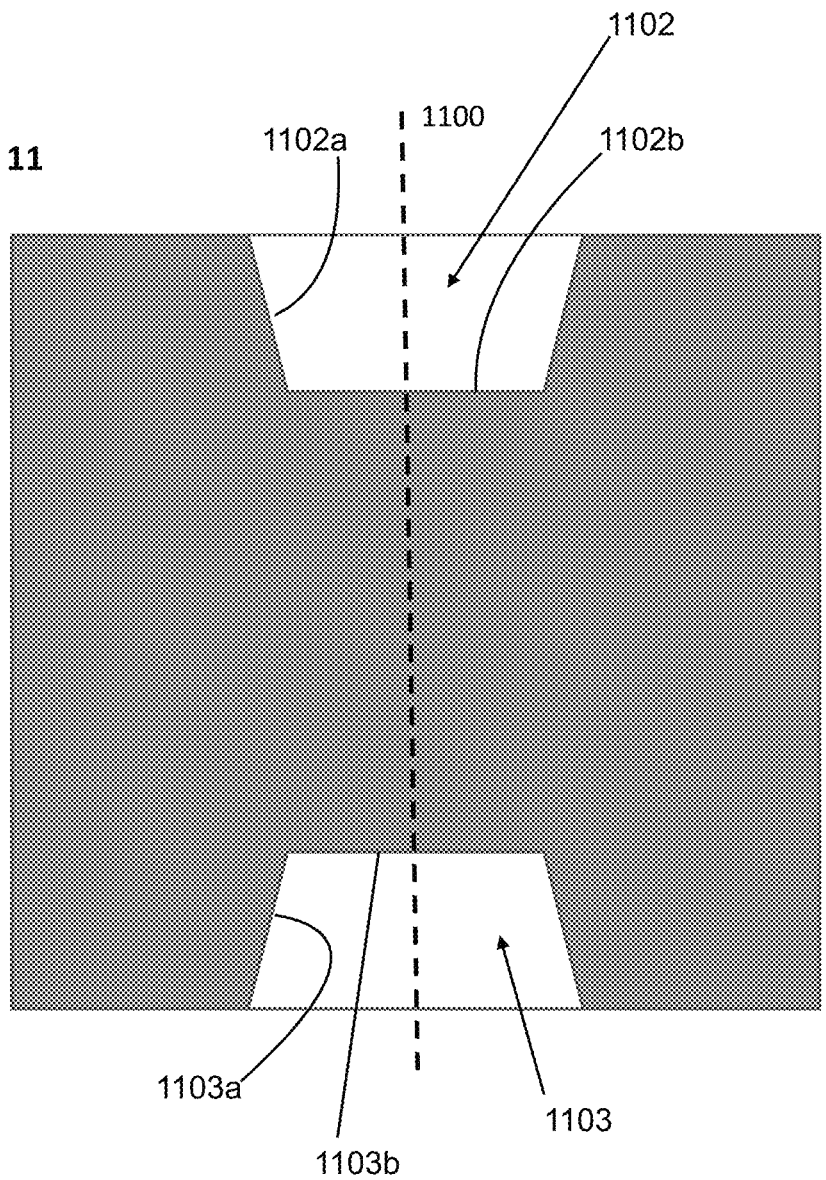
FIG. 11 is a schematic cross sectional view of an embodiment of a volumetric shape in accordance with the present inventions.

Turning to FIG. 11 there is provided a cross sectional schematic of a cylindrical shape with top and bottom openings. The shape has a top opening 1102, which has a conical side wall 1102a and a circular bottom surface 1102b. The shape has a bottom opening 1103, which has a conical side wall 1103a and a bottom surface 1103b. It being understood that the schematic would be rotated about axis 1100 to provide the 3-D shape. Thus, bottom surfaces 1103b, 1102b are circular. Sizes for this shape, including for example a height of ½ to 7 inches and diameters of about ½ to about 17 inches, other sizes are also contemplated.

Example 25

Figure 12:
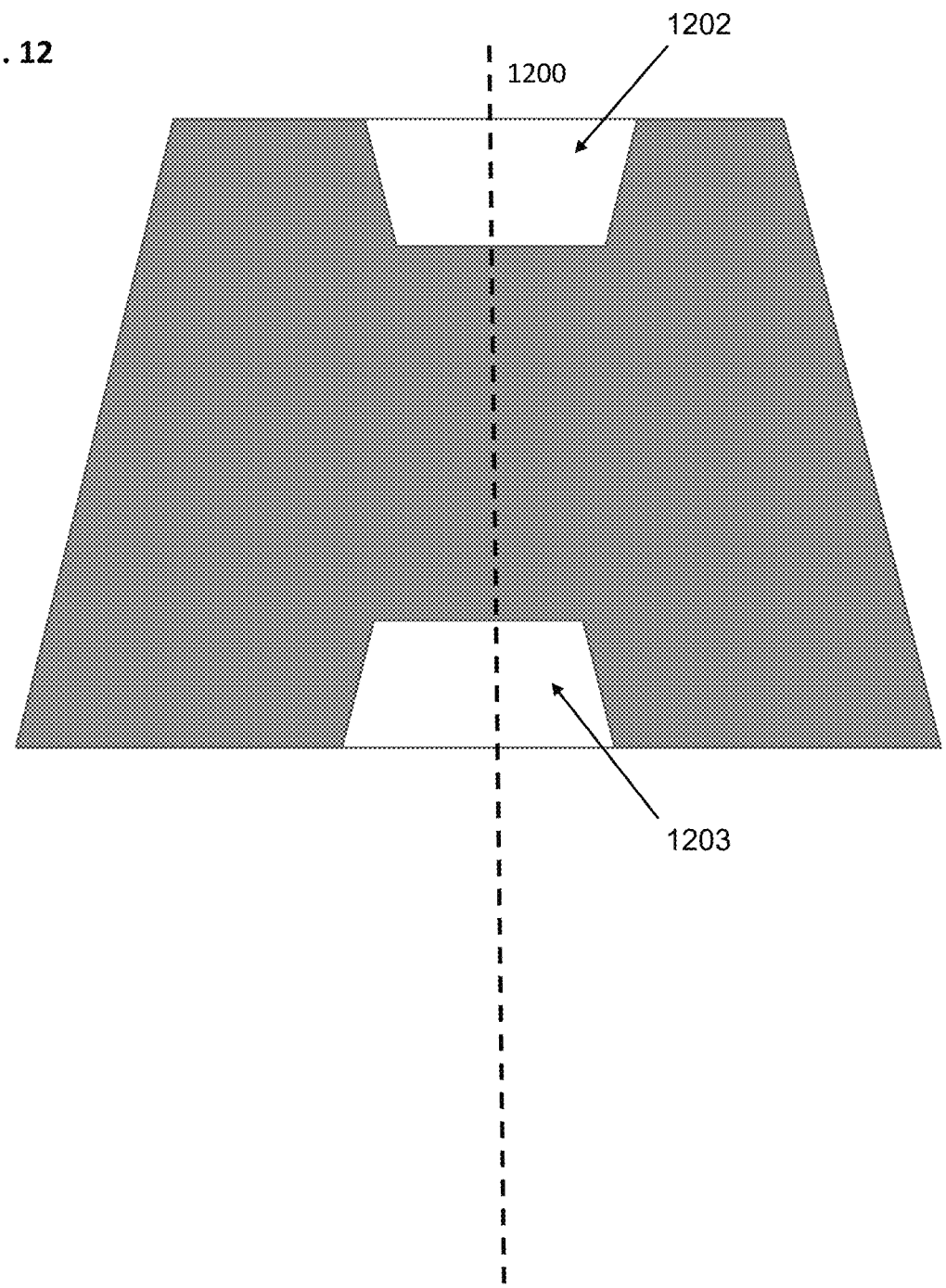
FIG. 12 is a schematic cross sectional view of an embodiment of a volumetric shape in accordance with the present inventions.

Turning to FIG. 12 there is provided a cross sectional schematic of a conical shape with top 1202 and bottom 1203 openings. It being understood that the schematic would be rotated about axis 1200 to provide the 3-D shape. Sizes for this shape, including for example a height of ½ to 7 inches and diameters of about ½ to about 17 inches, other sizes are also contemplated.

Example 26

Figure 13:
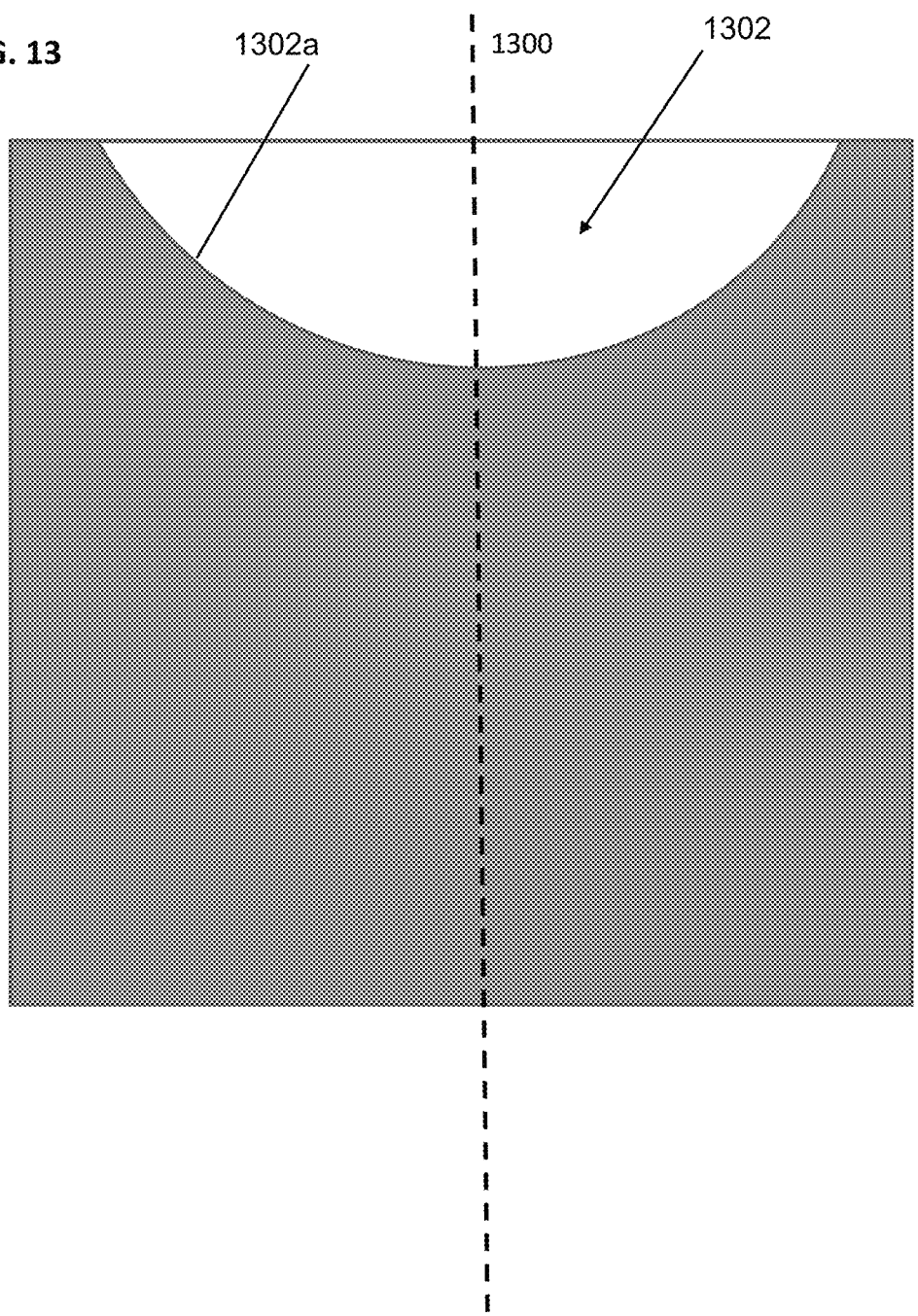
FIG. 13 is a schematic cross sectional view of an embodiment of a volumetric shape in accordance with the present inventions.

Turning to FIG. 13 there is provided a cross sectional schematic of a cylindrical shape with a spherical top opening 1302. The opening 1302, as a surface 1302a that forms both the bottom and side walls of the opening. It being understood that the schematic would be rotated about axis 1300 to provide the 3-D shape. Sizes for this shape, including for example a height of ½ to 7 inches and diameters of about ½ to about 17 inches, other sizes are also contemplated.

Example 27

Figure 14:
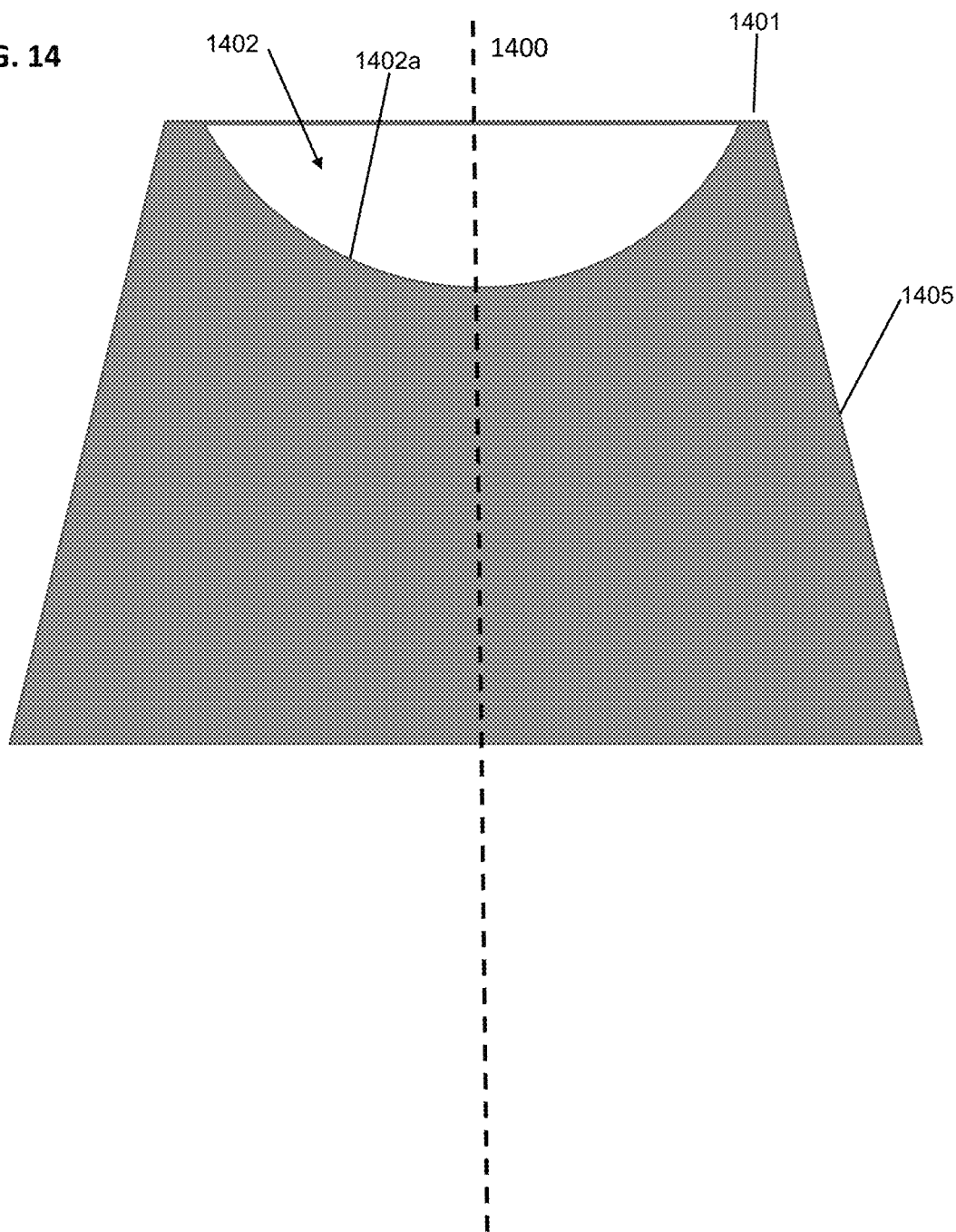
FIG. 14 is a schematic cross sectional view of an embodiment of a volumetric shape in accordance with the present inventions.

Turning to FIG. 14 there is provided a cross sectional schematic of a conical shape with a spherical top opening 1402. The shape has a top 1401, a side 1405. The spherical top opening 1402 has a surface 1402a that forms both the sidewall and bottom of the opening 1402. It being understood that the schematic would be rotated about axis 1400 to provide the 3-D shape. Sizes for this shape, including for example a height of ½ to 7 inches and diameters of about ½ to about 17 inches, other sizes are also contemplated.

Example 28

Figure 15:
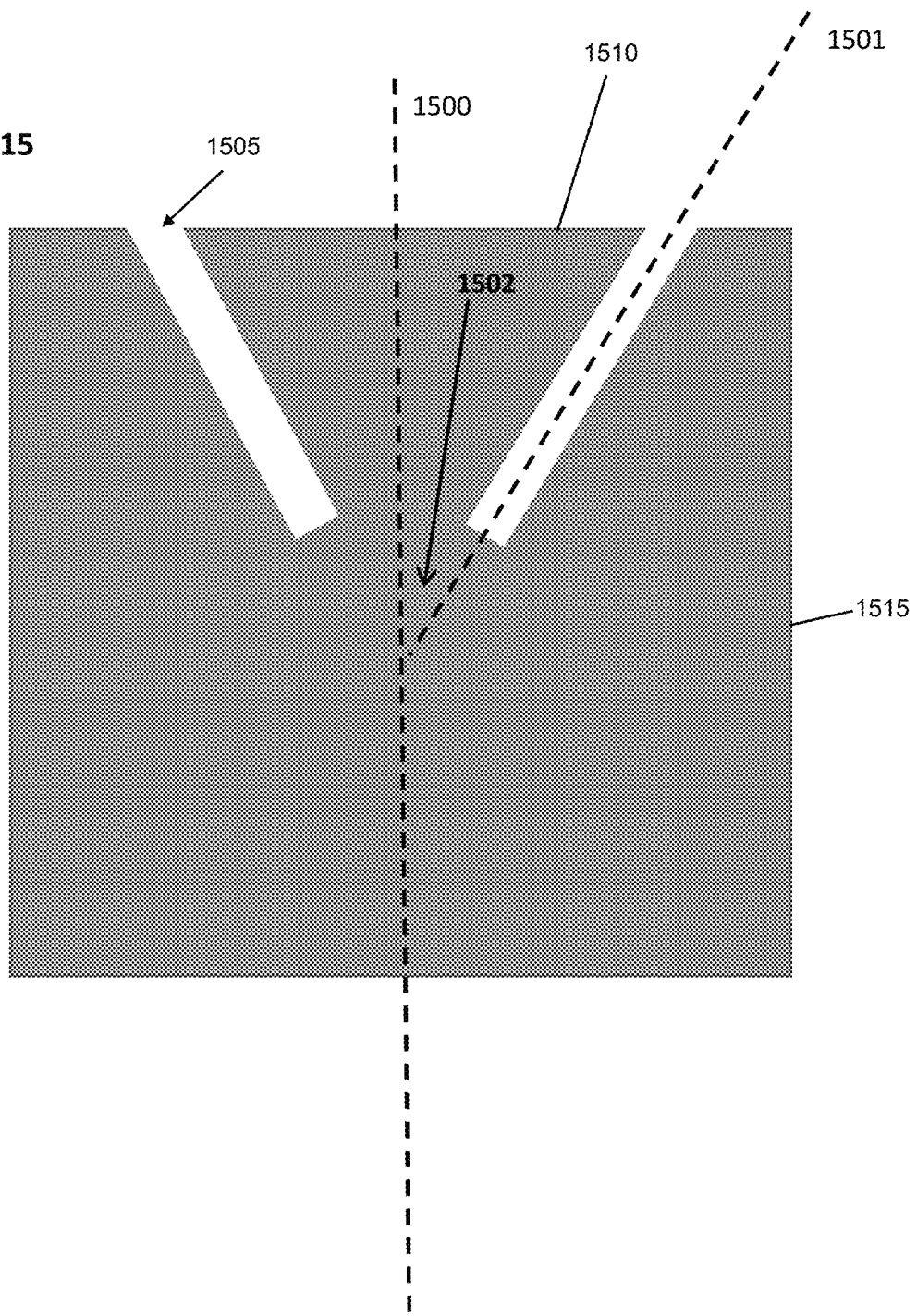
FIG. 15 is a schematic cross sectional view of an embodiment of a volumetric shape in accordance with the present inventions.

Turning to FIG. 15 there is provided a cross sectional schematic of a cylindrical shape with a top annular opening 1505. The shape has a side wall surface 1515 and a top, or top surface, 1510 It being understood that the schematic would be rotated about axis 1500 to provide the 3-D shape. The angle 1502 of the annular channel 1505 is determined by the angle formed between line 1501 (which is the centerline of the cross section of the channel 1505) and axis 1501. This angle in FIG. 4F is at 60° in the embodiment of this figure, and can range from about can range from about 89° to about 0° and preferably from about 80° to about 40°. Sizes for this shape, including for example a height of ½ to 7 inches and diameters of about ½ to about 17 inches, other sizes are also contemplated, as well as, all values within the ranges of these sizes.

Example 29

A granular polymer derived SiC having purity of 7-nines and having a primary particle $D_{50}$ size of 0.2 µm is made into a volumetric shape as follows.

Polysilocarb derived SiC is ground to 0.2 um and compacted in a cold press into a shape with a suitable binder for pre-curing strength (e.g., the ability to handle the shape from pressing to and including curing operations). The sample is then placed into a hot isostatic press and heated to 2100 C and 30000 psi in an argon atmosphere and held for up to 5 hours before cooling slowly back down.

The shape can be any of the shapes of Examples 13 to 28.

Example 30

A granular polymer derived SiC having purity of 7-nines and having a primary particle $D_{50}$ size of 1.0 µm is made into any of the shapes of Examples 13 to 28.

Example 31

A granular polymer derived SiC having purity of 7-nines and having a primary particle $D_{50}$ size of 1.5 µm is made into any of the shapes of Examples 13 to 28.

Example 32

Polysilocarb derived SiC particles, having an average diameter of about 0.4 µm, are essential free from an oxide layer on their surface. The SiC particles are formed into any of the shapes of Examples 13 to 28 using an oxygen free binder.

Example 33

Polysilocarb derived SiC particles, having an average diameter of about 0.6 µm, are essential free from an oxide layer on their surface. The SiC particles are formed into any of the shapes of Examples 13 to 28 using a binder containing only carbon and hydrogen.

Example 34

Polysilocarb derived SiC particles, having an average diameter of about 0.4 to 0.6 µm, are essential free from an oxide layer on their surface. The SiC particles are formed into any of the shapes of Examples 13 to 28 using a binder that contains hydrogen and carbon, but is free from oxygen.

Example 35

SiC particles are formed into any of the shapes of Examples 13 to 28 using polysilocarb binders. The tablets have a modulus was 2 MPa with a compressive strength of 7.47 MPa.

If greater strengths are required, the SiC volumetric shape can be treated to a high temperature sintering operation (such as Hot Pressing or Hot Isostatic Pressing) before use. Such operations, tend to provide lower porosity structures, e.g., porosity <20%.

Example 36

Volumetric shapes any of the shapes of Examples 13 to 28 are made from 85% to 95% of polysilocarb derived SiC powder and 13% to 5% of 41/59 MH/TV polysilocarb precursor.

Example 37

99% to 88% of polysilocarb derived SiC powder is mixed with 1% to 12% of an ultrapure hydrocarbon wax (or polyethylene or polymer/oil having only C and H atoms). This mixture is melted and mixed together, before pressing into a pill, any of the shapes of Examples 13 to 28, or other volumetric shape.

Example 38

100% to 95% polysilocarb derived SiC powder is mixed with 0% to 5% ultrapure hydrocarbon binder, and is pressed using spark plasma sintering, yielding an SiC volumetric shape of any of the shapes of Examples 13 to 28, have about 0-5% excess carbon content, when partially sintered.

Example 40

The volumetric shapes of Examples 13-38 are used in a vapor deposition apparatus to grow a boule of single crystal SiC. The boules can be 3 inches, 4 inches, 6 inches, 8 inches and larger, as well as all values within the ranges of these sizes.

The vapor deposition process for the growth of 3 inch boules is outlined as follows:
1. Cleaning of graphite parts and isolations:
    vacuum at minimum of 1000° C. for at least 3 h.
2. Heating up:
    2100-2250° C. at top of crucible and pressure of 500-700 Torr, Gas flow: 100 sccm Ar
    Heating up in 10 h; reaching a temperature of, e.g., 2130-2145° C.;
    Lowering the temperature to 2073° C.
3. Start growth cycle:
    Decreasing pressure to desired growth pressure (0.1 to 50 Torr) to initiate sublimation and growth, then decrease pressure to 15 Torr
4. Growth cycle:
    Growing at 2145° C. (measurement point at top of crucible)
5. End of growth cycle
    Back filling reactor chamber with 500-700 Torr Argon
6. Cool down
    Cooling down to about ambient in 40 h The growth cycle time was 73 hours, growth rate was an average of 360 μm/h, and the height of the boule was 26.8 mm. About 67% of the source material was consumed (204 g left from 610 g of starting material).

Example 40a

The boules of example 40 are cut into wafers using a wafer cutting apparatus, such as, a diamond wire saw, multi-wire diamond saw, slurry wire saw, other cutting apparatus with larger kerf loss such as a bladed diamond cut-off saw or abrasive saw or other apparatus with smaller kerf loss such as optical laser slicing—reported by Disco Tech (KABRA technique, see, e.g., www.discousa.com. The wafers can also be cut by Takatori's multi-wire saws, which are distributed in the US under the brand GTI TECHNOLOGIES. The cut wafer can be ground, if need be, using grinders. Suitable grinders, for example, are provided by REVASUM. See, e.g., www.revasum.com.

Example 40b

The wafers of Example 40a are polished on one side and preferably polished on both sides. Polishing equipment, for example, would include chemical mechanical polishing (CMP), lapping, grinding, slurry polishing, and drying polishing. Suitable polishers, for example, are provided by GigaMat Technologies, See, e.g., www.gigamat.com.

Example 40c

The wafers of Example 40b have circuits printed on them (e.g., by epitaxy or semiconductor wafer processing) to form electronics components, e.g., circuits, circuitry, integrated circuits. For a 6 inch wafer about 300-5000 individual components can be formed. The present methods and resulting wafers provide about 3× to 4× more usable components, i.e., number of usable devices, than can be formed from current wafers made from current starting materials and processes (i.e., wafers and processes prior to the present inventions). For example, about 20% to 60%, about 20% to about 50%, about 20% or more of the devices made from current wafers are unusable. The present devices, made from the present wafers can have from about 80% to 100% of these devices being operable, about 80% or more, about 90% or more, about 95% or more, about 99% or more of these devices being operable.

Example 40d

The electronics components of Example 40c are assembled into electronics modules. A module can contain from a few, e.g., 1-10 of the electronics components to about 100 s and about 1000 s of the electronic components. A module could be for example, a power transformer unit, a metal oxide semiconductor field effect transistors (MOSFETs), a junction field effect transistors (JFETs), insulated gate bipolar transistors (IGBTs) and a bipolar junction transistors (BJTs).

Example 40e

The modules of Example 40d are assembled into a power block. From about 1 to about 100 modules can be used in the power block.

Example 40f

The modules of 40d or the power blocks of Example 40e, are assembled into a system, which for example could be a solar inverter, a wind converter, a hybrid car, a data center, a medical imaging device, such as an MRI.

Example 40g

The process of Example 40 having a starting material that is 6-9 s pure, having a directed flux channel in a volumetric shape and having 80% of the starting material consumed during the growth cycle.

Example 40h

The process of Example 40 having a starting material that is 6-9 s pure, having a directed flux channel in a volumetric shape and having 90% of the starting material consumed during the growth cycle.

Example 40i

The process of Example 40 having a starting material that is 6-9 s pure, having a directed flux channel in a volumetric shape and having 95% of the starting material consumed during the growth cycle.

Example 41

The wafers of Example 40a have the features of a DOW CORNING PRIME ULTRA SiC wafer. 100 mm wafers have MPD (≤0.1 cm-2), TSD (≤300 cm-2) and BPD (≤500 cm-2). 150 mm wafers MPD (≤1 cm-2), TSD (≤200 cm-2) and BPD (≤3,000 cm-2).

Example 42

The wafers of Example 40a have the following features 150 mm wafers have MPD (≤0.1 cm-2), TSD (≤300 cm-2) and BPD (≤500 cm-2).

Example 43

The wafers of Example 40a have resistivities greater than about 10,000 ohm-cm at 20° C.

For the forgoing examples, it is understood that in preferred embodiments the openings are in the top, the bottom or both; and these openings are coaxial with the axis of the shape and the opens are each of the same general type, e.g., spherical on both top and bottom. In should be understood, that in embodiments the openings may be in the side wall, they may be the same or different from the top, the bottom or the side wall. The openings may be coaxial or they be off axis, with respect to the axis of the shape.

Overview—Polysilocarb Formulations, Methods & Materials

Formulations, processes, methods of making, and compositions for various polysilocarbs are taught and disclosed in U.S. Pat. Nos. 9,499,677, 9,481,781 and US Patent Publication Nos. 2014/0274658, 2014/0323364, 2015/0175750, 2016/0207782, 2016/0280607, 2017/0050337, the entire disclosure of each of which are incorporated herein by reference.

General Processes for Obtaining a Polysilocarb Precursor

Typically, polymer derived ceramic precursor formulations, and in particular, polysilocarb precursor formulations, can generally be made by three types of processes, although other processes, and variations and combinations of these processes may be utilized. These processes generally involve combining precursors to form a precursor formulation. One type of process generally involves the mixing together of precursor materials in preferably a solvent free process with essentially no chemical reactions taking place, e.g., "the mixing process." The other type of process generally involves chemical reactions, e.g., "the reaction type process," to form specific, e.g., custom, precursor formulations, which could be monomers, dimers, trimers and polymers. A third type of process has a chemical reaction of two or more components in a solvent free environment, e.g., "the reaction blending type process." Generally, in the mixing process essentially all, and preferably all, of the chemical reactions take place during subsequent processing, such as during curing, pyrolysis and both.

It should be understood that these terms—reaction type process, reaction blending type process, and the mixing type process—are used for convenience and as a short hand reference. These terms, i.e., process types, are not, and should not be viewed as, limiting. For example, the reaction type process can be used to create a precursor material that is then used in the mixing type process with another precursor material.

These process types are described in this specification, among other places, under their respective headings. It should be understood that the teachings for one process, under one heading, and the teachings for the other processes, under the other headings, can be applicable to each other, as well as, being applicable to other sections, embodiments and teachings in this specification, and vice versa. The starting or precursor materials for one type of process may be used in the other type of processes. Further, it should be understood that the processes described under these headings should be read in context with the entirely of this specification, including the various examples and embodiments.

It should be understood that combinations and variations of these processes may be used in reaching a precursor formulation, and in reaching intermediate, end, and final products. Depending upon the specific process and desired features of the product, the precursors and starting materials for one process type can be used in the other. A formulation from the mixing type process may be used as a precursor, or component in the reaction type process, or the reaction blending type process. Similarly, a formulation from the reaction type process may be used in the mixing type process and the reaction blending process. Similarly, a formulation from the reaction blending type process may be used in the mixing type process and the reaction type process. Thus, and preferably, the optimum performance and features from the other processes can be combined and utilized to provide a cost effective and efficient process and end product. These processes provide great flexibility to create custom features for intermediate, end, and final products, and thus, any of these processes, and combinations of them, can provide a specific predetermined product. In selecting which type of process is preferable, factors such as cost, controllability, shelf life, scale up, manufacturing ease, etc., can be considered.

The precursor formulations may be used to form a "neat" material (by "neat" material it is meant that all, and essentially all of the structure is made from the precursor material or unfilled formulation; and thus, for example, there are no fillers or reinforcements). The precursor formulations may be used to form a filled material, e.g., having an additive or other material in addition to the precursors. They may be used to form composite materials, e.g., structures or coatings having other materials such as reinforcements in them. They may be used to form non-reinforced materials, which are materials that are made of primarily, essentially, and preferably only from the precursor materials, e.g., minimally filled materials where the filler is not intended to add or enhance strength, and unfilled materials. They may be sued to form reinforced materials, for example materials having fibers or other materials to add strength, abrasion resistance, durability, or other features or properties, that generally are viewed as strength related in a broad sense.

In general, types of filler material include, for example: inert fillers, such as inorganic materials that do not react with the SiOC matrix during curing, pyrolysis or use; reactive fillers, such as zirconium, aluminum hydroxide, and boron compounds that react with the SiOC matrix during curing, pyrolysis, use, or combinations of these; and, active fillers, such as materials that are released during the use of the end product to provide specific features to that product, e.g., lubricant. A filler may come under more than one of these types.

The filler material may also be made from, or derived from the same material as the formulation that has been formed into a cured or pyrolized solid, or it may be made from a different precursor formulation material, which has been formed into a cured solid or semi-solid, or pyrolized solid.

The polysilocarb formulation and products derived or made from that formulation may have metals and metal complexes. Thus, metals as oxides, carbides or silicides can be introduced into precursor formulations, and thus into a silica matrix in a controlled fashion. For example, organometallic, metal halide (chloride, bromide, iodide), metal alkoxide and metal amide compounds of transition metals can be copolymerized in the silica matrix, through incorporation into a precursor formulation.

The filler material can impart, regulate or enhance, features and properties, for example, electrical resistance, magnetic capabilities, band gap features, p-n junction features, p-type features, n-type features, dopants, electrical conductivity, semiconductor features, anti-static, optical properties (e.g., reflectivity, refractivity and iridescence), chemical resistivity, corrosion resistance, wear resistance, abrasions resistance, thermal insulation, UV stability, UV protective, and other features or properties that may be desirable, necessary, and both, in the end product or material.

Thus, filler materials could include copper lead wires, thermal conductive fillers, electrically conductive fillers, lead, optical fibers, ceramic colorants, pigments, oxides, dyes, powders, ceramic fines, polymer derived ceramic particles, pore-formers, carbosilanes, silanes, silazanes, silicon carbide, carbosilazanes, siloxane, metal powders, ceramic powders, metals, metal complexes, carbon, tow, fibers, staple fibers, boron containing materials, milled fibers, glass, glass fiber, fiber glass, and nanostructures (including nanostructures of the forgoing) to name a few. For example, crushed, polymer derived ceramic particles, e.g., fines or beads, can be added to a polysilocarb formulation and then cured to form a filled cured plastic material, which has significant fire resistant properties as a coating or in a device or component of a device.

The polysilocarb precursor formulations may be used with reinforcing materials to form composite layers or coatings. Thus, for example, the formulation may be flowed into, impregnated into, absorbed by or otherwise combined with a thin reinforcing material, such as carbon fibers, glass fiber, woven fabric, non-woven fabric, copped fibers, fibers, rope, braided structures, ceramic powders, glass powders, carbon powders, graphite powders, ceramic fibers, metal powders, carbide pellets or components, staple fibers, tow, nanostructures of the above, PDCs, any other material that meets the temperature requirements of the process and end product, and combinations and variations of these. Thus, for example, the reinforcing materials may be any of the high temperature resistant reinforcing materials currently used, or capable of being used with, existing plastics and ceramic composite materials. Additionally, because the polysilocarb precursor formulation may be formulated for a lower temperature cure (e.g., SATP) or a cure temperature of for example about 37.8° C. (100° F.) to about 204.4° C. (400° F.), the reinforcing material may be polymers, organic polymers, such as nylons, polypropylene, and polyethylene, as well as aramid fibers, such as NOMEX or KEVLAR.

The reinforcing material may also be made from, or derived from the same material as the formulation that has been formed into a fiber, cured into a solid, pyrolized into a ceramic, or it may be made from a different precursor formulation material, which has been formed into a fiber, pyrolized into a ceramic and combinations and variations of these. In addition to ceramic fibers derived from the precursor formulation materials that may be used as reinforcing material, other porous, substantially porous, and non-porous ceramic structures derived from a precursor formulation material may be used.

The polysilocarb material (e.g., precursor batch, precursor, formulation, bulk liquid, etc.), can have various inhibitors, catalysts and initiator present that inhibit, regulate, or promote curing, under predetermined conditions. Thus, the polysilocarb coating material can have sufficient inhibitors present, or the absence of a catalyst, to provide the required shelf life for the material in storage.

The Mixing Type Process

Precursor materials may be a methyl hydrogen (methyl terminated hydride substituted polysiloxane), methyl hydrogen fluid (methyl terminated hydride methyl substitute polysiloxane, with little to no dimethyl groups) and substituted and modified methyl hydrogens, siloxane backbone materials, siloxane backbone additives, reactive monomers, reaction products of a siloxane backbone additive with a silane modifier or an organic modifier, and other similar types of materials, such as silane based materials, silazane based materials, carbosilane based materials, non-silicon based organic cross linkers, phenol/formaldehyde based materials, and combinations and variations of these. The precursors are preferably liquids at room temperature, although they may be solids that are melted, or that are soluble in one of the other precursors. (In this situation, however, it should be understood that when one precursor dissolves another, it is nevertheless not considered to be a "solvent" as that term is used with respect to the prior art processes that employ non-constituent solvents, e.g., solvents that do not form a part or component of the end product, are treated as waste products, and both.)

The precursors are mixed together in a vessel, preferably at room temperature. Preferably, little, and more preferably no solvents, e.g., water, organic solvents, polar solvents, non-polar solvents, hexane, THF, toluene, are added to this mixture of precursor materials. Preferably, each precursor material is miscible with the others, e.g., they can be mixed at any relative amounts, or in any proportions, and will not separate or precipitate. At this point the "precursor mixture" or "polysilocarb precursor formulation" is compete (noting that if only a single precursor is used the material would simply be a "polysilocarb precursor" or a "polysilocarb precursor formulation" or a "formulation"). Although complete, fillers and reinforcers may be added to the formulation. In preferred embodiments of the formulation, essentially no, and more preferably no chemical reactions, e.g., crosslinking or polymerization, takes place within the formulation, when the formulation is mixed, or when the formulation is being held in a vessel, on a prepreg, or over a time period, prior to being cured.

The precursors can be mixed under numerous types of atmospheres and conditions, e.g., air, inert, $N_2$, Argon, flowing gas, static gas, reduced pressure, elevated pressure, ambient pressure, and combinations and variations of these.

Additionally, inhibitors such as cyclohexane, 1-Ethynyl-1-cyclohexanol (which may be obtained from ALDRICH), Octamethylcyclotetrasiloxane (which may be viewed as a dilutant), and tetramethyltetravinylcyclotetrasiloxane, may be added to the polysilocarb precursor formulation, e.g., to form an inhibited polysilocarb precursor formulation. It should be noted that tetramethyltetravinylcyclotetrasiloxane may act as both a reactant and a reaction retardant (e.g., an inhibitor), depending upon the amount present and temperature, e.g., at room temperature it is a retardant and at elevated temperatures it is a reactant. Other materials, as well, may be added to the polysilocarb precursor formulation, e.g., a filled polysilocarb precursor formulation, at this point in processing, including fillers such as SiC powder, carbon black, sand, polymer derived ceramic particles, pigments, particles, nano-tubes, whiskers, or other materials, discussed in this specification or otherwise known to the arts. Further, a formulation with both inhibitors and fillers would be considered an inhibited, filled polysilocarb precursor formulation.

A catalyst or initiator may be used, and can be added at the time of, prior to, shortly before, or at an earlier time before the precursor formulation is formed or made into a structure, prior to curing. The catalysis assists in, advances, and promotes the curing of the precursor formulation to form a cured material or structure.

The catalyst can be any platinum (Pt) based catalyst, which can, for example, be diluted to ranges of: about 0.01 parts per million (ppm) Pt to about 250 ppm Pt, about 0.03 ppm Pt, about 0.1 ppm Pt, about 0.2 ppm Pt, about 0.5 ppm Pt, about 0.02 to 0.5 ppm Pt, about 1 ppm to 200 ppm Pt and preferably, for some applications and embodiments, about 5 ppm to 50 ppm Pt. The catalyst can be a peroxide based catalyst with, for example, a 10 hour half life above 90 C at a concentration of between 0.1% to 3% peroxide, and about 0.5% and 2% peroxide. It can be an organic based peroxide. It can be any organometallic catalyst capable of reacting with Si—H bonds, Si—OH bonds, or unsaturated carbon bonds, these catalysts may include: dibutyltin dilaurate, zinc octoate, peroxides, organometallic compounds of for example titanium, zirconium, rhodium, iridium, palladium, cobalt or nickel. Catalysts may also be any other rhodium, rhenium, iridium, palladium, nickel, and ruthenium type or based catalysts. Combinations and variations of these and other catalysts may be used. Catalysts may be obtained from ARKEMA under the trade name LUPEROX, e.g., LUPEROX 231; and from Johnson Matthey under the trade names: Karstedt's catalyst, Ashby's catalyst, Speier's catalyst. Transition metal catalysis, such as Fe catalysis, Ni catalysis, and Co catalysis, that for example are used in the growth of ordered and highly ordered carbon structures, such as carbon nanotubes, can also be used.

Further, custom and specific combinations of these and other catalysts may be used, such that they are matched to specific formulations, and in this way selectively and specifically catalyze the reaction of specific constituents. Moreover, the use of these types of matched catalyst-formulations systems, as well as, process conditions, may be used to provide predetermined product features, such as for example, pore structures, porosity, densities, density profiles, high purity, ultra high purity, and other morphologies or features of cured structures or materials, and in some instances the ceramics that are formed from the cured structures or materials.

In this mixing type process for making a precursor formulation, preferably chemical reactions or molecular rearrangements only take place during the making of the raw starting materials, the curing process, and in the pyrolizing process. Preferably, in the embodiments of these mixing type of formulations and processes, polymerization, cross-linking or other chemical reactions take place primarily, preferably essentially, and more preferably solely during the curing process.

The precursor may be a methyl terminated hydride substituted polysiloxane, which can be referred to herein as methyl hydrogen (MH), having the formula shown below.

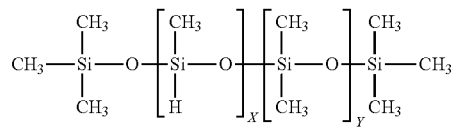

The MH, for example, may have a molecular weight ("mw" which can be measured as weight averaged molecular weight in amu or as g/mol) from about 400 mw to about 10,000 mw, from about 600 mw to about 3,000 mw, and may have a viscosity preferably from about 20 cps to about 60 cps. The percentage of methylsiloxane units "X" may be from 1% to 100%. The percentage of the dimethylsiloxane units "Y" may be from 0% to 99%. This precursor may be used to provide the backbone of the cross-linked structures, as well as, other features and characteristics to the cured preform and ceramic material. This precursor may also, among other things, be modified by reacting with unsaturated carbon compounds to produce new, or additional, precursors. Typically, methyl hydrogen fluid (MHF) has minimal amounts of "Y", and more preferably "Y" is for all practical purposes zero.

The precursor may be any of the following linear siloxane backbone materials.

The precursor may be a vinyl substituted polydimethyl siloxane, which formula is shown below.

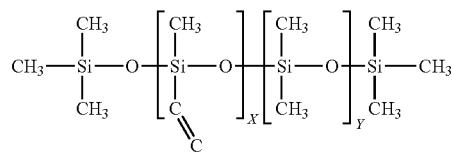

This precursor, for example, may have a molecular weight (mw) from about 400 mw to about 10,000 mw, and may have a viscosity preferably from about 50 cps to about 2,000 cps. The percentage of methylvinylsiloxane units "X" may be from 1% to 100%. The percentage of the dimethylsiloxane units "Y" may be from 0% to 99%. Preferably, X is about 100%. This precursor may be used to increase cross-link density and improve toughness, as well as, other features and characteristics to the cured preform and ceramic material.

The precursor may be a vinyl substituted and vinyl terminated polydimethyl siloxane, which formula is shown below.

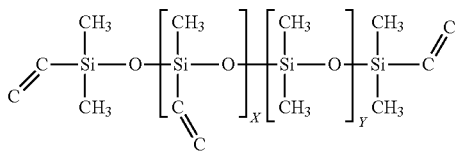

This precursor, for example, may have a molecular weight (mw) from about 500 mw to about 15,000 mw, and may preferably have a molecular weight from about 500 mw to 1,000 mw, and may have a viscosity preferably from about 10 cps to about 200 cps. The percentage of methylvinylsiloxane units "X" may be from 1% to 100%. The percentage of the dimethylsiloxane units "Y" may be from 0% to 99%. This precursor may be used to provide branching and decrease the cure temperature, as well as, other features and characteristics to the cured preform and ceramic material.

The precursor may be a vinyl substituted and hydrogen terminated polydimethyl siloxane, which formula is shown below.

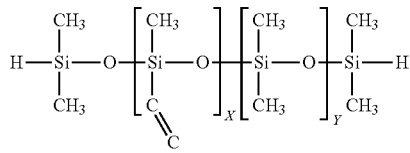

This precursor may have a molecular weight (mw) from about 300 mw to about 10,000 mw, and may preferably have a molecular weight from about 400 mw to 800 mw, and may have a viscosity preferably from about 20 cps to about 300 cps. The percentage of methylvinylsiloxane units "X" may be from 1% to 100%. The percentage of the dimethylsiloxane units "Y" may be from 0% to 99%. This precursor may be used to provide branching and decrease the cure temperature, as well as, other features and characteristics to the cured preform and ceramic material.

The precursor may be an allyl terminated polydimethyl siloxane, which formula is shown below.

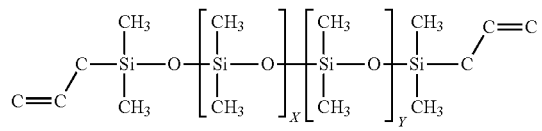

This precursor may have a molecular weight (mw) from about 400 mw to about 10,000 mw, and may have a viscosity preferably from about 40 cps to about 400 cps. The repeating units are the same. This precursor may be used to provide UV curability and to extend the polymeric chain, as well as, other features and characteristics to the cured preform and ceramic material.

The precursor may be a vinyl terminated polydimethyl siloxane (VT), which formula is shown below.

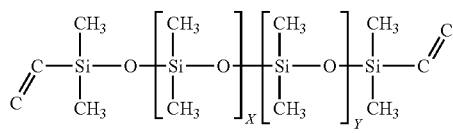

This precursor may have a molecular weight (mw) from about 200 mw to about 5,000 mw, and may preferably have a molecular weight from about 400 mw to 1,500 mw, and may have a viscosity preferably from about 10 cps to about 400 cps. The repeating units are the same. This precursor may be used to provide a polymeric chain extender, improve toughness and to lower cure temperature down to for example room temperature curing, as well as, other features and characteristics to the cured preform and ceramic material.

The precursor may be a silanol (hydroxy) terminated polydimethyl siloxane, which formula is shown below.

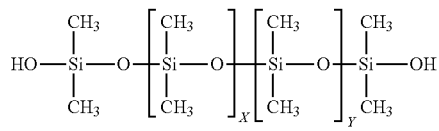

This precursor may have a molecular weight (mw) from about 400 mw to about 10,000 mw, and may preferably have a molecular weight from about 600 mw to 1,000 mw, and may have a viscosity preferably from about 30 cps to about 400 cps. The repeating units are the same. This precursor may be used to provide a polymeric chain extender, a toughening mechanism, can generate nano- and micro-scale porosity, and allows curing at room temperature, as well as other features and characteristics to the cured preform and ceramic material.

The precursor may be a silanol (hydroxy) terminated vinyl substituted dimethyl siloxane, which formula is shown below.

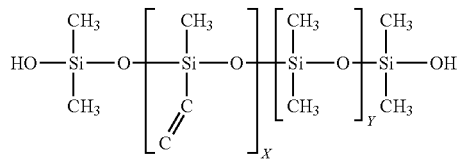

This precursor may have a molecular weight (mw) from about 400 mw to about 10,000 mw, and may preferably have a molecular weight from about 600 mw to 1,000 mw, and may have a viscosity preferably from about 30 cps to about 400 cps. The percentage of methylvinylsiloxane units "X" may be from 1% to 100%. The percentage of the dimethylsiloxane units "Y" may be from 0% to 99%. This precursor may be used, among other things, in a dual-cure system; in this manner the dual-cure can allow the use of multiple cure mechanisms in a single formulation. For example, both condensation type cure and addition type cure can be utilized. This, in turn, provides the ability to have complex cure profiles, which for example may provide for an initial cure via one type of curing and a final cure via a separate type of curing.

The precursor may be a hydrogen (hydride) terminated polydimethyl siloxane, which formula is shown below.

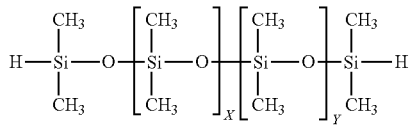

This precursor may have a molecular weight (mw) from about 200 mw to about 10,000 mw, and may preferably have a molecular weight from about 500 mw to 1,500 mw, and may have a viscosity preferably from about 20 cps to about 400 cps. The repeating units are the same. This precursor may be used to provide a polymeric chain extender, as a toughening agent, and it allows lower temperature curing, e.g., room temperature, as well as, other features and characteristics to the cured preform and ceramic material.

The precursor may be a di-phenyl terminated siloxane (which may also be referred to as phenyl terminated), which formula is shown below.

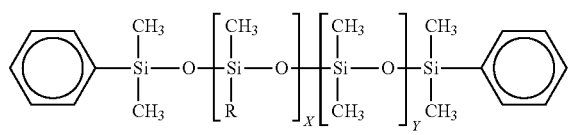

Where here R is a reactive group, such as vinyl, hydroxy, or hydride. This precursor may have a molecular weight (mw) from about 500 mw to about 2,000 mw, and may have a viscosity preferably from about 80 cps to about 300 cps. The percentage of methyl-R-siloxane units "X" may be from 1% to 100%. The percentage of the dimethylsiloxane units "Y" may be from 0% to 99%. This precursor may be used to provide a toughening agent, and to adjust the refractive index of the polymer to match the refractive index of various types of glass, to provide for example transparent fiberglass, as well as, other features and characteristics to the cured preform and ceramic material.

The precursor may be a mono-phenyl terminated siloxane (which may also be referred to as trimethyl terminated, phenyl terminated siloxane), which formulas are shown below.

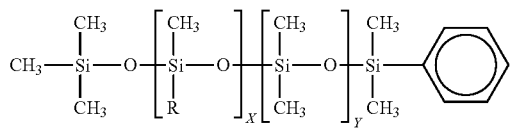

Where R is a reactive group, such as vinyl, hydroxy, or hydride. This precursor may have a molecular weight (mw) from about 500 mw to about 2,000 mw, and may have a viscosity preferably from about 80 cps to about 300 cps. The percentage of methyl-R-siloxane units "X" may be from 1% to 100%. The percentage of the dimethylsiloxane units "Y" may be from 0% to 99%. This precursor may be used to provide a toughening agent and to adjust the refractive index of the polymer to match the refractive index of various types of glass, to provide for example transparent fiberglass, as well as, other features and characteristics to the cured preform and ceramic material.

The precursor may be a diphenyl dimethyl polysiloxane, which formula is shown below.

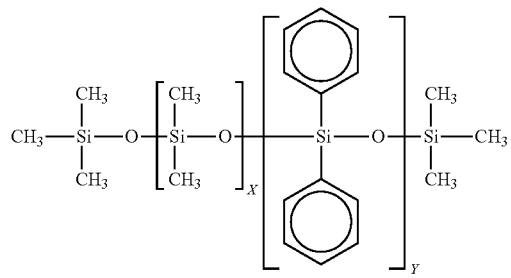

This precursor may have a molecular weight (mw) from about 500 mw to about 20,000 mw, and may have a molecular weight from about 800 to about 4,000, and may have a viscosity preferably from about 100 cps to about 800 cps. The percentage of dimethylsiloxane units "X" may be from 25% to 95%. The percentage of the diphenyl siloxane units "Y" may be from 5% to 75%. This precursor may be used to provide similar characteristics to the mono-phenyl terminated siloxane, as well as, other features and characteristics to the cured preform and ceramic material.

The precursor may be a vinyl terminated diphenyl dimethyl polysiloxane, which formula is shown below.

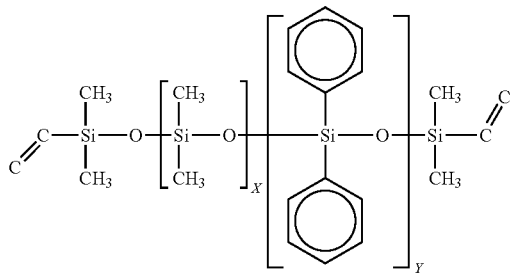

This precursor may have a molecular weight (mw) from about 400 mw to about 20,000 mw, and may have a molecular weight from about 800 to about 2,000, and may have a viscosity preferably from about 80 cps to about 600 cps. The percentage of dimethylsiloxane units "X" may be from 25% to 95%. The percentage of the diphenyl siloxane units "Y" may be from 5% to 75%. This precursor may be used to provide chain extension, toughening agent, changed or altered refractive index, and improvements to high temperature thermal stability of the cured material, as well as, other features and characteristics to the cured preform and ceramic material.

The precursor may be a hydroxy terminated diphenyl dimethyl polysiloxane, which formula is shown below.

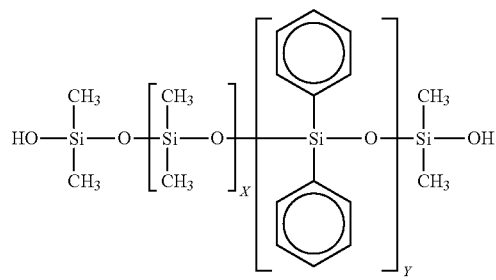

This precursor may have a molecular weight (mw) from about 400 mw to about 20,000 mw, and may have a molecular weight from about 800 to about 2,000, and may have a viscosity preferably from about 80 cps to about 400 cps. The percentage of dimethylsiloxane units "X" may be from 25% to 95%. The percentage of the diphenyl siloxane units "Y" may be from 5% to 75%. This precursor may be used to provide chain extension, toughening agent, changed or altered refractive index, and improvements to high temperature thermal stability of the cured material, can generate nano- and micro-scale porosity, as well as other features and characteristics to the cured preform and ceramic material.

This precursor may be a methyl terminated phenylethyl polysiloxane, (which may also be referred to as styrene vinyl benzene dimethyl polysiloxane), which formula is shown below.

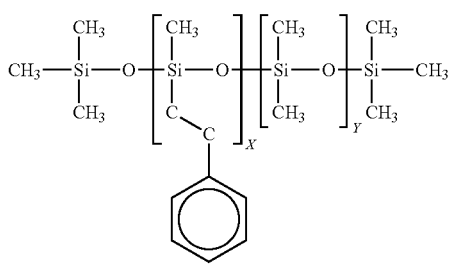

This precursor may have a molecular weight (mw) may be from about 800 mw to at least about 10,000 mw to at least about 20,000 mw, and may have a viscosity preferably from about 50 cps to about 350 cps. The percentage of styrene vinyl benzene siloxane units "X" may be from 1% to 60%. The percentage of the dimethylsiloxane units "Y" may be from 40% to 99%. This precursor may be used to provide improved toughness, decreases reaction cure exotherm, may change or alter the refractive index, adjust the refractive index of the polymer to match the refractive index of various types of glass, to provide for example transparent fiberglass, as well as, other features and characteristics to the cured preform and ceramic material.

The forgoing linear siloxane backbone materials, are by way of example, and it is understood that other similar linear siloxane backbone materials can also be used as precursors. More complex linear and branched siloxane backbone materials may be used as precursors, but are not preferred.

A variety of cyclosiloxanes can be used as precursors, and are reactive molecules, in the formulation. They can be described by the following nomenclature system or formula: $D_xD^*_y$, where "D" represents a dimethyl siloxy unit and "D*" represents a substituted methyl siloxy unit, where the "*" group could be vinyl, allyl, hydride, hydroxy, phenyl, styryl, alkyl, cyclopentadienyl, or other organic group, x is from 0-8, y is >=1, and x+y is from 3-8. Further, in this nomenclature system—D represents —$SiO_2$ groups, typically $Me_2SiO_2$, Q represents $SiO_4$, T represents —$SiO_3$ groups, typically $MeSiO_3$ and M represent —SiO groups, typically $Me_3SiO$.

The precursor batch may also: (i) contain non-silicon based precursors, such as non-silicon based cross-linking agents; (ii) be the reaction product of a non-silicon based cross linking agent and a silicon based precursor; and, (iii) combinations and variation of these. The non-silicon based cross-linking agents are intended to, and provide, the capability to cross-link during curing. For example, non-silicon based cross-linking agents include: cyclopentadiene (CP), methylcyclopentadiene (MeCP), dicyclopentadiene (DCPD), methyldicyclopentadiene (MeDCPD), tricyclopentadiene (TCPD), piperylene, divnylbenzene, isoprene, norbornadiene, vinylnorbornene, propenylnorbornene, isopropenylnorbornene, methylvinylnorbornene, bicyclononadiene, methylbicyclononadiene, propadiene, 4-vinylcyclohexene, 1,3-heptadiene, cycloheptadiene, 1,3-butadiene, cyclooctadiene and isomers thereof. Generally, any hydrocarbon that contains two (or more) unsaturated, C=C, bonds that can react with a Si—H, or other Si bond in a precursor, can be used as a cross-linking agent. Some organic materials containing oxygen, nitrogen, and sulphur may also function as cross-linking agents.

The amount of the non-silicon based cross-linking agent to the silicon based precursor can be from about 10% to 90% non-silicon based cross-linker to 10% to 90% silicon based precursor (preferably a silicon backbone, e.g., —Si—O— backbone, material). Thus, the ranges of amounts can be, for example: DCPD/MHF from 10/90 to 90/10, about 40/60 to 60/40, about 50/50, and combinations and variations of these ratios, as well as other ratios. A third and fourth precursor material may also be used. Thus, the ratio of non-silicon cross linker/silicon backbone precursor/third precursor, can be: form about 10% to about 80% non-silicon based cross linker; from about 10% to 80% silicon based precursor: and form about 0.1% to 40% third precursor. The ranges and amounts can be, for example: DCPD/MHF/$3^{rd}$ precursor from about 10/20/70 to 70/20/10, from about 10/20/70 to 10/70/20, from about 45/55/10 to about 55/45/10, from about 40/55/5 to about 55/40/5 and combinations and variations of these ratios as well as other ratios.

The precursor may be a reactive monomer. These would include molecules, such as tetramethyltetravinylcyclotetrasiloxane (TV), which formula is shown below.

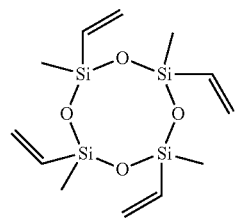 [SMILES: C=C[Si]1(C)O[Si](C)(C=C)O[Si](C)(C=C)O[Si](C)(C=C)O1]

This precursor may be used to provide a branching agent, a three-dimensional cross-linking agent, as well as, other features and characteristics to the cured preform and ceramic material. (It is also noted that in certain formulations, e.g., above 2%, and certain temperatures, e.g., about from about room temperature to about 60° C., this precursor may act as an inhibitor to cross-linking, e.g., in may inhibit the cross-linking of hydride and vinyl groups.)

The precursor may be a reactive monomer, for example, such as trivinyl cyclotetrasiloxane,

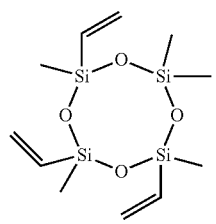 [SMILES: C=C[Si]1(C)O[Si](C)(C)O[Si](C)(C=C)O[Si](C)(C=C)O1]

divinyl cyclotetrasiloxane,

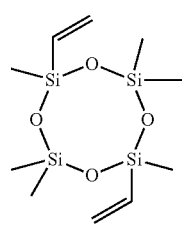

trivinyl monohydride cyclotetrasiloxane,

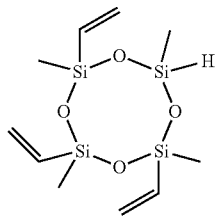 [SMILES: C=C[Si]1(C)O[SiH](C)O[Si](C)(C=C)O[Si](C)(C=C)O1]

divinyl dihydride cyclotetrasiloxane,

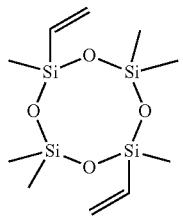

and a hexamethyl cyclotetrasiloxane, such as,

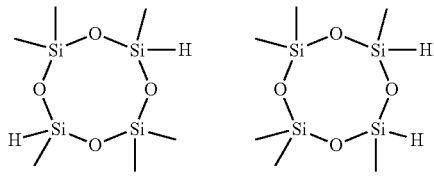

The precursor may be a silane modifier, such as vinyl phenyl methylsilane, diphenylsilane, diphenylmethylsilane, and phenylmethylsilane (some of which may be used as an end capper or end termination group). These silane modifiers can provide chain extenders and branching agents. They also improve toughness, alter refractive index, and improve high temperature cure stability of the cured material, as well as improving the strength of the cured material, among other things. A precursor, such as diphenylmethylsilane, may function as an end capping agent, that may also improve toughness, alter refractive index, and improve high temperature cure stability of the cured material, as well as, improving the strength of the cured material, among other things.

The precursor may be a reaction product of a silane modifier with a vinyl terminated siloxane backbone additive. The precursor may be a reaction product of a silane modifier with a hydroxy terminated siloxane backbone additive. The precursor may be a reaction product of a silane modifier with a hydride terminated siloxane backbone additive. The precursor may be a reaction product of a silane modifier with TV. The precursor may be a reaction product of a silane. The precursor may be a reaction product of a silane modifier with a cyclosiloxane, taking into consideration steric hindrances. The precursor may be a partially hydrolyzed tertraethyl orthosilicate, such as TES 40 or Silbond 40. The precursor may also be a methylsesquisiloxane such as SR-350 available from Momentive (previously from General Electric Company, Wilton, Conn.). The precursor may also be a phenyl methyl siloxane such as 604 from Wacker Chemie AG. The precursor may also be a methylphenylvinylsiloxane, such as H62 C from Wacker Chemie AG.

The precursors may also be selected from the following: SiSiB® HF2020, TRIMETHYLSILYL TERMINATED METHYL HYDROGEN SILICONE FLUID 63148-57-2; SiSiB® HF2050 TRIMETHYLSILYL TERMINATED METHYLHYDROSILOXANE DIMETHYLSILOXANE COPOLYMER 68037-59-2; SiSiB® HF2060 HYDRIDE TERMINATED METHYLHYDROSILOXANE DIMETHYLSILOXANE COPOLYMER 69013-23-6; SiSiB® HF2038 HYDROGEN TERMINATED POLYDIPHENYL SILOXANE; SiSiB® HF2068 HYDRIDE TERMINATED METHYLHYDROSILOXANE DIMETHYLSILOXANE COPOLYMER 115487-49-5; SiSiB® HF2078 HYDRIDE TERMINATED POLY(PHENYLDIMETHYLSILOXY) SILOXANE PHENYL SILSESQUIOXANE, HYDROGEN-TERMINATED 68952-30-7; SiSiB® VF6060 VINYLDIMETHYL TERMINATED VINYLMETHYL DIMETHYL POLYSILOXANE COPOLYMERS 68083-18-1; SiSiB® VF6862 VINYLDIMETHYL TERMINATED DIMETHYL DIPHENYL POLYSILOXANE COPOLYMER 68951-96-2; SiSiB® VF6872 VINYLDIMETHYL TERMINATED DIMETHYL-METHYLVINYL-DIPHENYL POLYSILOXANE COPOLYMER; SiSiB® PC9401 1,1,3,3-TETRAMETHYL-1,3-DIVINYLDISILOXANE 2627-95-4; SiSiB® PF1070 SILANOL TERMINATED POLYDIMETHYLSILOXANE (OF1070) 70131-67-8; SiSiB® OF1070 SILANOL TERMINATED POLYDIMETHYSILOXANE 70131-67-8; OH-ENDCAPPED POLYDIMETHYLSILOXANE HYDROXY TERMINATED OLYDIMETHYLSILOXANE 73138-87-1; SiSiB® VF6030 VINYL TERMINATED POLYDIMETHYL SILOXANE 68083-19-2; and, SiSiB® HF2030 HYDROGEN TERMINATED POLYDIMETHYLSILOXANE FLUID 70900-21-9.

Thus, in additional to the forgoing type of precursors, it is contemplated that a precursor may be a compound of the following general formula.

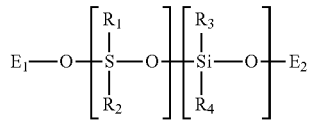

Wherein end cappers $E_1$ and $E_2$ are chosen from groups such as trimethylsiliy (trimethyl silicon) (—Si(CH$_3$)$_3$), dimethylsilyl hydroxy (dimethyl silicon hydroxy) (—Si(CH$_3$)$_2$OH), dimethylhydridosilyl (dimethyl silicon hydride) (—Si(CH$_3$)$_2$H), dimethylvinylsilyl (dimethyl vinyl silicon) (—Si(CH$_3$)$_2$(CH=CH$_2$)), dimethylphenylsily (—Si(CH$_3$)$_2$(C$_6$H$_5$)) and dimethylalkoxysilyl (dimethyl alkoxy silicon) (—Si(CH$_3$)$_2$(OR). The R groups $R_1$, $R_2$, $R_3$, and $R_4$ may all be different, or one or more may be the same. Thus, for example, $R_2$ is the same as $R_3$, $R_3$ is the same as $R_4$, $R_1$ and $R_2$ are different with $R_3$ and $R_4$ being the same, etc. The R groups are chosen from groups such as hydride (—H), methyl (Me)(—C), ethyl (—C—C), vinyl (—C=C), alkyl (—R)(C$_n$H$_{2n+1}$), allyl (—C—C=C), aryl ('R), phenyl (Ph) (—C$_6$H$_5$), methoxy (—O—C), ethoxy (—O—C—C), siloxy (—O—Si—R$_3$), alkoxy (—O—R), hydroxy (—O—H), phenylethyl (—C—C—C$_6$H$_5$) and methyl,phenyl-ethyl (—C—C(—C)(—C$_6$H$_5$).

In general, embodiments of formulations for polysilocarb formulations may, for example, have from about 0% to 50% MHF, about 20% to about 99% MHF, about 0% to about 30% siloxane backbone material, about 20% to about 99% siloxane backbone materials, about 0% to about 70% reactive monomers, about 0% to about 95% TV, about 0% to about 70% non-silicon based cross linker, and, about 0% to about 90% reaction products of a siloxane backbone additives with a silane modifier or an organic modifier reaction product.

In mixing the formulations sufficient time should be used to permit the precursors to become effectively mixed and dispersed. Generally, mixing of about 15 minutes to an hour is sufficient. Typically, the precursor formulations are relatively, and essentially, shear insensitive, and thus the type of pumps or mixing are not critical. It is further noted that in higher viscosity formulations additional mixing time may be required. The temperature of the formulations, during mixing should preferably be kept below about 45° C., and preferably about 10° C. (It is noted that these mixing conditions are for the pre-catalyzed formulations.)

The Reaction Type Process

In the reaction type process, in general, a chemical reaction is used to combine one, two or more precursors, typically in the presence of a solvent, to form a precursor formulation that is essentially made up of a single polymer that can then be, catalyzed, cured and pyrolized. This process provides the ability to build custom precursor formulations that when cured can provide plastics having unique and desirable features. The cured materials can also be pyrolized to form ceramics having unique features. The reaction type process allows for the predetermined balancing of different types of functionality in the end product by selecting functional groups for incorporation into the polymer that makes up the precursor formulation, e.g., phenyls which typically are not used for ceramics but have benefits for providing high temperature capabilities for plastics, and styrene which typically does not provide high temperature features for plastics but provides benefits for ceramics.

In general a custom polymer for use as a precursor formulation is made by reacting precursors in a condensation reaction to form the polymer precursor formulation. This precursor formulation is then cured into a preform, i.e., plastic, cured solid or semi-solid material, through a hydrolysis reaction. The condensation reaction forms a polymer of the type shown below.

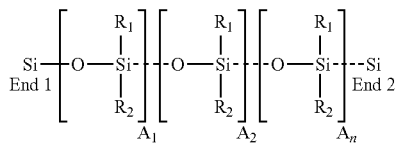

Where $R_1$ and $R_2$ in the polymeric units can be a hydride (—H), a methyl (Me)(—C), an ethyl (—C—C), a vinyl (—C=C), an alkyl (—R)($C_nH_{2n+1}$), an unsaturated alkyl (—$C_nH_{2n-1}$), a cyclic alkyl (—$C_nH_{2n-1}$), an allyl (—C—C=C), a butenyl (—$C_4H_7$), a pentenyl (—$C_5H_9$), a cyclopentenyl (—$C_5H_7$), a methyl cyclopentenyl (—$C_5H_6(CH_3)$), a norbornenyl (—$C_XH_Y$, where X=7-15 and Y=9-18), an aryl ('R), a phenyl (Ph)(—$C_6H_5$), a cycloheptenyl (—$C_7H_{11}$), a cyclooctenyl (—$C_8H_{13}$), an ethoxy (—O—C—C), a siloxy (—O—Si—$R_3$), a methoxy (—O—C), an alkoxy, (—O—R), a hydroxy, (—O—H), a phenylethyl (—C—C—$C_6H_5$) a methyl,phenyl-ethyl (—C—C(—C)(—$C_6H_5$)) and a vinylphenyl-ethyl (—C—C($C_6H_4$(—C=C))). $R_1$ and $R_2$ may be the same or different. The custom precursor polymers can have several different polymeric units, e.g., $A_1$, $A_2$, $A_n$, and may include as many as 10, 20 or more units, or it may contain only a single unit, for example, MHF made by the reaction process may have only a single unit.

Embodiments may include precursors, which include among others, a triethoxy methyl silane, a diethoxy methyl phenyl silane, a diethoxy methyl hydride silane, a diethoxy methyl vinyl silane, a dimethyl ethoxy vinyl silane, a diethoxy dimethyl silane. an ethoxy dimethyl phenyl silane, a diethoxy dihydride silane, a triethoxy phenyl silane, a diethoxy hydride trimethyl siloxane, a diethoxy methyl trimethyl siloxane, a trimethyl ethoxy silane, a diphenyl diethoxy silane, a dimethyl ethoxy hydride siloxane, and combinations and variations of these and other precursors, including other precursors set forth in this specification.

The end units, Si End 1 and Si End 2, can come from the precursors of dimethyl ethoxy vinyl silane, ethoxy dimethyl phenyl silane, and trimethyl ethoxy silane. Additionally, if the polymerization process is properly controlled a hydroxy end cap can be obtained from the precursors used to provide the repeating units of the polymer.

In general, the precursors are added to a vessel with ethanol (or other material to absorb heat, e.g., to provide thermal mass), an excess of water, and hydrochloric acid (or other proton source). This mixture is heated until it reaches its activation energy, after which the reaction typically is exothermic. Generally, in this reaction the water reacts with an ethoxy group of the silane of the precursor monomer, forming a hydroxy (with ethanol as the byproduct). Once formed this hydroxy becomes subject to reaction with an ethoxy group on the silicon of another precursor monomer, resulting in a polymerization reaction. This polymerization reaction is continued until the desired chain length(s) is built.

Control factors for determining chain length, among others, are: the monomers chosen (generally, the smaller the monomers the more that can be added before they begin to coil around and bond to themselves); the amount and point in the reaction where end cappers are introduced; and the amount of water and the rate of addition, among others. Thus, the chain lengths can be from about 180 mw (viscosity about 5 cps) to about 65,000 mw (viscosity of about 10,000 cps), greater than about 1000 mw, greater than about 10,000 mw, greater than about 50,000 mw and greater. Further, the polymerized precursor formulation may, and typically does, have polymers of different molecular weights, which can be predetermined to provide formulation, cured, and ceramic product performance features.

Upon completion of the polymerization reaction the material is transferred into a separation apparatus, e.g., a separation funnel, which has an amount of deionized water that, for example, is from about 1.2× to about 1.5× the mass of the material. This mixture is vigorously stirred for about less than 1 minute and preferably from about 5 to 30 seconds. Once stirred the material is allowed to settle and separate, which may take from about 1 to 2 hours. The polymer is the higher density material and is removed from the vessel. This removed polymer is then dried by either warming in a shallow tray at 90° C. for about two hours; or, preferably, is passed through a wiped film distillation apparatus, to remove any residual water and ethanol. Alternatively, sodium bicarbonate sufficient to buffer the aqueous layer to a pH of about 4 to about 7 is added. It is further understood that other, and commercial, manners of mixing, reacting and separating the polymer from the material may be employed.

Preferably a catalyst is used in the curing process of the polymer precursor formulations from the reaction type process. The same polymers, as used for curing the precursor formulations from the mixing type process can be used. It is noted that, generally unlike the mixing type formulations, a catalyst is not necessarily required to cure a reaction type polymer. Inhibitors may also be used. However, if a catalyst is not used, reaction time and rates will be slower. The curing and the pyrolysis of the cured material from the reaction process is essentially the same as the curing and pyrolysis of the cured material from the mixing process and the reaction blending process.

The reaction type process can be conducted under numerous types of atmospheres and conditions, e.g., air, inert, $N_2$, Argon, flowing gas, static gas, reduced pressure, ambient pressure, elevated pressure, and combinations and variations of these.

The Reaction Blending Type Process

In the reaction blending type process precursor are reacted to from a precursor formulation, in the absence of a solvent. For example, an embodiment of a reaction blending type process has a precursor formulation that is prepared from MHF and Dicyclopentadiene (DCPD). Using the reactive blending process a MHF/DCPD polymer is created and this polymer is used as a precursor formulation. It can be used alone to form a cured or pyrolized product, or as a precursor in the mixing or reaction processes.

Thus, for example, from about 40 to 90% MHF of known molecular weight and hydride equivalent mass; about 0.20 wt % P01 catalyst; and from about 10 to 60% DCPD with ≥83% purity, can be used.

P01 is a 2% Pt(0) tetravinylcyclotetrasiloxane complex in tetravinylcyclotetrasiloxane, diluted 20× with tetravinylcyclotetrasiloxane to 0.1% of Pt(0) complex. In this manner 10 ppm Pt is provided for every 1% loading of bulk cat.

In an embodiment of the process, a sealable reaction vessel, with a mixer, can be used for the reaction. The reaction is conducted in the sealed vessel, in air; although other types of atmosphere can be utilized. Preferably, the reaction is conducted at atmospheric pressure, but higher and lower pressures can be utilized. Additionally, the reaction blending type process can be conducted under numerous types of atmospheres and conditions, e.g., air, inert, $N_2$, Argon, flowing gas, static gas, reduced pressure, ambient pressure, elevated pressure, and combinations and variations of these.

In an embodiment, 850 grams of MHF (85% of total polymer mixture) is added to reaction vessel and heated to about 50° C. Once this temperature is reached the heater is turned off, and 0.20% (by weight of the MHF) of P01 Platinum catalyst is added to the MHF in the reaction vessel. Typically, upon addition of the catalyst, bubbles will form and temperature will initially rise approximately 2-20° C.

When the temperature begins to fall, about 150 g of DCPD (15 wt % of total polymer mixture) is added to the reaction vessel. The temperature may drop an additional amount, e.g., around 5-7° C.

At this point in the reaction process the temperature of the reaction vessel is controlled to, maintain a predetermined temperature profile over time, and to manage the temperature increase that may be accompanied by an exotherm. Preferably, the temperature of the reaction vessel is regulated, monitored and controlled throughout the process.

In an embodiment of the MHF/DCPD embodiment of the reaction process, the temperature profile can be as follows: let temperature reach about 80° C. (may take ~15-40 min, depending upon the amount of materials present); temperature will then increase and peak at ~104° C., as soon as temperature begins to drop, the heater set temperature is increased to 100° C. and the temperature of the reaction mixture is monitored to ensure the polymer temperature stays above 80° C. for a minimum total of about 2 hours and a maximum total of about 4 hours. After 2-4 hours above 80° C., the heater is turn off, and the polymer is cooled to ambient. It being understood that in larger and smaller batches, continuous, semi-continuous, and other type processes the temperature and time profile may be different.

In larger scale, and commercial operations, batch, continuous, and combinations of these, may be used. Industrial factory automation and control systems can be utilized to control the reaction, temperature profiles and other processes during the reaction.

Table A sets forth various embodiments of precursor materials.

TABLE A

| Material Name | degree of polymerization | Equivalents Si/mole | Equivalents O/mole | Equivalents H/mol | Equivalents Vi/mol | Equivalents methyl/mole | Equivalents C/mole | MW | grams/ mole of vinyl |
|---|---|---|---|---|---|---|---|---|---|
| tetramethylcyclotetrasiloxane ($D_4$) | 4 | 4 | 4 | 4 | 0 | 4 | 4 | 240.51 | |
| MHF | 33 | 35 | 34 | 33 | 0 | 39 | 39 | 2145.345 | |
| VMF | 5 | 7 | 6 | 0 | 5 | 11 | 21 | 592.959 | 118.59 |
| TV | 4 | 4 | 4 | 0 | 4 | 4 | 12 | 344.52 | 86.13 |
| VT 0200 | 125 | 127 | 126 | 0 | 2 | 254 | 258 | 9451.206 | 4725.60 |
| VT 0020 | 24 | 26 | 25 | 0 | 2 | 52 | 56 | 1965.187 | 982.59 |
| VT 0080 | 79 | 81 | 80 | 0 | 2 | 162 | 166 | 6041.732 | 3020.87 |
| Styrene | | | | | 2 | | | 104.15 | 52.08 |
| Dicyclopentadiene | | | | | 2 | | | 132.2 | 66.10 |
| 1,4-divinylbenzene | | | | | 2 | | | 130.19 | 65.10 |
| isoprene | | | | | 2 | | | 62.12 | 31.06 |
| 1,3 Butadiene | | | | | 2 | | | 54.09 | 27.05 |
| Catalyst 10 ppm Pt | | | | | | | | | |
| Catalyst LP 231 | | | | | | | | | |

In the above table, the "degree of polymerization" is the number of monomer units, or repeat units, that are attached together to from the polymer. "Equivalents_/mol" refers to the molar equivalents. "Grams/mole of vinyl" refers to the amount of a given polymer needed to provide 1 molar equivalent of vinyl functionality. "VMH" refers to methyl vinyl fluid, a linear vinyl material from the ethoxy process, which can be a substitute for TV. The numbers "0200" etc. for VT are the viscosity (e.g., 0200=200 cps) in centipoise for that particular VT.

Curing and Pyrolysis

Precursor formulations, including the polysilocarb precursor formulations from the above types of processes, as well as others, can be cured to form a solid, semi-sold, or plastic like material. Typically, the precursor formulations are spread, shaped, or otherwise formed into a preform, which would include any volumetric structure, or shape, including thin and thick films. In curing, the polysilocarb precursor formulation may be processed through an initial cure, to provide a partially cured material, which may also be referred to, for example, as a preform, green material, or green cure (not implying anything about the material's color). The green material may then be further cured. Thus, one or more curing steps may be used. The material may be "end cured," i.e., being cured to that point at which the material has the necessary physical strength and other properties for its intended purpose. The amount of curing may be to a final cure (or "hard cure"), i.e., that point at which all, or essentially all, of the chemical reaction has stopped (as measured, for example, by the absence of reactive groups in the material, i.e., all of the reaction has stopped, or the leveling off of the decrease in reactive groups over time, i.e., essentially all of the reaction has stopped). Thus, the material may be cured to varying degrees, depending upon its intended use and purpose. For example, in some situations the end cure and the hard cure may be the same. Curing conditions such as atmosphere and temperature may effect the composition of the cured material.

In multi-layer, or composite structures and shapes, a layer of the polysilocarb material may be cured to varying degrees, for example in a multi-layer embodiment, the layers can be green cured to promote layer adhesion, then finally cured to a hard cure. Each layer in a multi-layer structure can be cured to the same degree of cure, to different degrees of cure, subject to one, two, three or more curing steps, and combinations and variations of these.

The curing may be done at standard ambient temperature and pressure ("SATP", 1 atmosphere, 25° C.), at temperatures above or below that temperature, at pressures above or below that pressure, and over varying time periods. The curing can be conducted over various heatings, rate of heating, and temperature profiles (e.g., hold times and temperatures, continuous temperature change, cycled temperature change, e.g., heating followed by maintaining, cooling, reheating, etc.). The time for the curing can be from a few seconds (e.g., less than about 1 second, less than 5 seconds), to less than a minute, to minutes, to hours, to days (or potentially longer). The curing may also be conducted in any type of surrounding environment, including for example, gas, liquid, air, water, surfactant containing liquid, inert atmospheres, $N_2$, Argon, flowing gas (e.g., sweep gas), static gas, reduced $O_2$ (e.g., an amount of $O_2$ lower than atmospheric, such as less than 20% $O_2$, less than 15% $O_2$, less than 10% $O_2$ less than 5% $O_2$), reduced pressure (e.g., less than atmospheric), elevated pressure (e.g., greater than atmospheric), enriched $O_2$, (e.g., an amount of $O_2$ greater than atmospheric), ambient pressure, controlled partial pressure and combinations and variations of these and other processing conditions.

In an embodiment, the curing environment, e.g., the furnace, the atmosphere, the container and combinations and variations of these can have materials that contribute to or effect, for example, the composition, catalysis, stoichiometry, features, performance and combinations and variations of these in the preform, the cured material, the ceramic and the final applications or products.

For high purity materials, the furnace, containers, handling equipment, atmosphere, and other components of the curing apparatus and process are clean, essentially free from, and do not contribute any elements or materials, that would be considered impurities or contaminants, to the cured material.

Preferably, in embodiments of the curing process, the curing takes place at temperatures in the range of from about 5° C. or more, from about 20° C. to about 250° C., from about 20° C. to about 150° C., from about 75° C. to about 125° C., and from about 80° C. to 90° C. Although higher and lower temperatures and various heating profiles, (e.g., rate of temperature change over time ("ramp rate", e.g., Δ degrees/time), hold times, and temperatures) can be utilized.

The cure conditions, e.g., temperature, time, ramp rate, may be dependent upon, and in some embodiments can be predetermined, in whole or in part, by the formulation to match, for example the size of the preform, the shape of the preform, or the mold holding the preform to prevent stress cracking, off gassing, or other phenomena associated with the curing process. Further, the curing conditions may be such as to take advantage of, preferably in a controlled manner, what may have previously been perceived as problems associated with the curing process. Thus, for example, off gassing may be used to create a foam material having either open or closed structure. Similarly, curing conditions can be used to create or control the microstructure and the nanostructure of the material. In general, the curing conditions can be used to affect, control or modify the kinetics and thermodynamics of the process, which can affect morphology, performance, features and functions, among other things.

Upon curing the polysilocarb precursor formulation a cross linking reaction takes place that provides in some embodiments a cross-linked structure having, among other things, by way of example, an —$R_1$—Si—C—C—Si—O—Si—C—C—Si-$R_2$— where $R_1$ and $R_2$ vary depending upon, and are based upon, the precursors used in the formulation. In an embodiment of the cured materials they may have a cross-linked structure having 3-coordinated silicon centers to another silicon atom, being separated by fewer than 5 atoms between silicon atoms. Although additional other structures and types of cured materials are contemplated. Thus, for example, use of Luperox 231 could yield a structure, from the same monomers, that was —Si—C—C—C—Si—. When other cross linking agents are used, e.g, DCPD and divinyl benzene, the number of carbons atoms between the silicon atoms will be greater than 5 atoms. A generalized formula for some embodiments of the cross-linked, e.g., cured, material, would be —Si—$R_3$—Si—, where $R_3$ would be ethyl (from for example a vinyl precursor), propyl (from for example a allyl precursor), dicyclopentane (from for example a DCPD precursor), norbornane (from for example a norbornadiene precursor), diethylbenzene (from for example a divinyl benzene precursor), and others.

During the curing process, some formulations may exhibit an exotherm, i.e., a self heating reaction, that can produce a small amount of heat to assist or drive the curing reaction, or that may produce a large amount of heat that may need to be managed and removed in order to avoid problems, such as stress fractures. During the cure off gassing typically occurs and results in a loss of material, which loss is defined generally by the amount of material remaining, e.g., cure yield. Embodiments of the formulations, cure conditions, and polysilocarb precursor formulations of embodiments of the present inventions can have cure yields of at least about 90%, about 92%, about 100%. In fact, with air cures the materials may have cure yields above 100%, e.g., about 101-105%, as a result of oxygen being absorbed from the air.

Additionally, during curing the material typically shrinks, this shrinkage may be, depending upon the formulation, cure conditions, and the nature of the preform shape, and whether the preform is reinforced, filled, neat or unreinforced, from about 20%, less than 20%, less than about 15%, less than about 5%, less than about 1%, less than about 0.5%, less than about 0.25% and smaller.

Curing may be accomplished by any type of heating apparatus, or mechanisms, techniques, or morphologies that has the requisite level of temperature and environmental control. Curing may be accomplished through, for example, heated water baths, electric furnaces, microwaves, gas furnaces, furnaces, forced heated air, towers, spray drying, falling film reactors, fluidized bed reactors, indirect heating elements, direct heating (e.g., heated surfaces, drums, and plates), infrared heating, UV irradiation (light), an RF furnace, in-situ during emulsification via high shear mixing, in-situ during emulsification via ultrasonication, broad spectrum white light, IR light, coherent electromagnetic radiation (e.g. lasers, including visible, UV and IR), and convection heating, to name a few.

In an embodiment, curing may also occur under ambient conditions for an embodiment having a sufficient amount of catalyst.

If pyrolysis is conducted for an embodiment the cured material can be for example heated to about 600° C. to about 2,300° C.; from about 650° C. to about 1,200° C., from about 800° C. to about 1300° C., from about 900° C. to about 1,200° C. and from about 950° C. to 1,150° C. At these temperatures typically all organic structures are either removed or combined with the inorganic constituents to form a ceramic. Typically, at temperatures in the about 650° C. to 1,200° C. range the resulting material is an amorphous glassy ceramic. When heated above about 1,200° C. the material typically may from nano crystalline structures, or micro crystalline structures, such as SiC, $Si_3N_4$, SiCN, β SiC, and above 1,900° C. an α SiC structure may form, and at and above 2,200° C. α SiC is typically formed. The pyrolized, e.g., ceramic materials can be single crystal, polycrystalline, amorphous, and combinations, variations and subgroups of these and other types of morphologies.

The pyrolysis may be conducted under may different heating and environmental conditions, which preferably include thermo control, kinetic control and combinations and variations of these, among other things. For example, the pyrolysis may have various heating ramp rates, heating cycles and environmental conditions. In some embodiments, the temperature may be raised, and held a predetermined temperature, to assist with known transitions (e.g., gassing, volatilization, molecular rearrangements, etc.) and then elevated to the next hold temperature corresponding to the next known transition. The pyrolysis may take place in reducing atmospheres, oxidative atmospheres, low $O_2$, gas rich (e.g., within or directly adjacent to a flame), inert, $N_2$, Argon, air, reduced pressure, ambient pressure, elevated pressure, flowing gas (e.g., sweep gas, having a flow rate for example of from about from about 15.0 GHSV (gas hourly space velocity) to about 0.1 GHSV, from about 6.3 GHSV to about 3.1 GHSV, and at about 3.9 GHSV), static gas, and combinations and variations of these.

In some embodiments, upon pyrolization, graphenic, graphitic, amorphous carbon structures and combinations and variations of these are present in the Si—O—C ceramic. A distribution of silicon species, consisting of SiOxCy structures, which result in $SiO_4$, $SiO_3C$, $SiO_2C_2$, $SiOC_3$, and $SiC_4$ are formed in varying ratios, arising from the precursor choice and their processing history. Carbon is generally bound between neighboring carbons and/or to a Silicon atom. In general, in the ceramic state, carbon is largely not coordinated to an oxygen atom, thus oxygen is largely coordinated to silicon The pyrolysis may be conducted in any heating apparatus, that maintains the request temperature and environmental controls. Thus, for example pyrolysis may be done with, pressure furnaces, box furnaces, tube furnaces, crystal-growth furnaces, graphite box furnaces, arc melt furnaces, induction furnaces, kilns, $MoSi_2$ heating element furnaces, carbon furnaces, vacuum furnaces, gas fired furnaces, electric furnaces, direct heating, indirect heating, fluidized beds, RF furnaces, kilns, tunnel kilns, box kilns, shuttle kilns, coking type apparatus, lasers, microwaves, other electromagnetic radiation, and combinations and variations of these and other heating apparatus and systems that can obtain the request temperatures for pyrolysis.

In embodiments of the polysilocarb derived ceramic materials has any of the amounts of Si, O, C for the total amount of material that are set forth in the Table B.

TABLE B

| | Si | | O | | C | |
|---|---|---|---|---|---|---|
| | Lo | Hi | Lo | Hi | Lo | Hi |
| Wt % | 35.00% | 50.00% | 10.00% | 35.00% | 5.00% | 30.00% |
| Mole Ratio | 1.000 | 1.429 | 0.502 | 1.755 | 0.334 | 2.004 |
| Mole % | 15.358% | 63.095% | 8.821% | 56.819% | 6.339% | 57.170% |

In general, embodiments of the pyrolized ceramic polysilocarb materials can have about 20% to about 65% Si, can have about 5% to about 50% O, and can have about 3% to about 55% carbon weight percent. Greater and lesser amounts are also contemplated.

In general, embodiment of the pyrolized ceramic polysilocarb materials can have a mole ratio (based on total Si, O, and C) of about 0.5 to about 2.5 for Si, can have a mole ratio of about 0.2 to about 2.5 for O, and can have a mole ration of about 0.1 to about 4.5 for C. Greater and lesser amounts are also contemplated.

In general, embodiment of the pyrolized ceramic polysilocarb materials can have a mole % (percentage of total Si, O, and C) of about 13% to about 68% for Si, can have a mole % of about 6% to about 60% for 0, and can have a mole % of about 4% to about 75% for C. Greater and lesser amounts are also contemplated.

The type of carbon present in embodiments of the polysilocarb derived ceramic pigments can be free carbon, (e.g., turbostratic, amorphous, graphenic, graphitic forms of carbon) and carbon that is bound to silicon. Embodiments of ceramic polysilocarb materials having free carbon and silicon-bound-carbon (Si—C) are set forth in Table C. Greater and lesser amounts and different percentages of free carbon and silicon-bound-carbon are also contemplated.

TABLE C

| Embodiment | % Free Carbon | % Si—C type |
|---|---|---|
| 1 | 64.86 | 35.14 |
| 2 | 63.16 | 36.85 |
| 3 | 67.02 | 32.98 |
| 4 | 58.59 | 41.41 |
| 5 | 68.34 | 31.66 |
| 6 | 69.18 | 30.82 |

TABLE C-continued

| Embodiment | % Free Carbon | % Si—C type |
|---|---|---|
| 7 | 65.66 | 34.44 |
| 8 | 72.74 | 27.26 |
| 9 | 72.46 | 27.54 |
| 10 | 78.56 | 21.44 |

Generally, embodiments of polysilocarb derived ceramic materials can have from about 30% free carbon to about 70% free carbon, from about 20% free carbon to about 80% free carbon, and from about 10% free carbon to about 90% free carbon, and from about 30% Si—C bonded carbon to about 70% Si—C bonded carbon, from about 20% Si—C bonded carbon to about 80% Si—C bonded carbon, and from about 10% Si—C bonded carbon to about 90% Si—C bonded carbon. Greater and lesser amounts are also contemplated.

Metals and Metal Complexes

By way of example, metals and metal complexes that can be used as fill material would include Cyclopentadienyl compounds of the transition metals can be utilized. Cyclopentadienyl compounds of the transition metals can be organized into two classes: Bis-cyclopentadienyl complexes; and Mono-cyclopentadienyl complexes. Cyclopentadienyl complexes can include $C_5H_5$, $C_5Me_5$, $C_5H_4Me$, $CH_5R_5$ (where R=Me, Et, Propyl, i-Propyl, butyl, Isobutyl, Sec-butyl). In either of these cases Si can be directly bonded to the Cyclopentadienyl ligand or the Si center can be attached to an alkyl chain, which in turn is attached to the Cyclopentadienyl ligand.

Cyclopentadienyl complexes, that can be utilized with precursor formulations and in products, can include: bis-cyclopentadienyl metal complexes of first row transition metals (Titanium, Vanadium, Chromium, Iron, Cobalt, Nickel); second row transition metals (Zirconium, Molybdenum, Ruthenium, Rhodium, Palladium); third row transition metals (Hafnium, Tantalum, Tungsten, Iridium, Osmium, Platinum); Lanthanide series (La, Ce, Pr, Nd, Pm, Sm, Eu, Gd, Tb, Dy, Ho); and Actinide series (Ac, Th, Pa, U, Np).

Monocyclopentadienyl complexes may also be utilized to provide metal functionality to precursor formulations and would include monocyclopentadienyl complexes of: first row transition metals (Titanium, Vanadium, Chromium, Iron, Cobalt, Nickel); second row transition metals (Zirconium, Molybdenum, Ruthenium, Rhodium, Palladium); third row transition metals (Hafnium, Tantalum, Tungsten, Iridium, Osmium, Platinum) when preferably stabilized with proper ligands, (for instance Chloride or Carbonyl).

Alkyl complexes of metals may also be used to provide metal functionality to precursor formulations and products. In these alkyl complexes the Si center has an alkyl group (ethyl, propyl, butyl, vinyl, propenyl, butenyl) which can bond to transition metal direct through a sigma bond. Further, this would be more common with later transition metals such as Pd, Rh, Pt, Ir.

Coordination complexes of metals may also be used to provide metal functionality to precursor formulations and products. In these coordination complexes the Si center has an unsaturated alkyl group (vinyl, propenyl, butenyl, acetylene, butadienyl) which can bond to carbonyl complexes or ene complexes of Cr, Mo, W, Mn, Re, Fe, Ru, Os, Co, Rh, Ir, Ni. The Si center may also be attached to a phenyl, substituted phenyl or other aryl compound (pyridine, pyrimidine) and the phenyl or aryl group can displace carbonyls on the metal centers.

Metal alkoxides may also be used to provide metal functionality to precursor formulations and products. Metal alkoxide compounds can be mixed with the silicon precursor compounds and then treated with hydroxide to form the oxides at the same time as the polymer, copolymerizes. This can also be done with metal halides and metal amides. Preferably, this may be done using early transition metals along with Aluminum, Gallium and Indium, later transition metals: Fe, Mn, Cu, and alkaline earth metals: Ca, Sr, Ba, Mg.

Compounds where Si is directly bonded to a metal center which is stabilized by halide or organic groups may also be utilized to provide metal functionality to precursor formulations and products.

Additionally, it should be understood that the metal and metal complexes may be the continuous phase after pyrolysis, or subsequent heat treatment. Formulations can be specifically designed to react with selected metals to in situ form metal carbides, oxides and other metal compounds, generally known as cermets (e.g., ceramic metallic compounds). The formulations can be reacted with selected metals to form in situ compounds such as mullite, alumino silicate, and others. The amount of metal relative to the amount of silica in the formulation or end product can be from about 0.1 mole % to 99.9 mole %, about 1 mole % or greater, about 10 mole % or greater, and about 20 mole percent or greater. The forgoing use of metals with the present precursor formulas can be used to control and provide predetermined stoichiometries.

Headings and Embodiments

It should be understood that the use of headings in this specification is for the purpose of clarity, and is not limiting in any way. Thus, the processes and disclosures described under a heading should be read in context with the entirely of this specification, including the various examples. The use of headings in this specification should not limit the scope of protection afford the present inventions.

It is noted that there is no requirement to provide or address the theory underlying the novel and groundbreaking processes, materials, performance or other beneficial features and properties that are the subject of, or associated with, embodiments of the present inventions. Nevertheless, various theories are provided in this specification to further advance the art in this area. These theories put forth in this specification, and unless expressly stated otherwise, in no way limit, restrict or narrow the scope of protection to be afforded the claimed inventions. These theories many not be required or practiced to utilize the present inventions. It is further understood that the present inventions may lead to new, and heretofore unknown theories to explain the function-features of embodiments of the methods, articles, materials, devices and system of the present inventions; and such later developed theories shall not limit the scope of protection afforded the present inventions.

The various embodiments of formulations, compositions, articles, plastics, ceramics, materials, parts, wafers, boules, volumetric structure, uses, applications, equipment, methods, activities, and operations set forth in this specification may be used for various other fields and for various other activities, uses and embodiments. Additionally, these embodiments, for example, may be used with: existing systems, articles, compositions, materials, operations or activities; may be used with systems, articles, compositions, materials operations or activities that may be developed in the future; and with such systems, articles, compositions, materials, operations or activities that may be modified, in-part, based on the teachings of this specification. Further, the various embodiments and examples set forth in this specification may be used with each other, in whole or in part, and in different and various combinations. Thus, for example, the configurations provided in the various embodiments and examples of this specification may be used with each other; and the scope of protection afforded the present inventions should not be limited to a particular embodiment, example, configuration or arrangement that is set forth in a particular embodiment, example, or in an embodiment in a particular Figure.

The invention may be embodied in other forms than those specifically disclosed herein without departing from its spirit or essential characteristics. The described embodiments are to be considered in all respects only as illustrative and not restrictive.

What is claimed:

1. A source material for use as a starting material in a vapor deposition process to grow an SiC boule, the source material defining a volumetric shape of SiC, the volumetric shape comprising:
   a. about 100 g to about 12,000 g of SiC granules, having a particle size of from about 0.1 µm to about 100 µm,
   b. the SiC granules defining a volumetric shape having a structural integrity;
   c. a binder, wherein the binder binds the SiC granules, whereby the volumetric shape is capable of maintaining the structural integrity when placed in a vapor deposition apparatus during a growth cycle of a boule;
   d. the volumetric shape defining a void; and,
   e. the volumetric shape having pores defining a porosity, wherein the volumetric shape has an apparent density of less than 3.0 g/cc.

2. The source material of claim 1, wherein the weight of SiC granules is form about 1000 g to about 9000 g.

3. The source material of claim 1, wherein the granules have a primary particle $D_{50}$ size of from about 0.1 µm to about 20.0 µm.

4. The source material of claim 1, wherein the void defines a channel in a top of the volumetric shape.

5. The source material of claim 4, where in the channel is an angled annular channel.

6. The source material of claim 1, the void is located in a top of the volumetric shape.

7. The source material of claim 1, the void comprises a void located in a top and a bottom of the volumetric shape.

8. The source material of claim 1, wherein the void defines a cylindrical channel extending through the volumetric shape.

9. The source material of claim 1, wherein shape is a puck.

10. The source material of claim 1, wherein the apparent density is from about 1.5 g/cc to 2.8 g/cc.

11. The source material of claim 1, wherein the SiC granules are polymer derived SiC and have a purity of at least 99.999%.

12. The source material of claim 1, having a molar ratio of Si:C of 0.5:2.

13. The source material of claim 1, having a molar ratio of Si:C of 2:0.5.

14. A source material for use as a starting material in a vapor deposition process to grow an SiC boule, the source material defining a volumetric shape of SiC, the volumetric shape comprising:
   a. About 100 g to about 12,000 g of SiC granules, having a particle size of from about 0.1 µm to about 100 µm,
   b. the SiC granules defining a volumetric shape having a structural integrity, wherein the volumetric shape is capable of maintaining the structural integrity when placed in a vapor deposition apparatus during a growth cycle of a boule;
   c. the volumetric shape defining a void; and,
   d. the volumetric shape having pores defining a porosity, wherein the volumetric shape has an apparent density of less than 3.0 g/cc.

15. The source material of claim 14, wherein the granules have a primary particle $D_{50}$ size of from about 0.5 µm to about 3 µm.

16. The source material of claim 14, wherein the void defines a channel in a top of the volumetric shape.

17. The source material of claim 14, wherein the SiC granules are polymer derived SiC and have a purity of at least 99.9999%.

18. A volumetric shape of SiC, for use as a starting material in a vapor deposition process to grow an SiC boule, the volumetric shape comprising:
   a. SiC granules, having a particle size of from about 0.1 µm to about 100 µm,
   b. the SiC granules defining a volumetric shape having a structural integrity;
   c. a binder, wherein the binder binds the SiC granules, whereby the volumetric shape is capable of maintaining the structural integrity when placed in a vapor deposition apparatus during a growth cycle of a boule;
   d. the volumetric shape defining a void; and,
   e. the volumetric shape having a porosity, wherein the volumetric shape has an apparent density of less than 3.1 g/cc;
   f. wherein the volumetric shape is configured to provide a predetermined flux during a growth cycle of a boule.

19. The volumetric shape of claim 18, wherein the predetermined flux is a uniform and consistent flux.

20. The volumetric shape of claim 18, wherein the predetermined flux has increased flux density near an outer area of a growth face of a boule during the last 20% of the growth cycle.

21. The volumetric shape of claim 18, wherein the predetermined flux has increased flux density near an outer area of a growth face of a boule during the last 30% of the growth cycle.

22. The volumetric shape of claim 18, wherein the predetermined flux has increased flux density near an outer area of a growth face of a boule during the last 40% of the growth cycle.

23. A volumetric shape of SiC, for use as a starting material in an SiC vapor deposition process, the volumetric shape comprising:
   a. SiC granules, having a particle size of from about 0.1 µm to about 100 µm,
   b. the SiC granules defining a volumetric shape having a structural integrity, such that the shape is not friable;
   c. the volumetric shape defining a void; and,
   d. the volumetric shape having a porosity, wherein the volumetric shape has an apparent density of less than 3.1 g/cc;
   e. wherein the volumetric shape is configured to provide a predetermined flux during a growth cycle of a boule.

24. The volumetric shape of claim 23, wherein the predetermined flux has increased flux density near an outer area of a growth face of a boule during the last 20% of the growth cycle.

25. The volumetric shape of claim 23, wherein the predetermined flux has increased flux density near an outer area of a growth face of a boule during the last 30% of the growth cycle.

26. A volumetric shape of SiC, for use as a starting material in a SiC vapor deposition process, the volumetric shape comprising:
   a. About 100 g to about 12,000 g of SiC granules, having a particle size of from about 0.1 µm to about 100 µm,
   b. the SiC granules defining a volumetric shape;
   c. the volumetric shape having a porosity, wherein the volumetric shape has an apparent density of less than 2.9 g/cc;
   d. wherein the volumetric shape when placed in a vapor deposition apparatus during a growth cycle of a boule is configured to provide a consistent rate of flux formation during a growth cycle.

27. A volumetric shape of SiC, for use as a starting material in a SiC vapor deposition process, the volumetric shape comprising:
   a. about 100 g to about 12,000 g of SiC granules, having a particle size of from about 0.1 µm to about 100 µm,
   b. the SiC granules defining a volumetric shape;
   c. a binder, wherein the binder binds the SiC granules; and,
   d. wherein the volumetric shape when placed in a vapor deposition apparatus during a growth cycle of a boule is configured to provide a predetermined rate of flux formation during a growth cycle.

28. A method of growing a SiC boule, the method comprising:
   a. placing a starting material having a shape comprising SiC in a vapor deposition apparatus;
   b. heating the starting material to a temperature whereby the SiC sublimates forming a flux comprising species of Si and C;
   c. flowing the flux across an area directly adjacent to the growth face of a boule; wherein the area is the same as and coincident with the growth face of the boule;
   d. whereby the shape predetermines the flux across the entirety of the area; and,
   e. depositing the flux on the growth face of the boule to grow the boule in length.

29. The method of claim 28, wherein the flux is uniform across the entirety of the area during boule growth.

30. The method of claim 28, wherein the flux is greater near an outer area of the boule face during at a time during the growth of the boule when at least half of the length of the boule has been grown.

31. The method of claim 28, wherein the growth face of the boule is a seed crystal.

32. The method of claim 28, wherein the growth face of the boule is a face of the boule.

33. The method of claim 28, wherein the boule as grown is single crystalline.

34. The method of claim 28, wherein the boule as grown is a single polytype.

35. The method of claim 28, whereby the boule as grown is characterized by a diameter of about 3 inches to about 6 inches, a length of about 2 inches to about 8 inches, and a radius of curvature for the growth face of the boule is at least 2× the length.

36. The method of claim 28, whereby the boule as grown is characterized by a diameter of about 3 inches to about 6 inches, a length of about 2 inches to about 8 inches, and a radius of curvature for the growth face of the boule is at least 5× the length.

37. The method of claim 28, whereby the boule as grown is characterized by a diameter of about 3 inches to about 6 inches, a length of about 2 inches to about 8 inches, and a radius of curvature for the growth face of the boule is at least 10× the length.

38. The method of claim 28, whereby the boule as grown is characterized by a diameter of about 3 inches to about 6 inches, a length of about 2 inches to about 8 inches, and a radius of curvature for the growth face that is infinite.

39. A method of growing a SiC boule, the method comprising:
   a. placing a volumetric shape of starting material comprising SiC in a vapor deposition apparatus; the volumetric shape configured to provide a directional flux;
   b. heating the volumetric shape to provide the directional flux during a growth cycle of a boule; and,
   c. depositing the directional flux on a growth face of the boule to grow the boule in length.

40. The method of claim 39, wherein in the directional flux provide increased flux density to the outer areas of the growth face, whereby during a time in the growth cycle, the boule has a planar growth face.

41. The method of claim 39, wherein the boule is free from defects.

42. A method of providing a large number of devices from a single growth cycle of a boule, the method comprising:
   a. placing a volumetric shape of starting material comprising SiC in a vapor deposition apparatus; the volumetric shape configured to provide a direction flux;
   b. heating the volumetric shape to provide the directional flux during a growth cycle of a boule; and,
   c. depositing the directional flux on a growth face of the boule to grow the boule in length;
   d. converting the boule to provide wafers.

43. The method of claim 42, whereby about 80% of the length of the boule is capable of being cut to provide defect free wafers.

44. The method of claim 42, whereby about 95% of the length of the boule is capable of being cut to provide defect free wafers.

45. The method of claim 42, whereby the wafers have MPD (≤0.1 cm-2), TSD (≤300 cm-2) and BPD (≤500 cm-2).

46. The method of claim 43, wherein the wafers have resistivities greater than about 10,000 ohm-cm at 20° C.

47. The method of claim 42, wherein the wafers have resistivities not less than about 10,000 ohm-cm at 20° C.

48. A source material for use as a starting material in a vapor deposition process, the source material defining a volumetric shape comprising ultra pure silicon carbide particles and a binder, for use in vapor deposition growth of silicon carbide boules, the volumetric shape comprising:
   a. silicon carbide particles, wherein the particles are at least 99.999% pure, wherein the particles have a $D_{50}$ particle size from about 0.1 µm to about 20.0 µm;
   b. a binder joining the silicon carbide particles together and thereby defining a volumetric shape;
   c. the binder comprising a cross linked polymeric material comprising carbon and silicon; and,
   d. wherein the binder is incapable of interfering with boule growth and incapable of adversely affecting boule quality.

49. The volumetric shape of claim 48, having an elastic modules of from about 10 GPa to about 300 GPa.

50. The volumetric shape of claim 48, having a hardness of from about 300 Kg/mm$^2$ to about 2,000 Kg/mm$^2$.

51. The method of claim 42, whereby at least about 80% of the length of the boule is capable of being cut to provide wafers having one or more of a MPD (≤0.1 cm-2), a TSD (≤300 cm-2), and a BPD (≤500 cm-2).

52. The method of claim 42, whereby at least about 80% of the length of the boule is capable of being cut to provide wafers having at least two of a MPD (≤0.1 cm-2), a TSD (≤300 cm-2), and a BPD (≤500 cm-2).

53. The method of claim 42, whereby wherein about 80% of the length of the boule is capable of being cut to provide wafers having a MPD (≤0.1 cm-2), a TSD (≤300 cm-2), and a BPD (≤500 cm-2).

54. The method of claim 42, whereby about 95% of the length of the boule is capable of being cut to provide wafers having one or more of a MPD (≤0.1 cm-2), a TSD (≤ 300 cm-2), and a BPD (≤500 cm-2).

55. The method of claim 42, whereby about 95% of the length of the boule is capable of being cut to provide wafers having at least two of a MPD (≤0.1 cm-2), a TSD (≤300 cm-2), and a BPD (≤500 cm-2).

56. The method of claim 42, whereby about 95% of the length of the boule is capable of being cut to provide wafers having a MPD (≤0.1 cm-2), a TSD (≤300 cm-2), and a BPD (≤ 500 cm-2).

57. The method of claim 42, 46, 47, 51, 52, 53, 54, 55 or 56, whereby the boule is about 6-inches in diameter, at least about 80% of the length of the boule is capable of being cut to provide about 6-inch diameter wafers.

* * * * *